United States Patent
Inaba

(10) Patent No.: US 8,395,933 B2
(45) Date of Patent: Mar. 12, 2013

(54) RESISTANCE-CHANGE SEMICONDUCTOR MEMORY

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/887,409

(22) Filed: Sep. 21, 2010

(65) Prior Publication Data

US 2012/0002462 A1    Jan. 5, 2012

(30) Foreign Application Priority Data

Jul. 5, 2010 (JP) ................................ 2010-153205

(51) Int. Cl.
  *G11C 11/00*    (2006.01)
(52) U.S. Cl. ............. 365/158; 365/148; 365/51; 365/63
(58) Field of Classification Search .................. 365/158, 365/148, 51, 63
  See application file for complete search history.

(56) References Cited

U.S. PATENT DOCUMENTS

| 5,695,864 | A | 12/1997 | Slonczewski |
| 7,457,150 | B2 | 11/2008 | Tsuchida et al. |
| 7,545,672 | B2 | 6/2009 | Veda et al. |
| 7,755,077 | B2 | 7/2010 | Inaba |
| 8,111,540 | B2 | 2/2012 | Asao et al. |
| 2010/0238711 | A1* | 9/2010 | Asao ............................. 365/148 |

FOREIGN PATENT DOCUMENTS

| JP | 2002-54613 | 12/2002 |
| JP | 2005-71500 | 3/2005 |
| JP | 2008-192990 | 8/2008 |

OTHER PUBLICATIONS

Background Art Information, Sep. 1, 2010.

* cited by examiner

*Primary Examiner* — Toan Le
(74) *Attorney, Agent, or Firm* — Knobbe Martens Olson & Bear LLP

(57) ABSTRACT

According to one embodiment, a memory includes first to fourth memory cells aligned in a first direction. Each of the first to fourth memory cells comprises a cell transistor having a gate connected to a word line extending in a second direction crossing the first direction and a resistive memory element having one end connected to a first source/drain region of the cell transistor. A second source/drain region of the cell transistor is connected to one of a first bit line extending in the first direction and a second bit line extending in the second direction. The other end of the resistive memory element is connected to one of the first and second bit lines which is apart from the second source/drain region. The second source/drain regions in the first and second memory cells are shared, and the second source/drain regions in the third and fourth memory cells are shared.

25 Claims, 71 Drawing Sheets

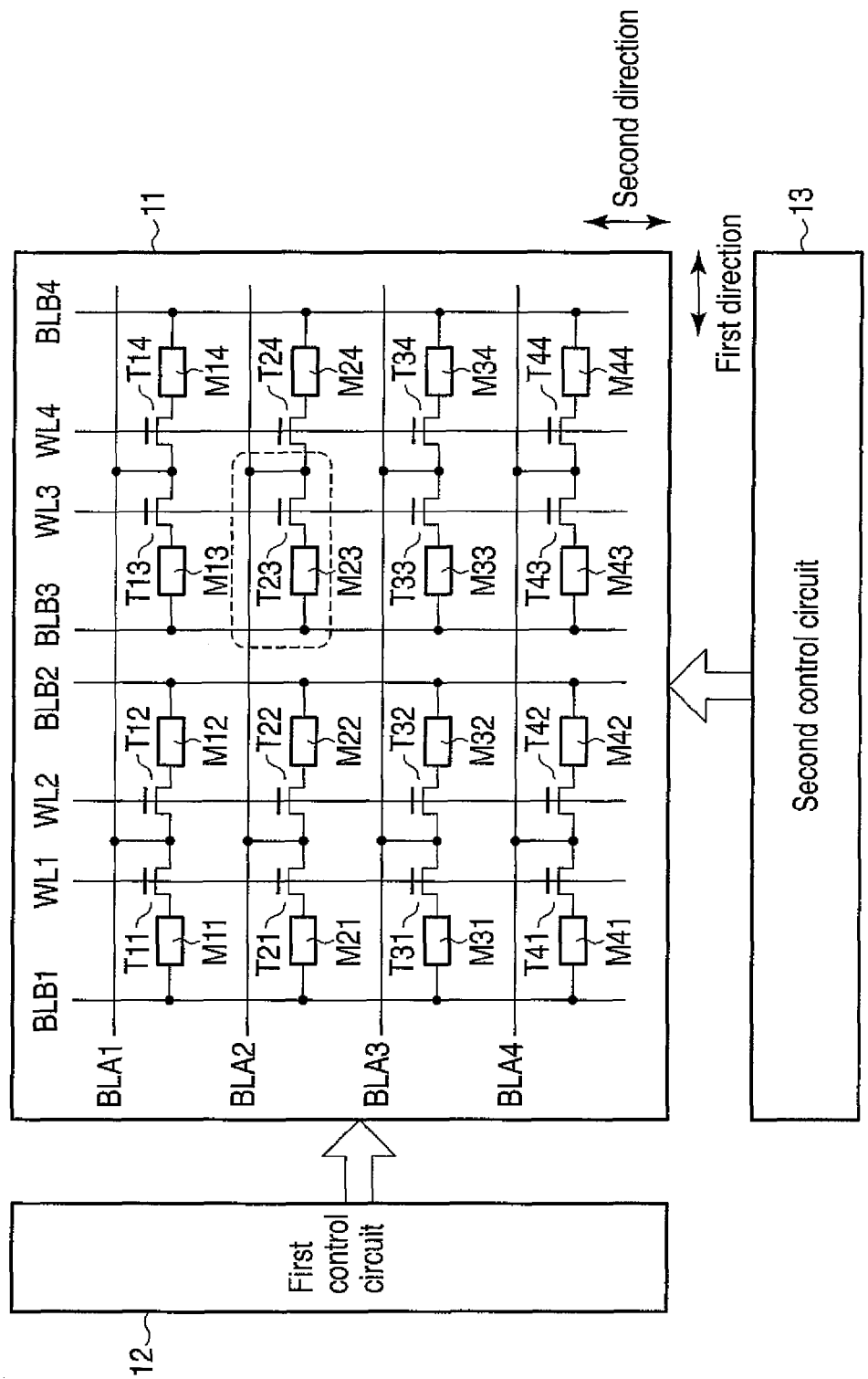
F I G. 1

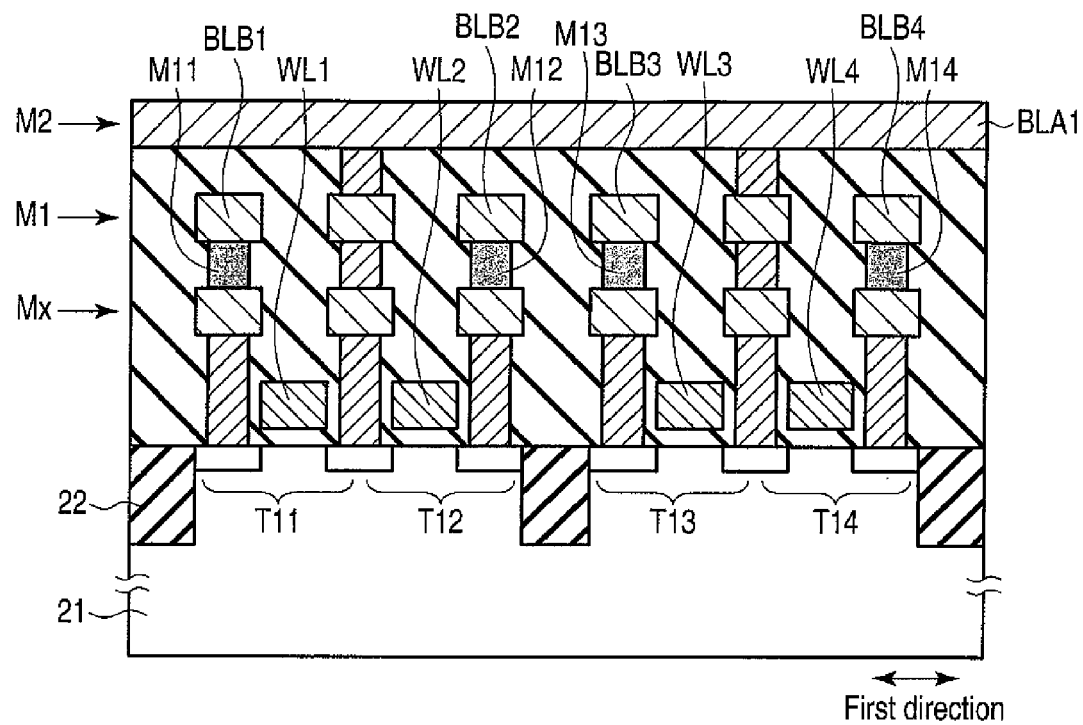
F I G. 3
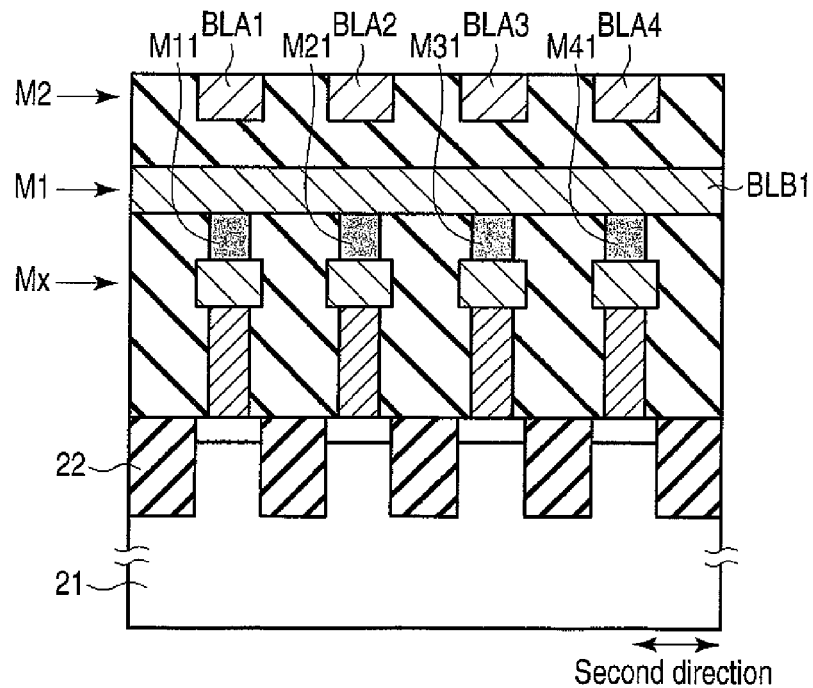
F I G. 4

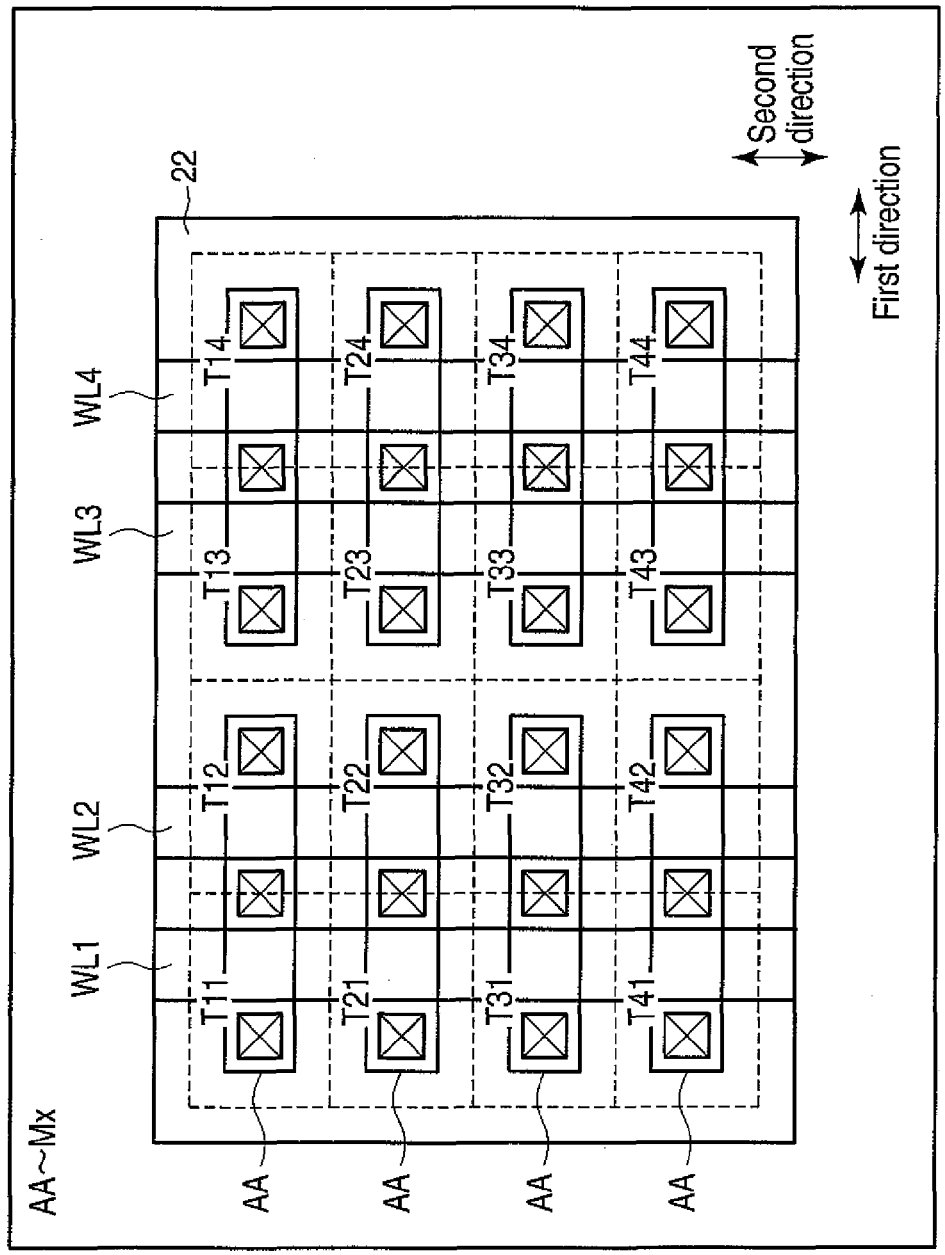
F I G. 7

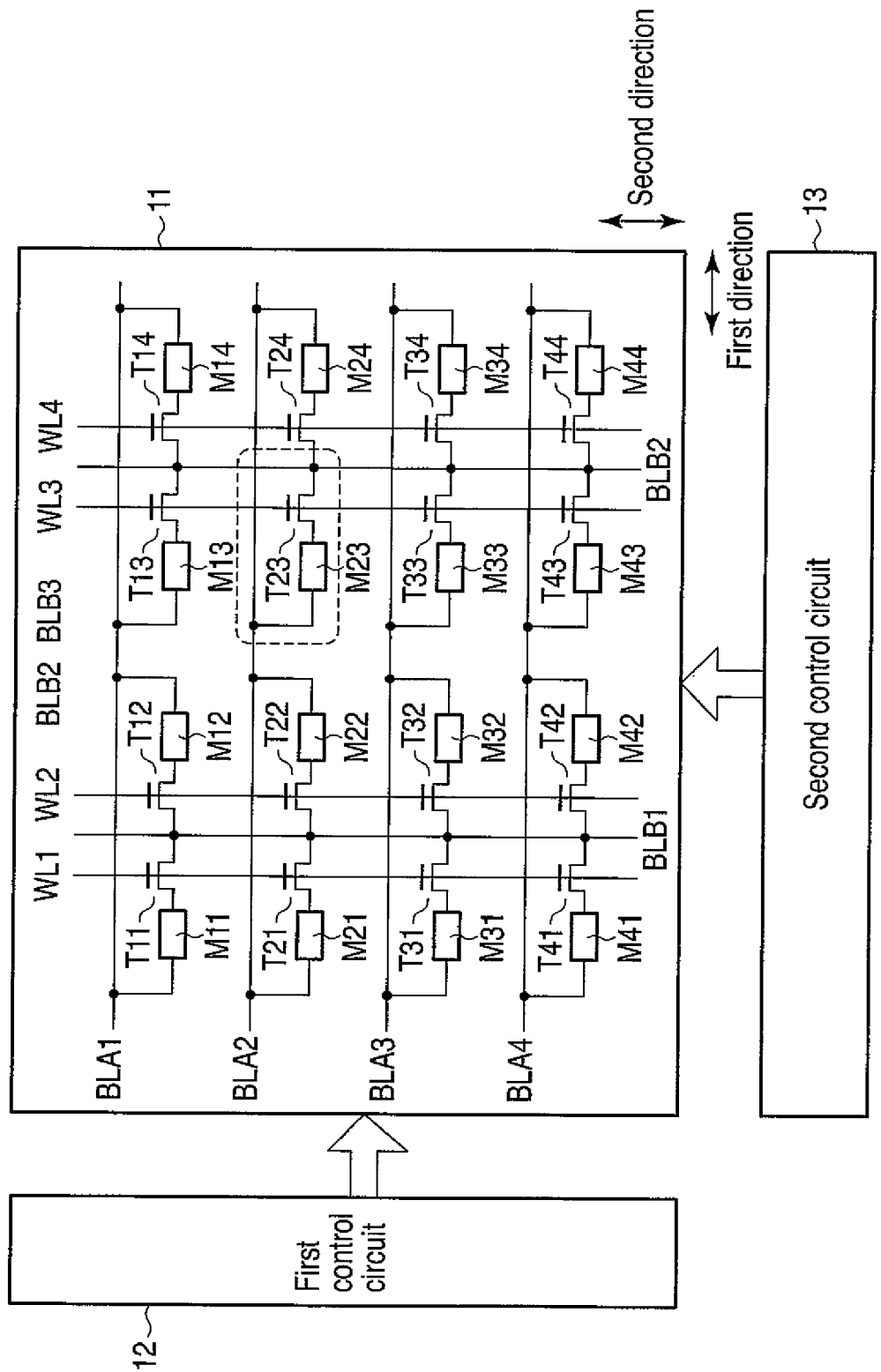
F I G. 14

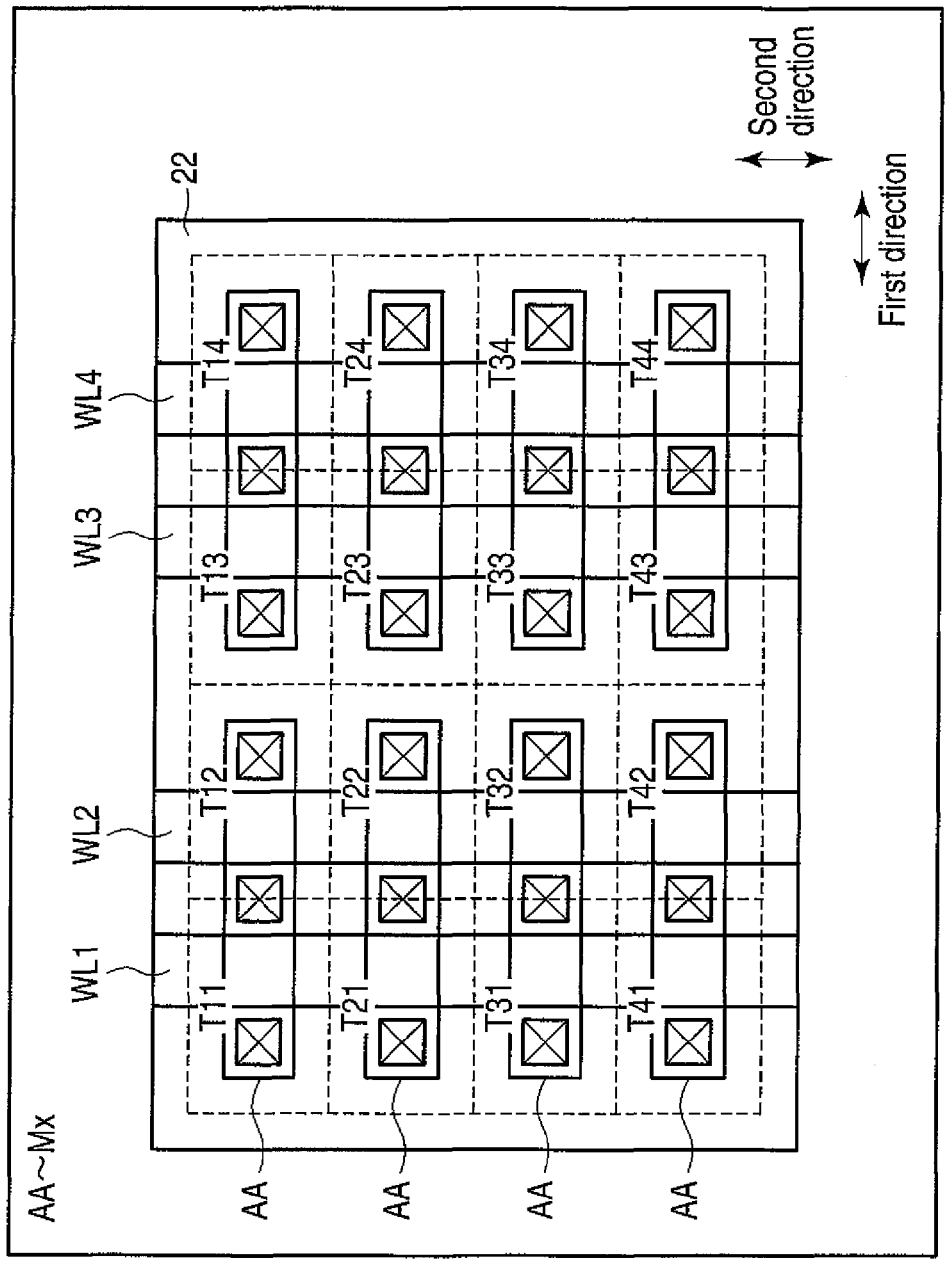
F I G. 20

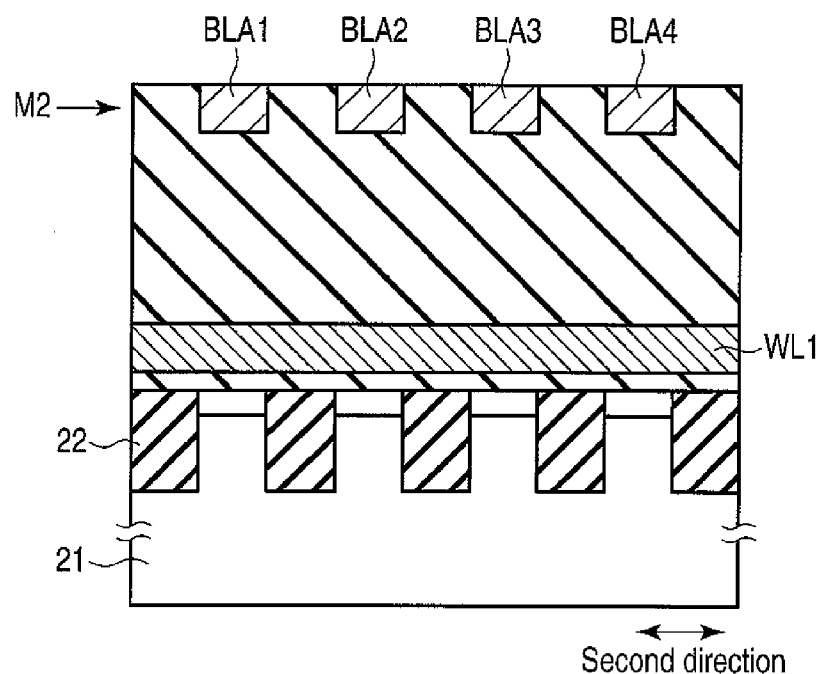
F I G. 25
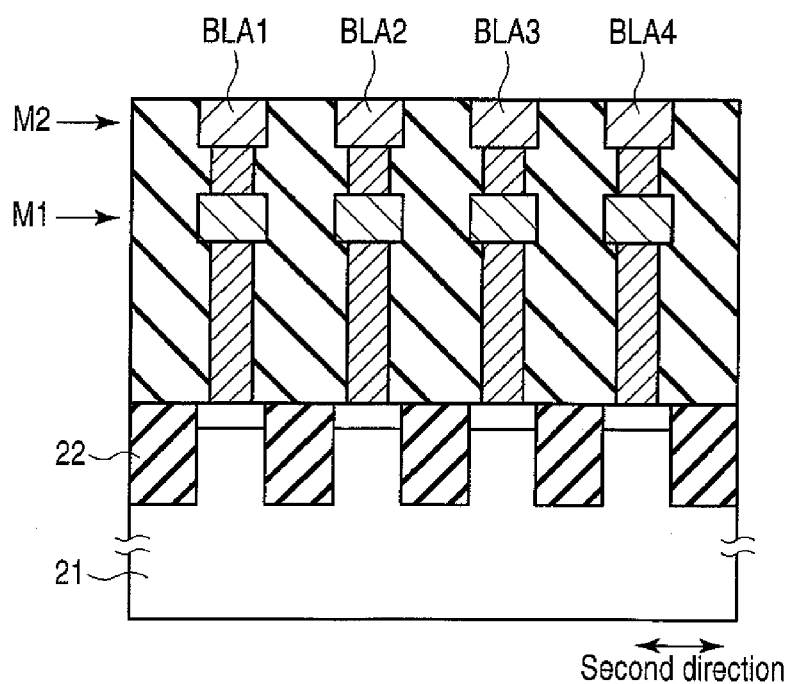
F I G. 26

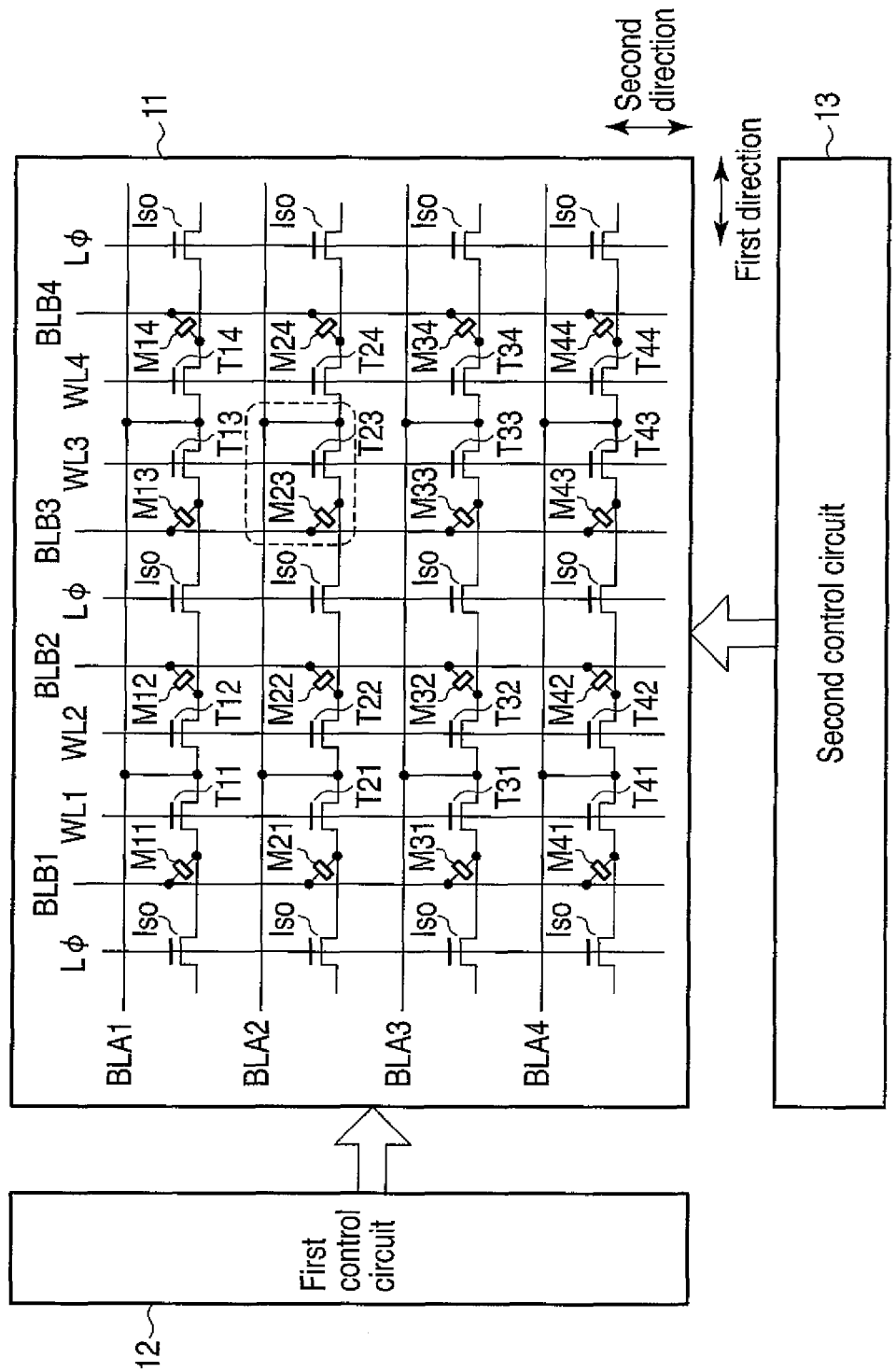
F I G. 27

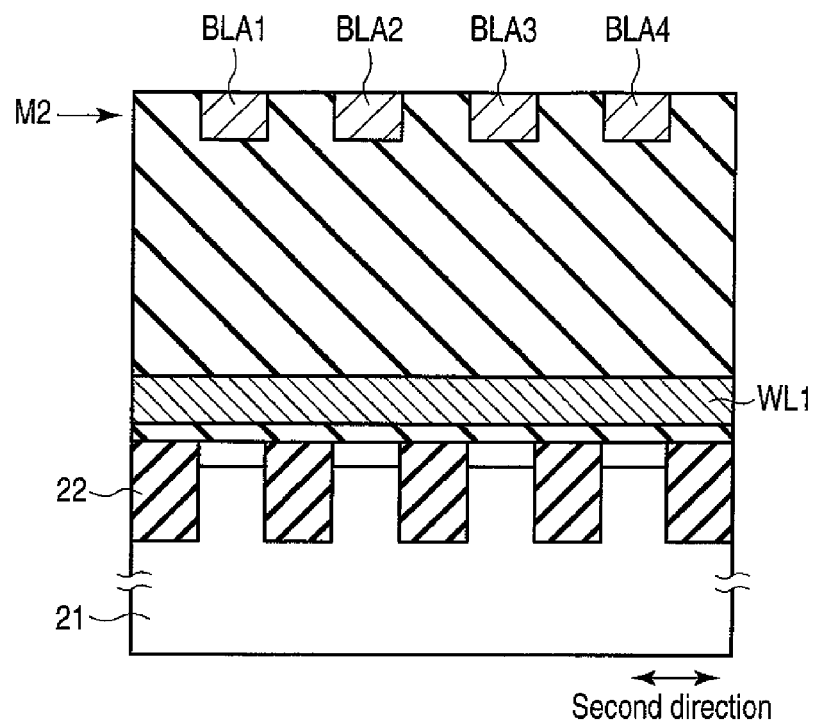
F I G. 3 1
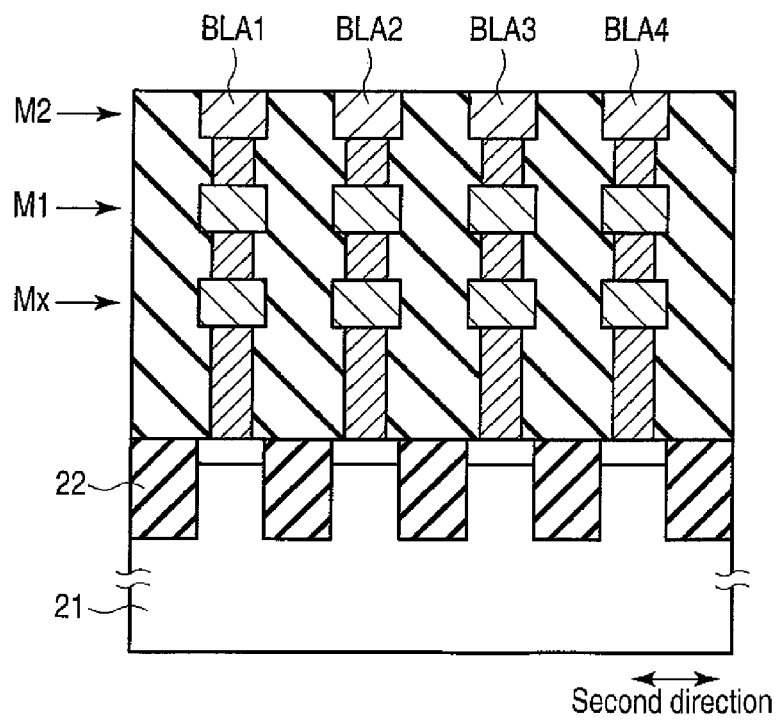
F I G. 3 2

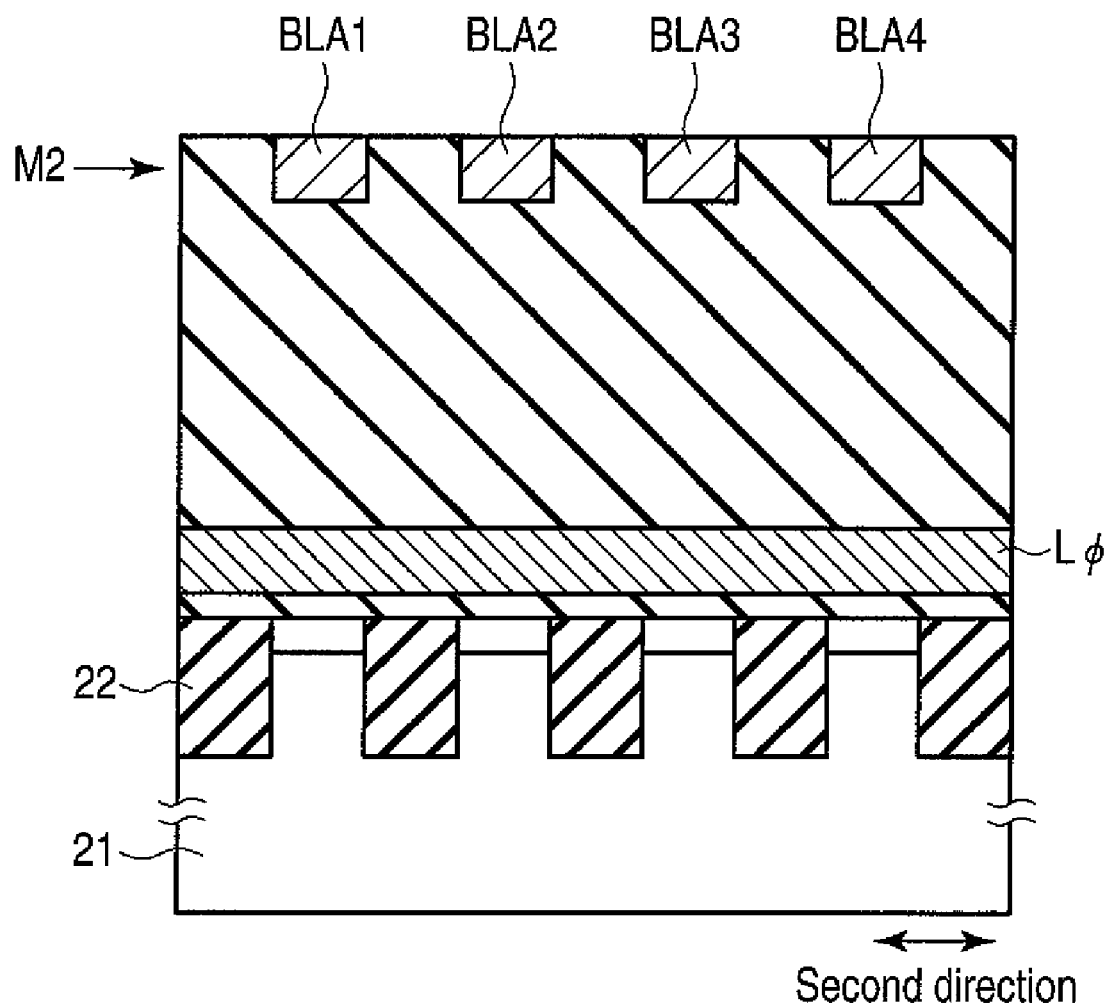
F I G. 33

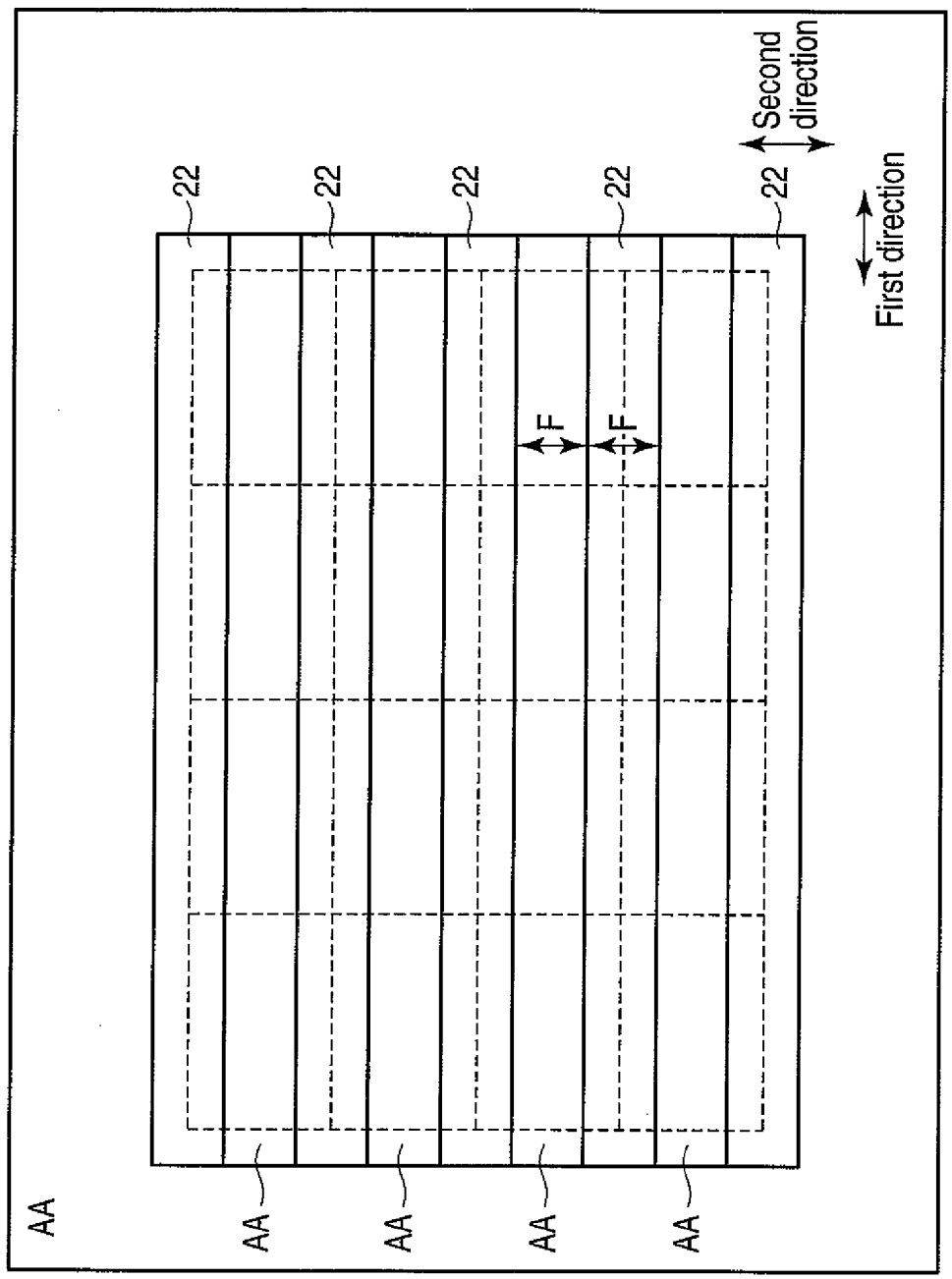
F I G. 34

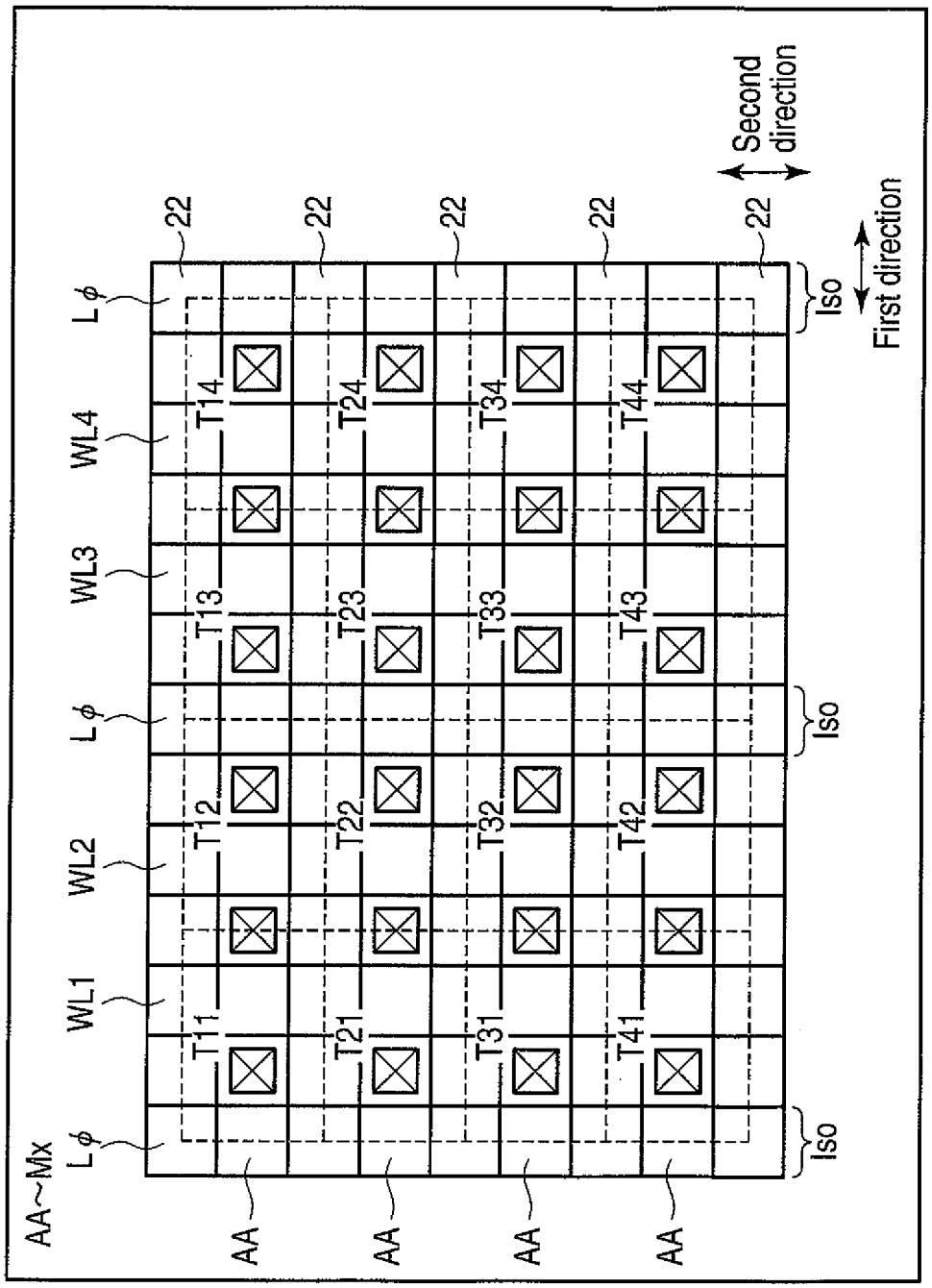
F I G. 3 5

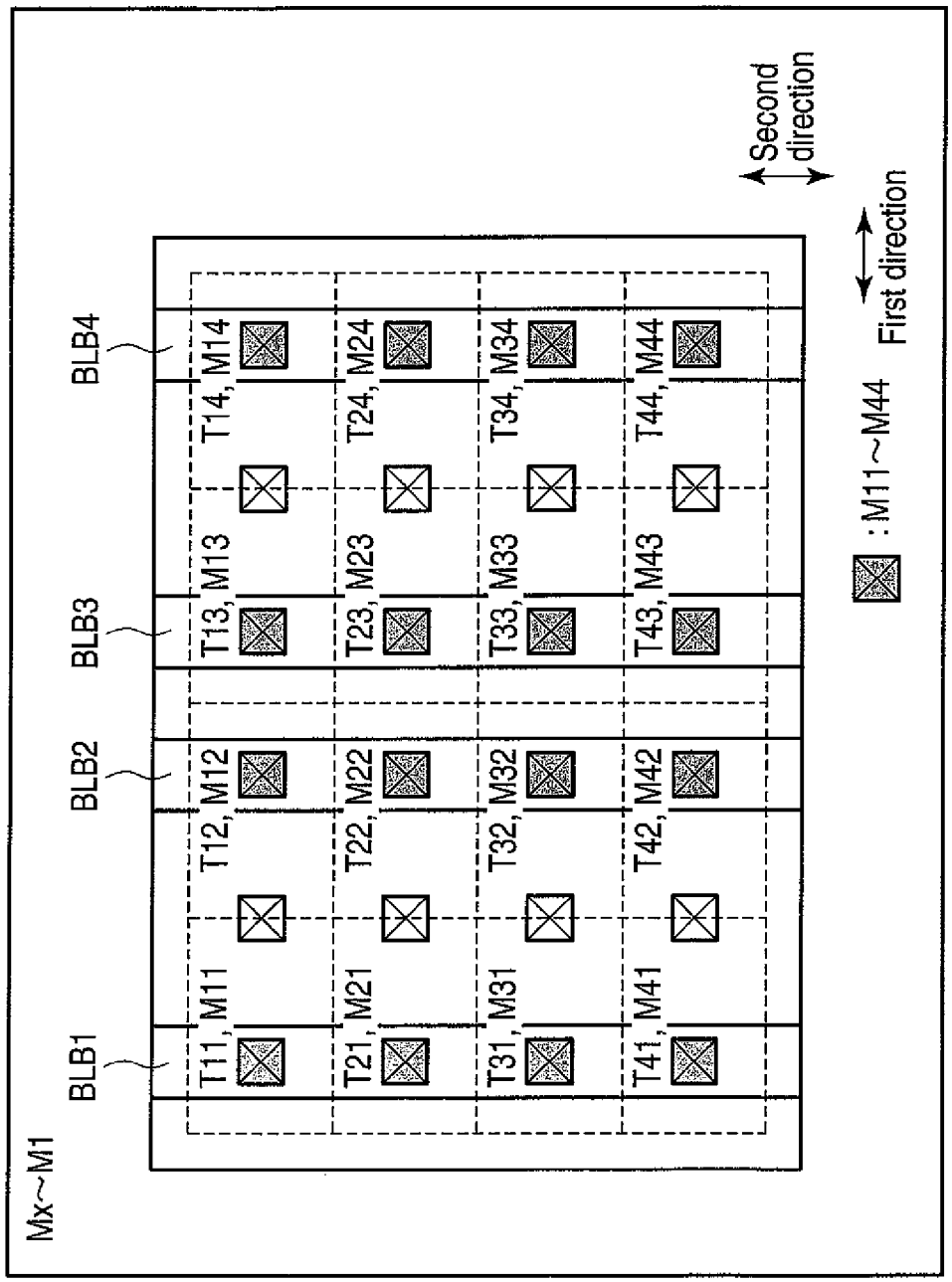
F I G. 36

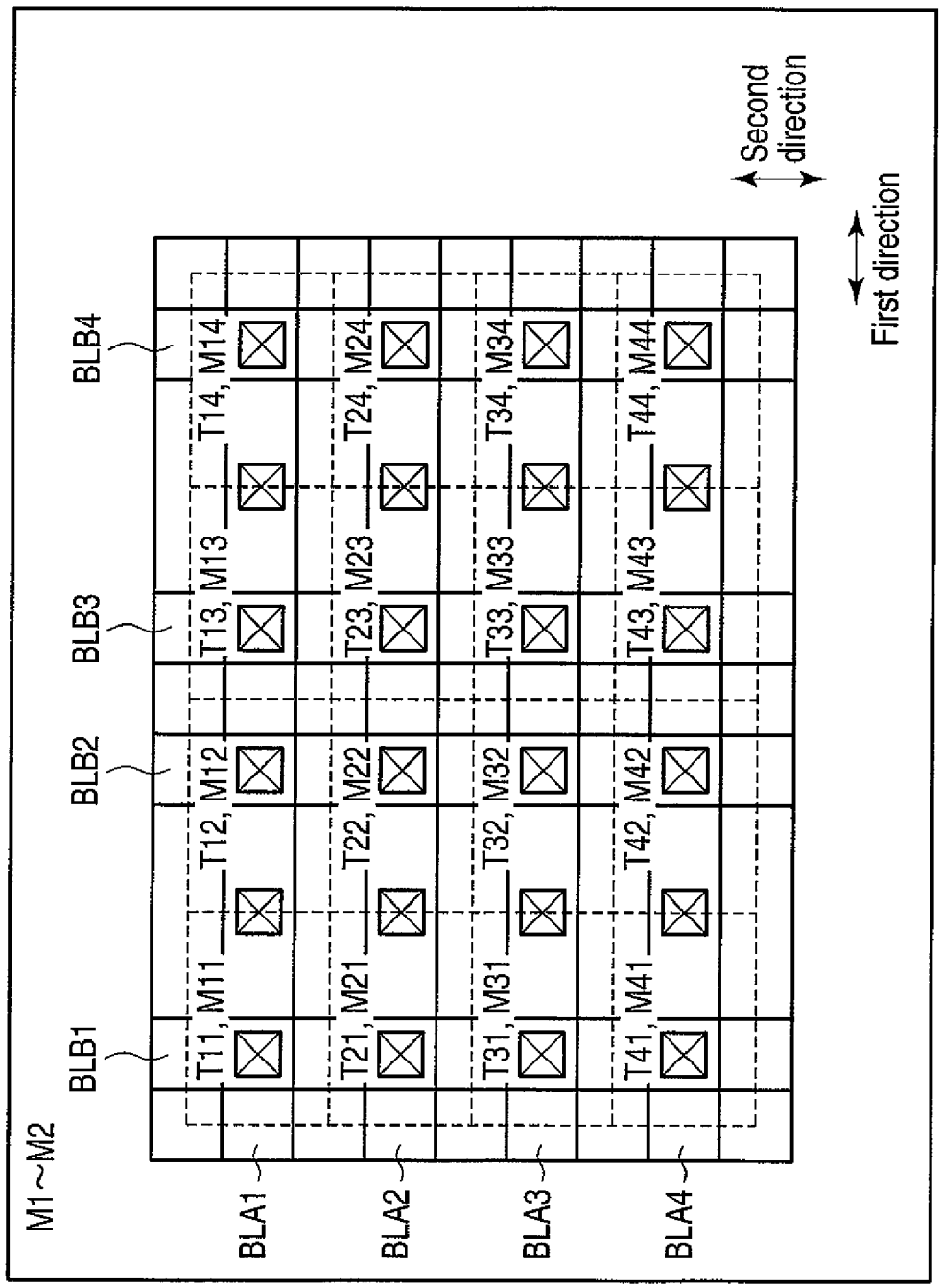
F I G. 37

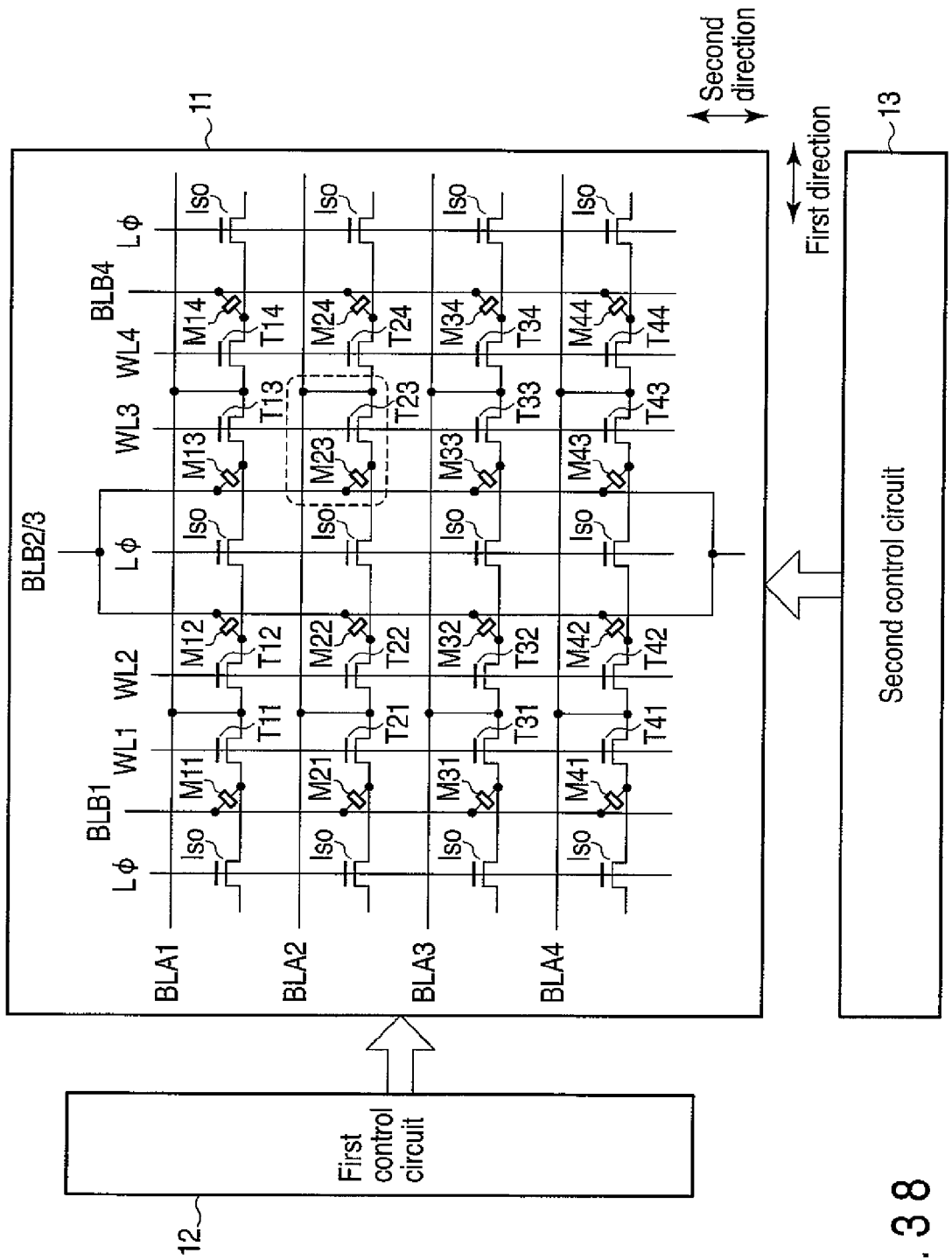
F I G. 38

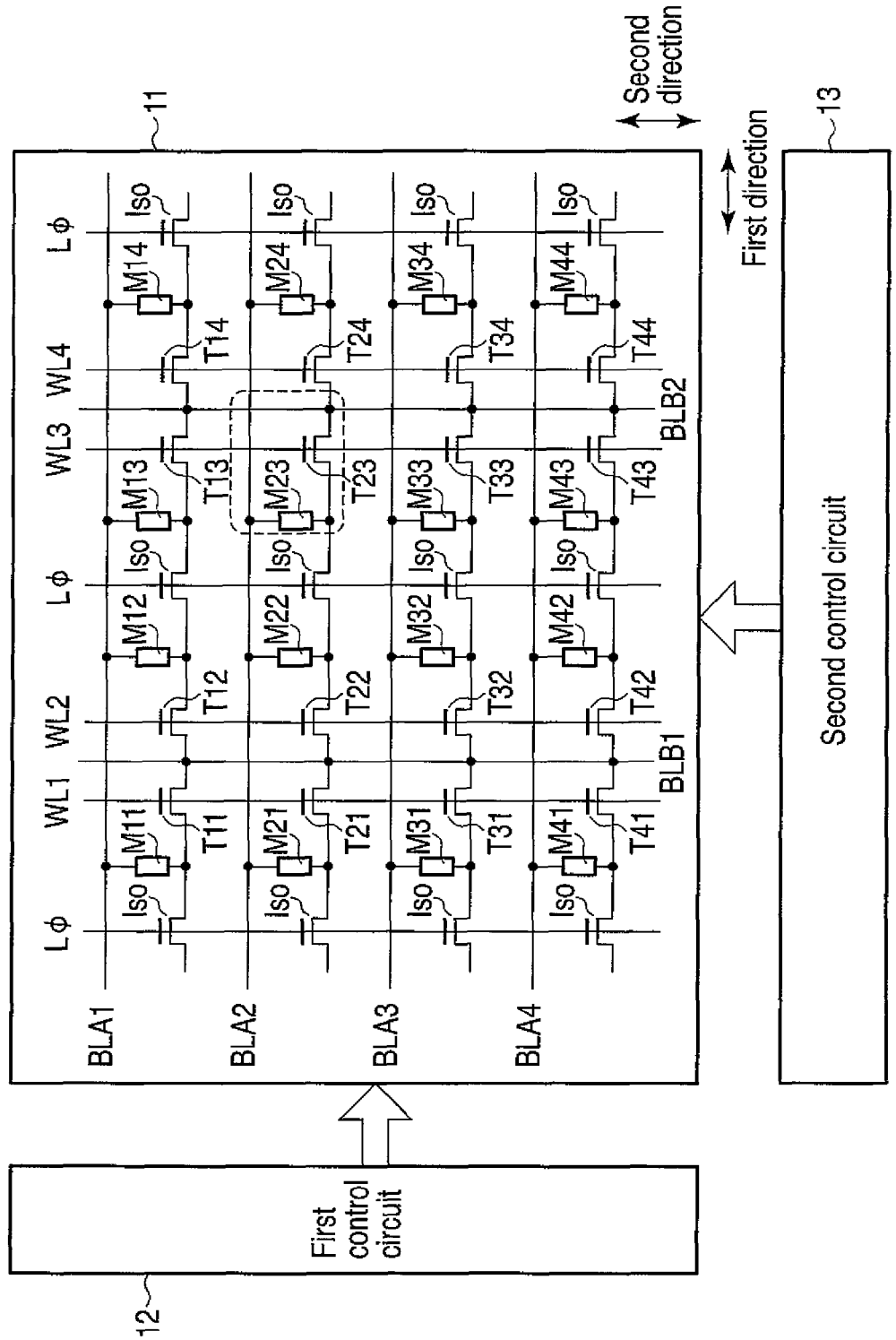
F I G. 41

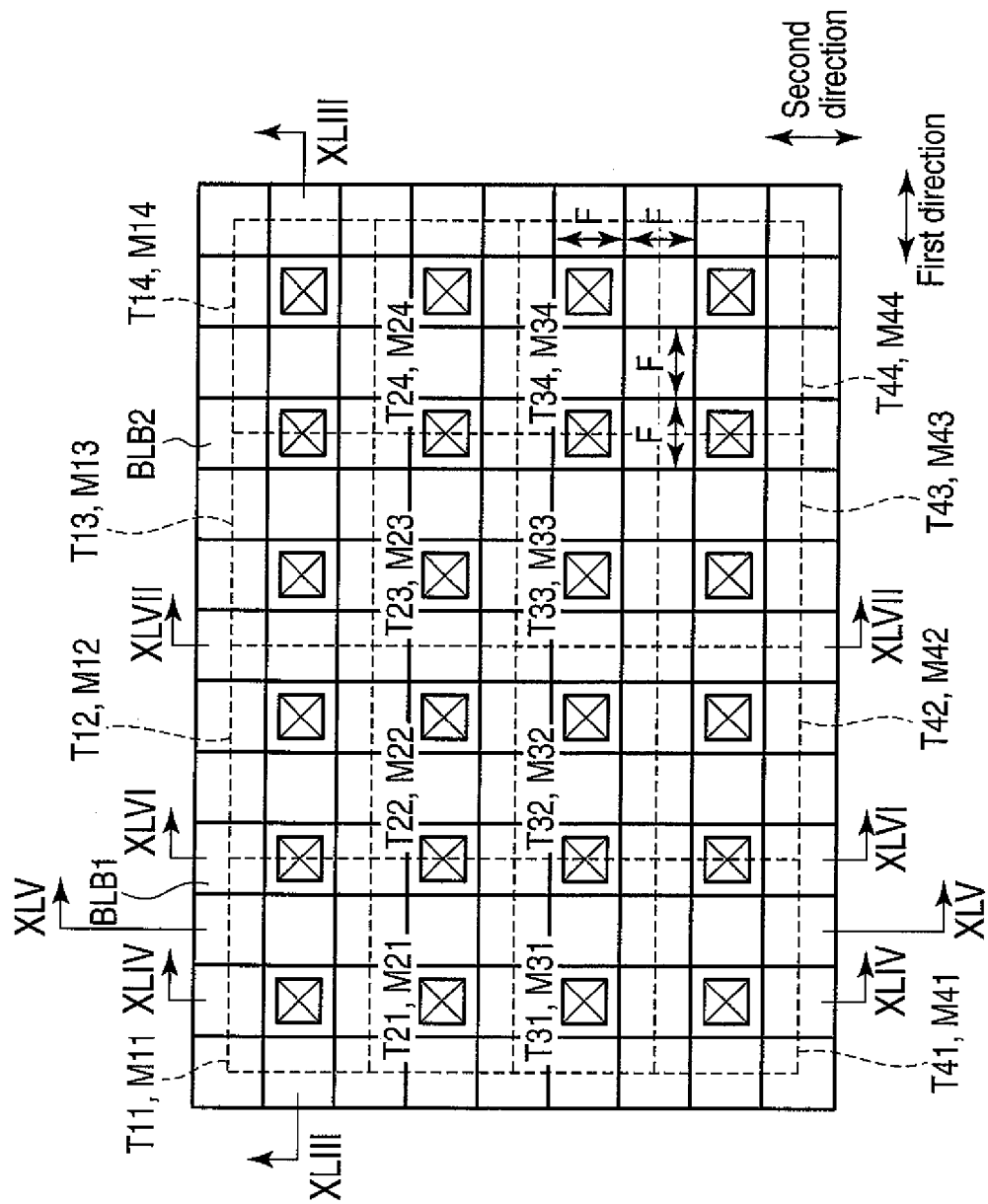
F I G. 42

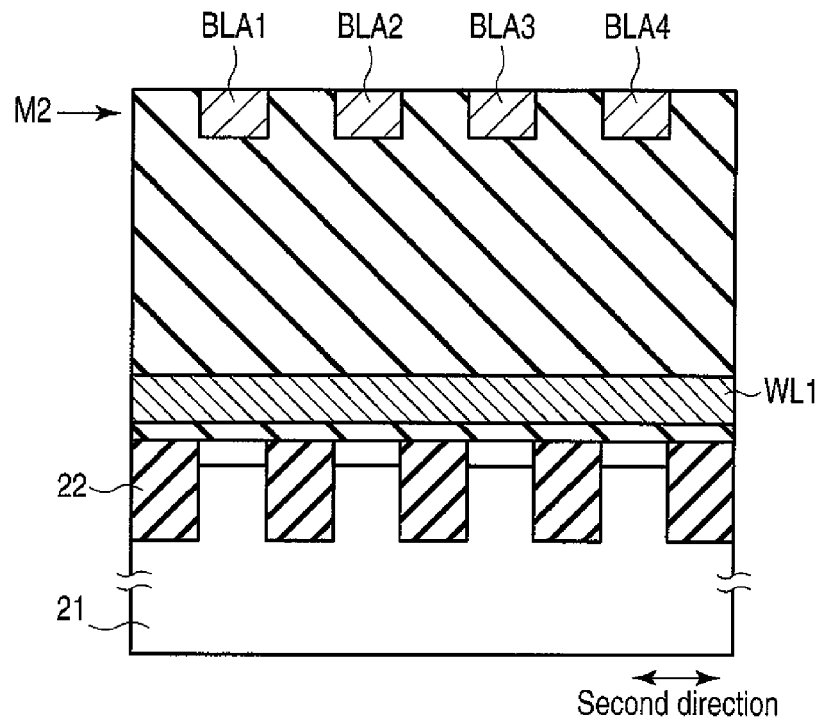
F I G. 45
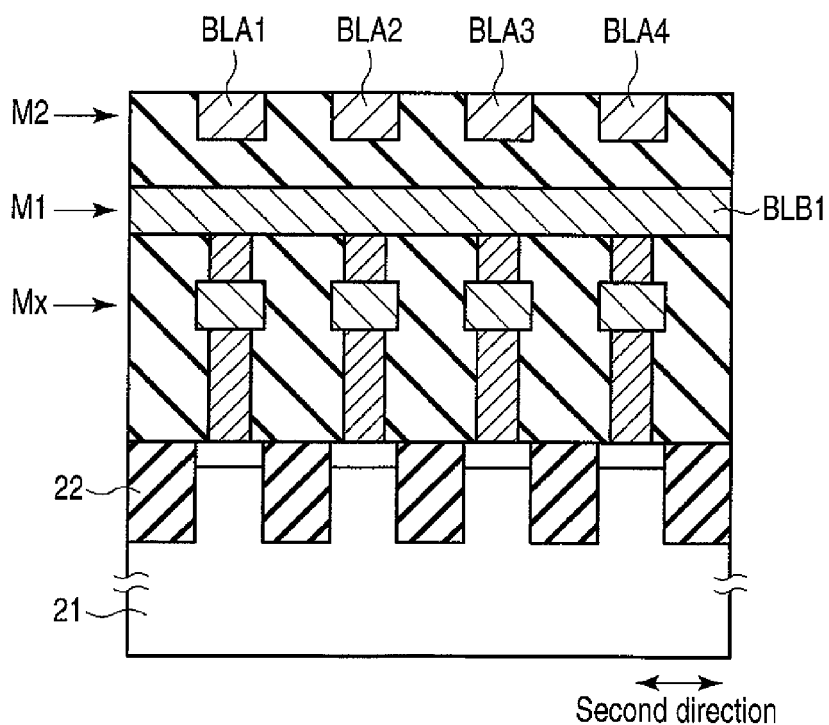
F I G. 46

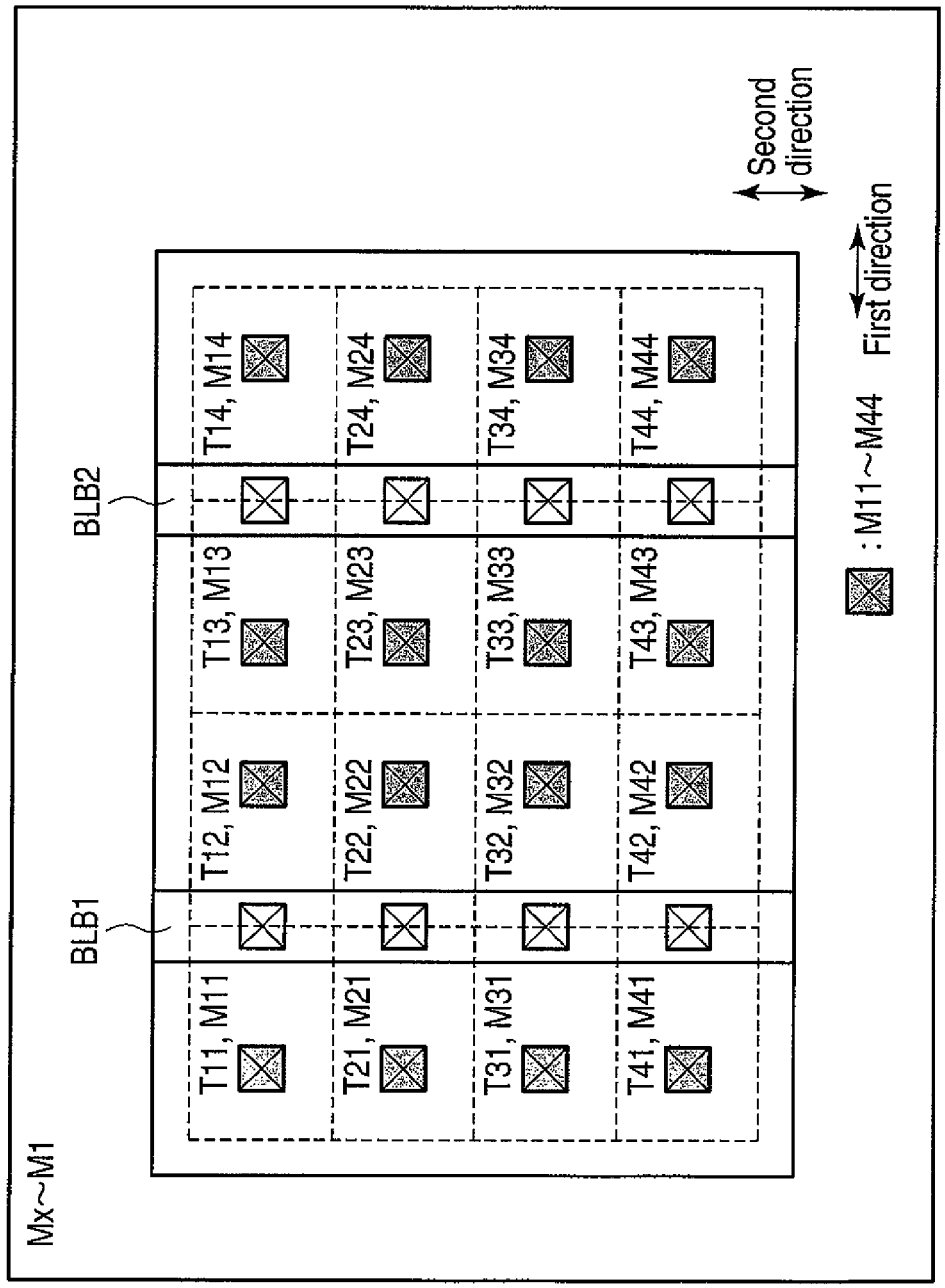
F I G. 50

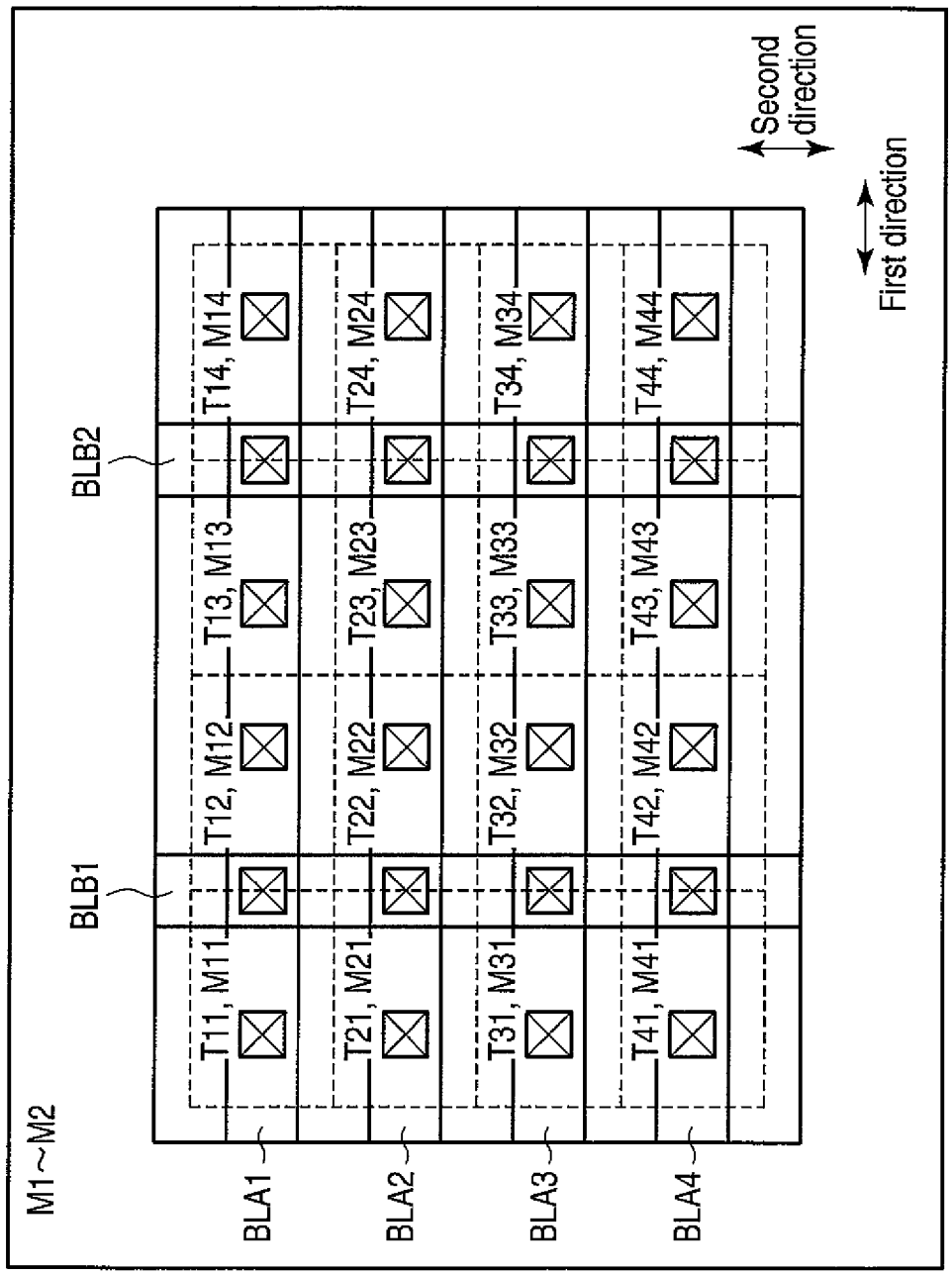
F I G. 51

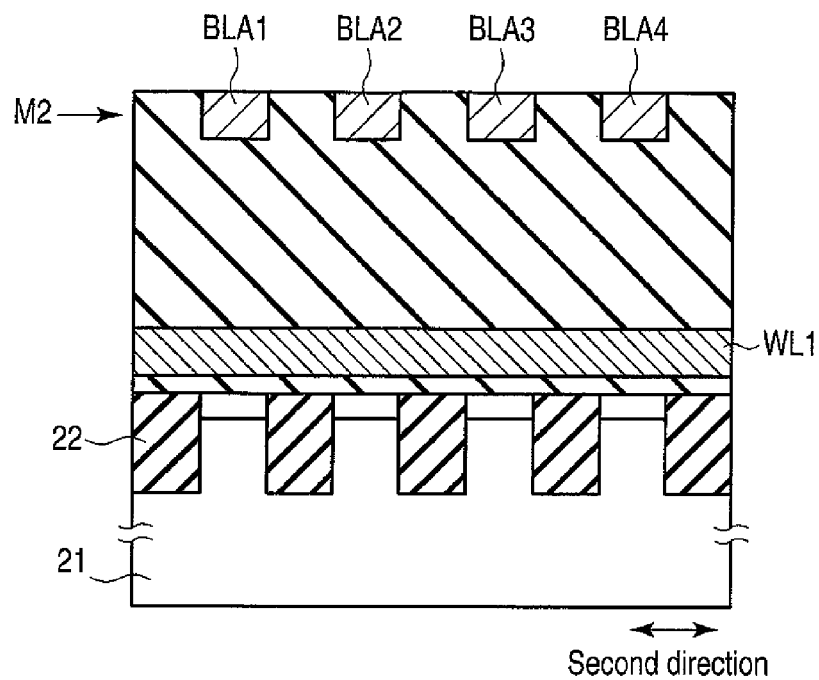
F I G. 5 4
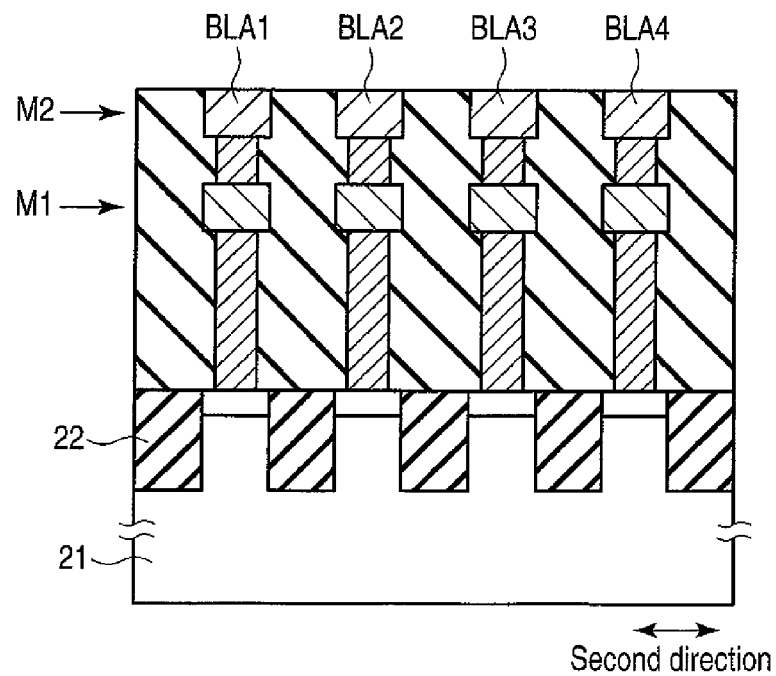
F I G. 5 5

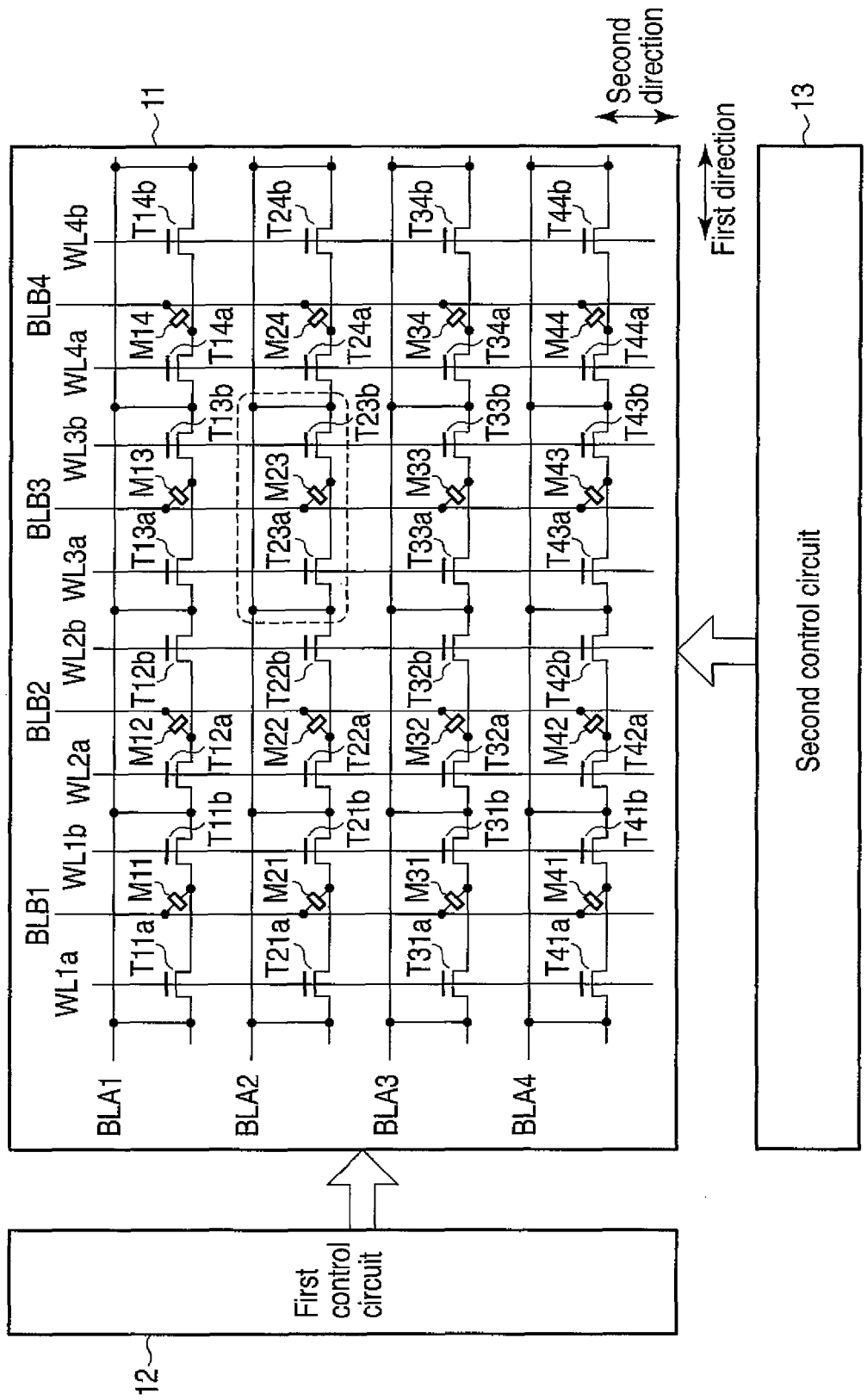
F I G. 57

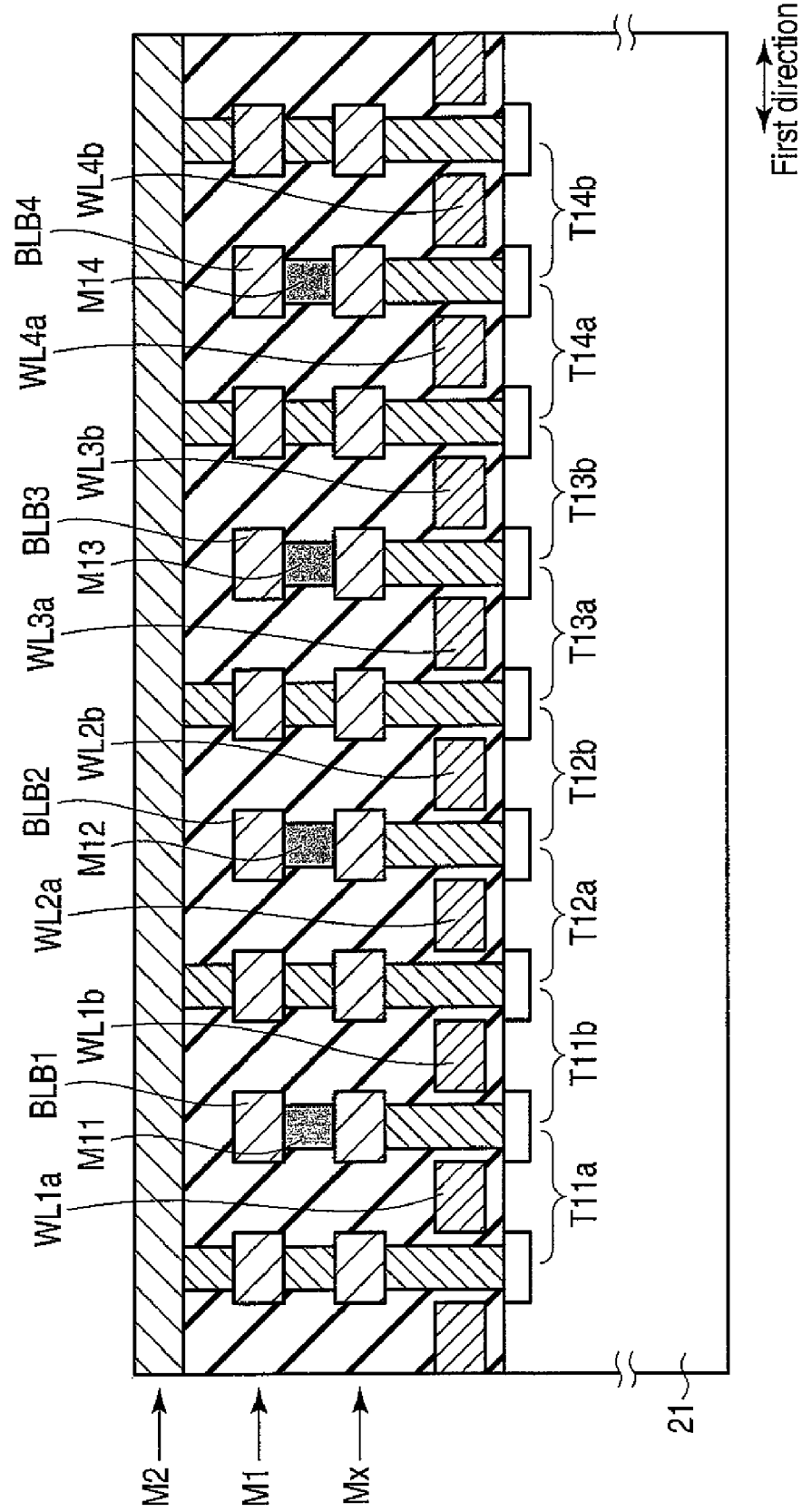
F I G. 5 9

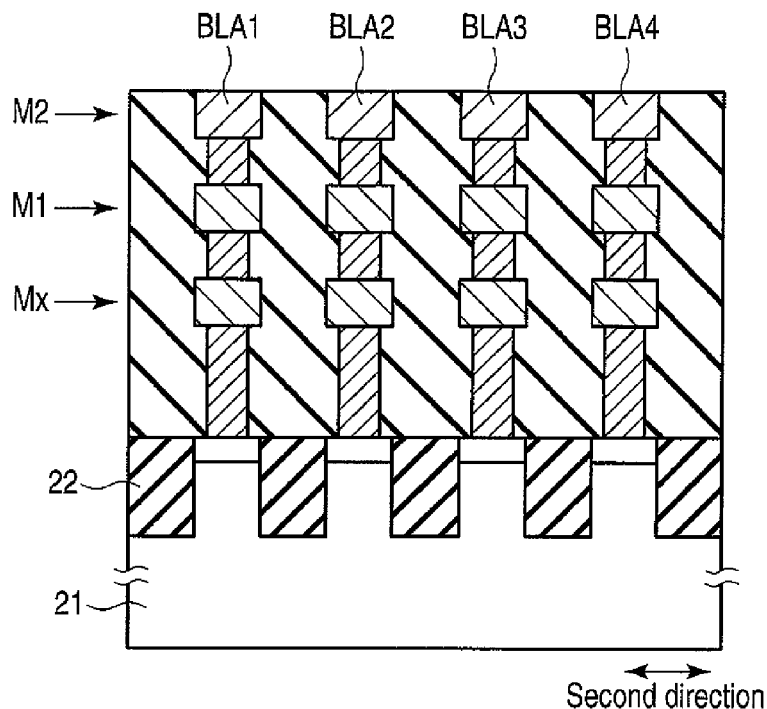
F I G. 60
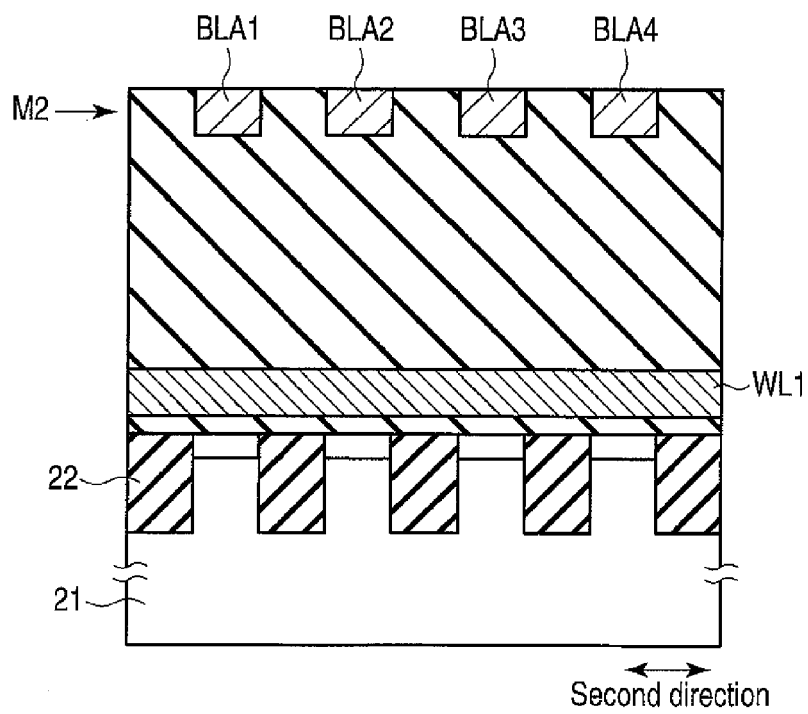
F I G. 61

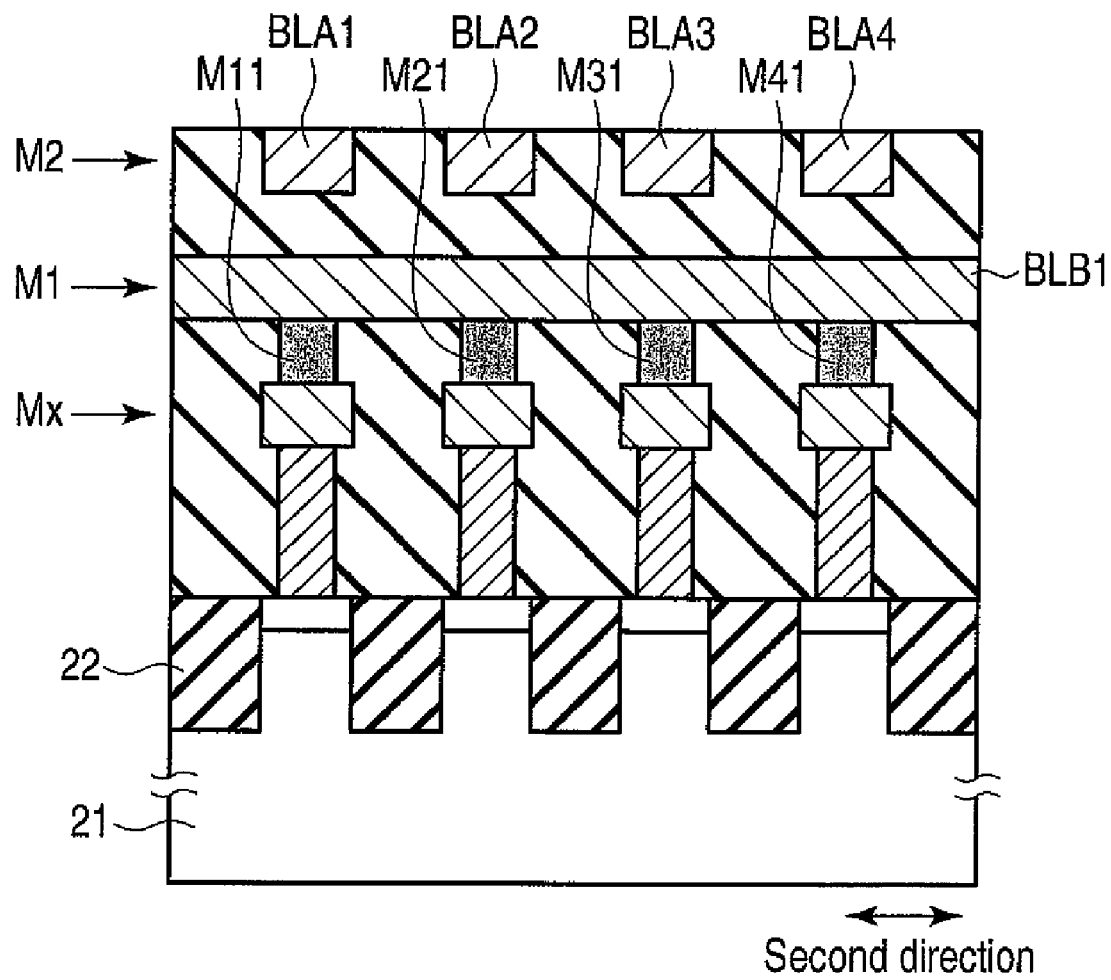
F I G. 62

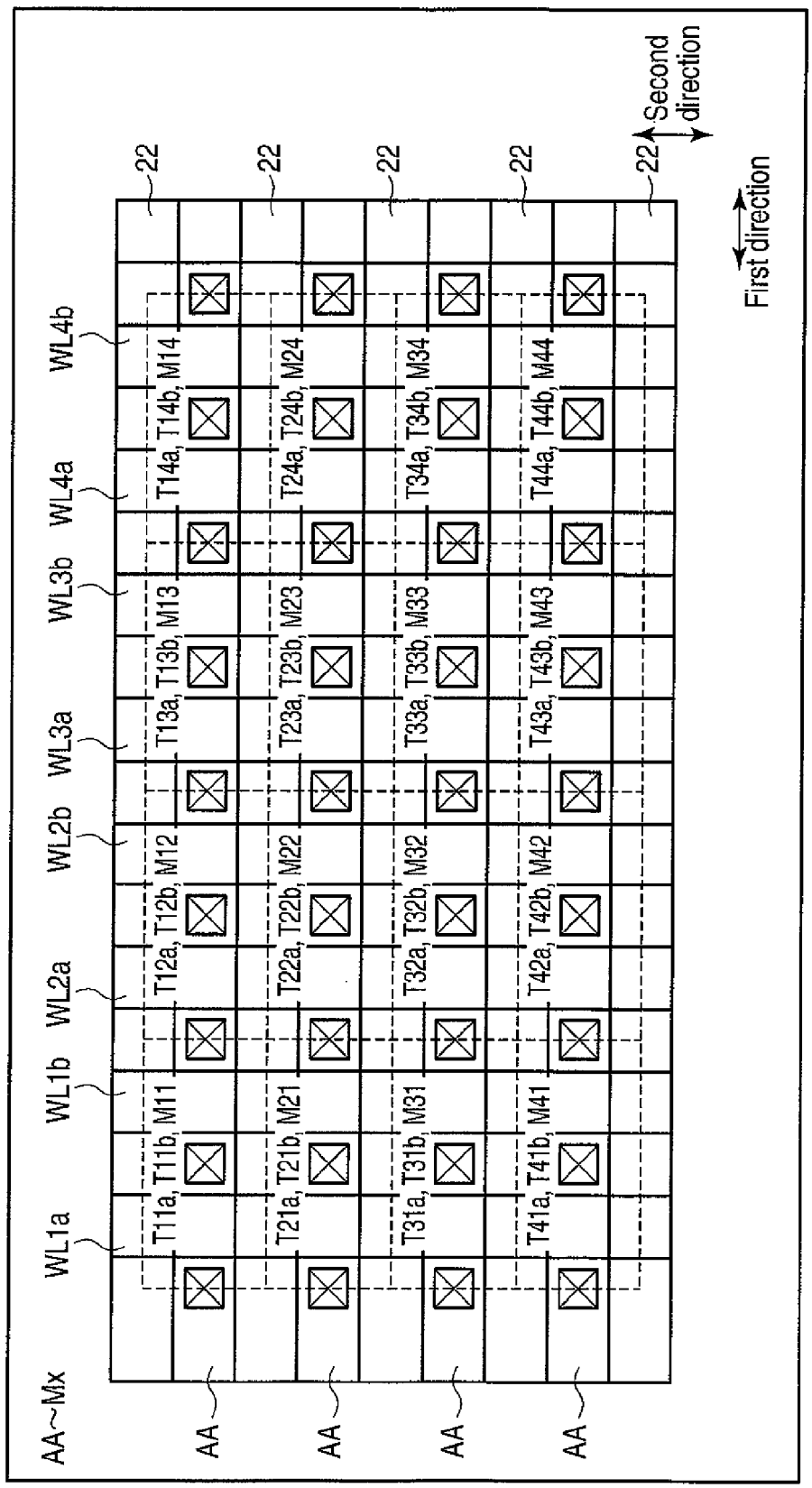
F I G. 64

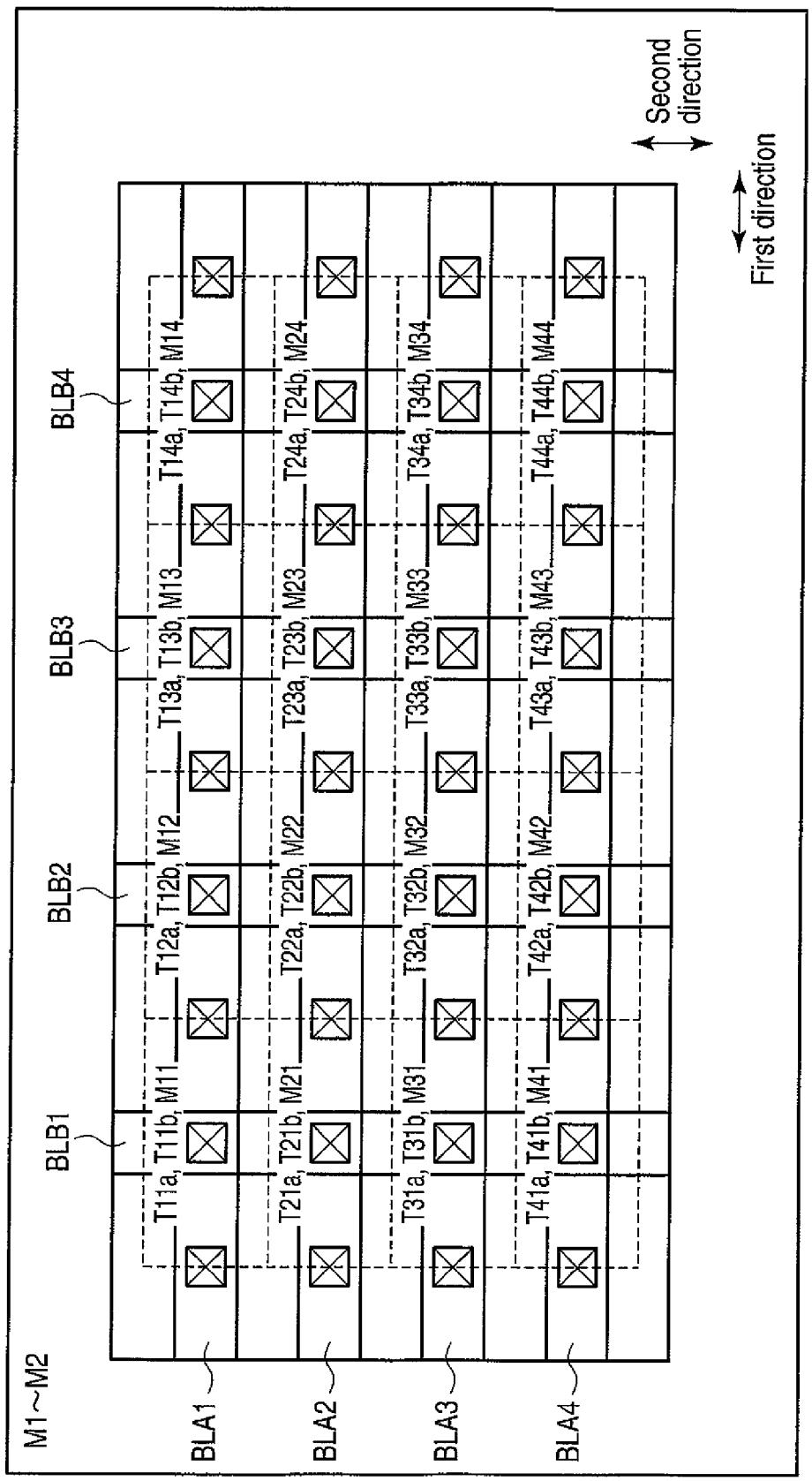
F I G. 66

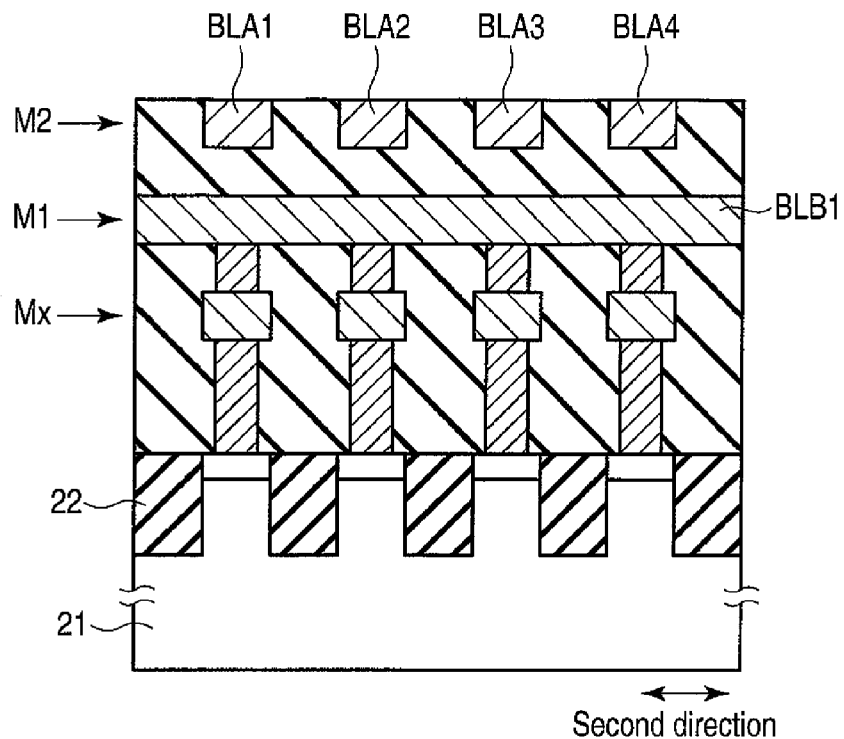
F I G. 70
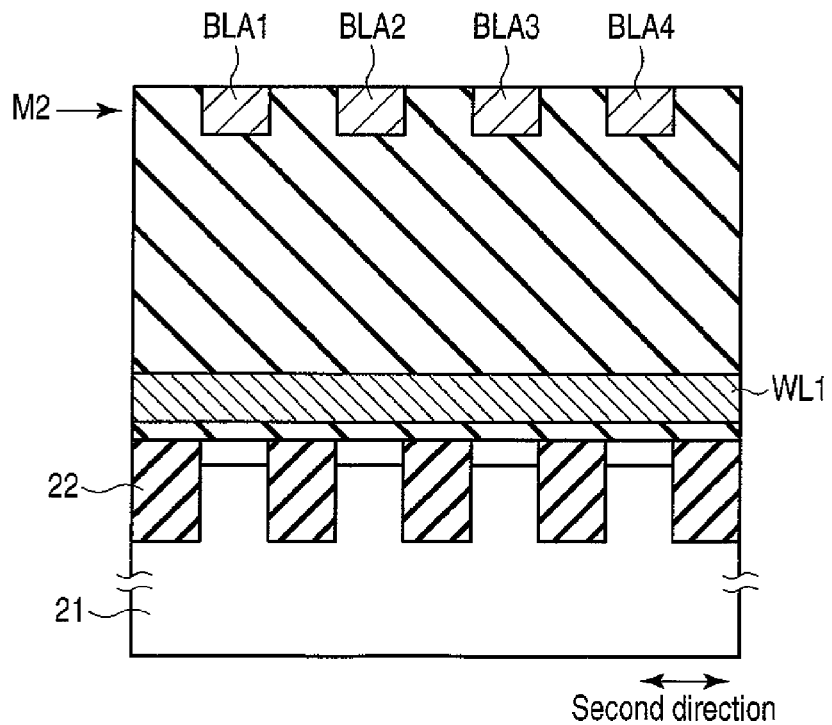
F I G. 71

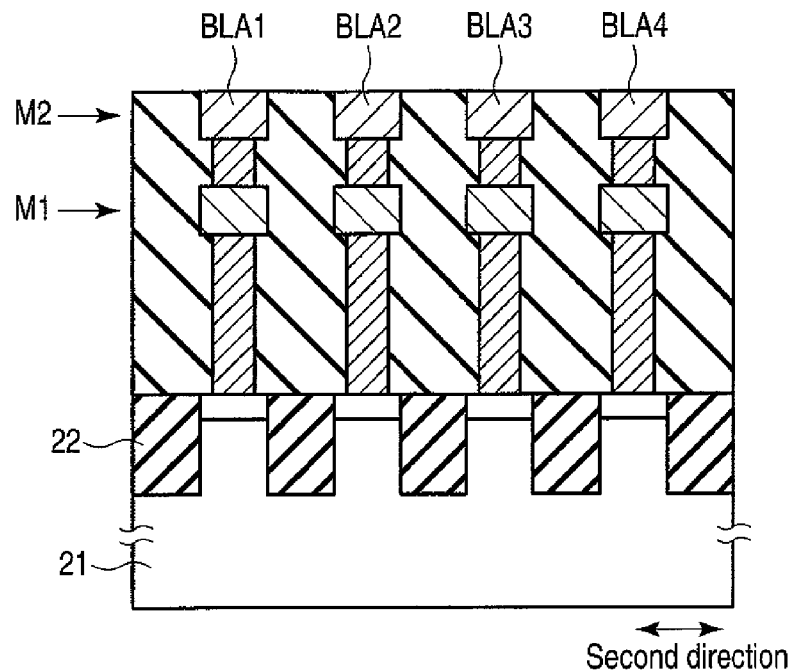
F I G. 78
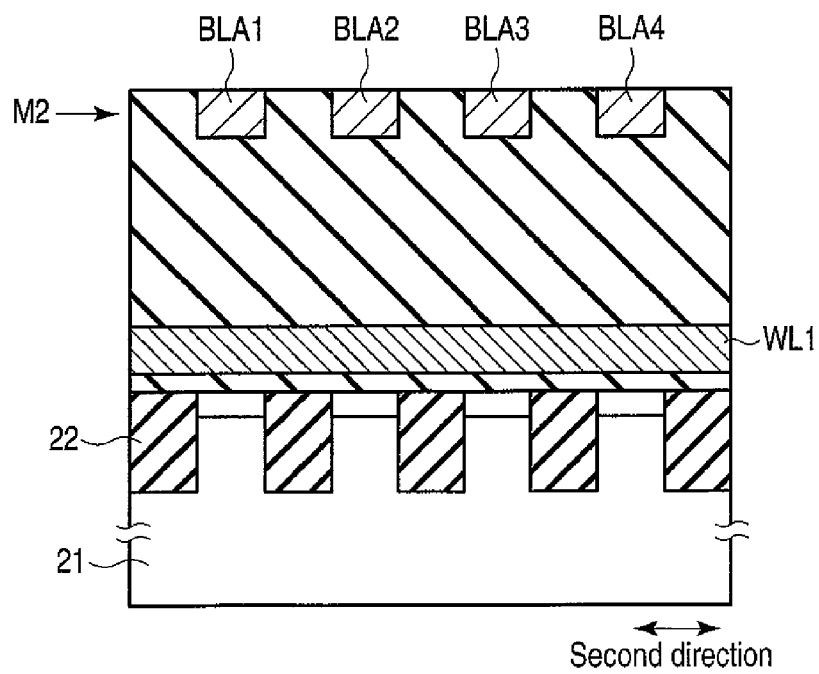
F I G. 79

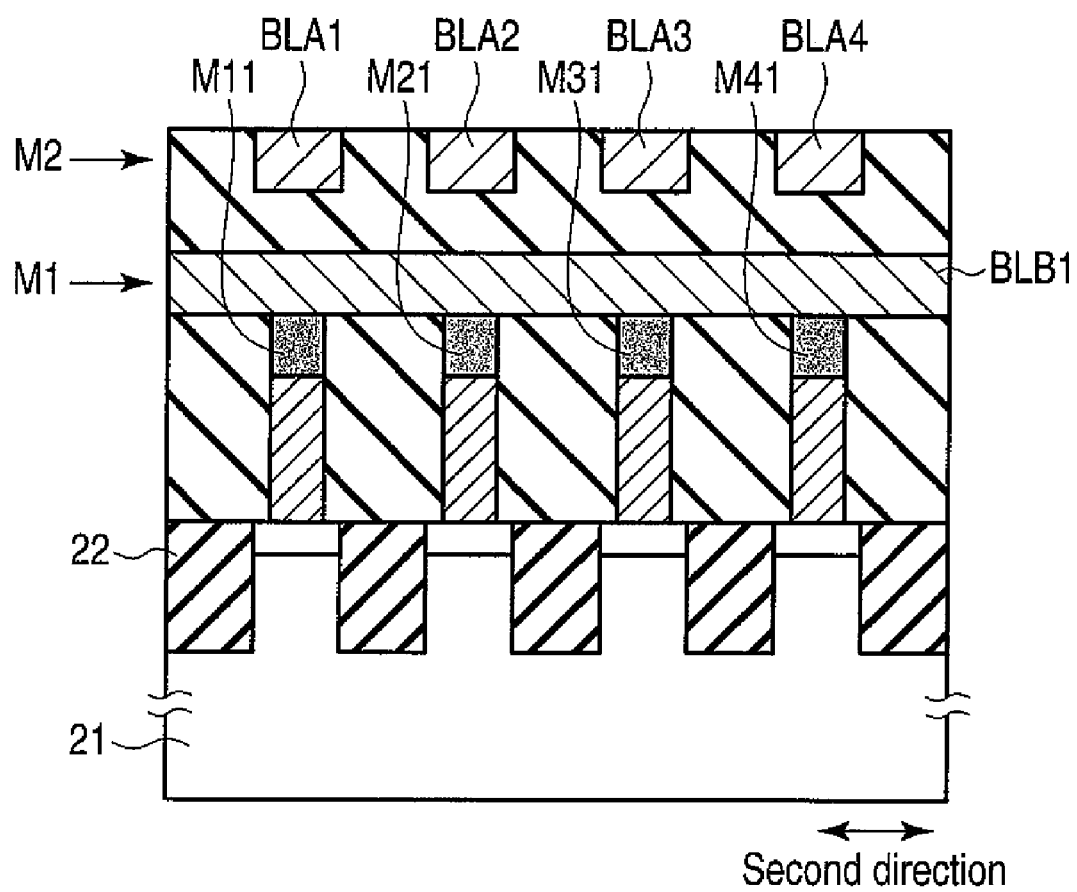
F I G. 80

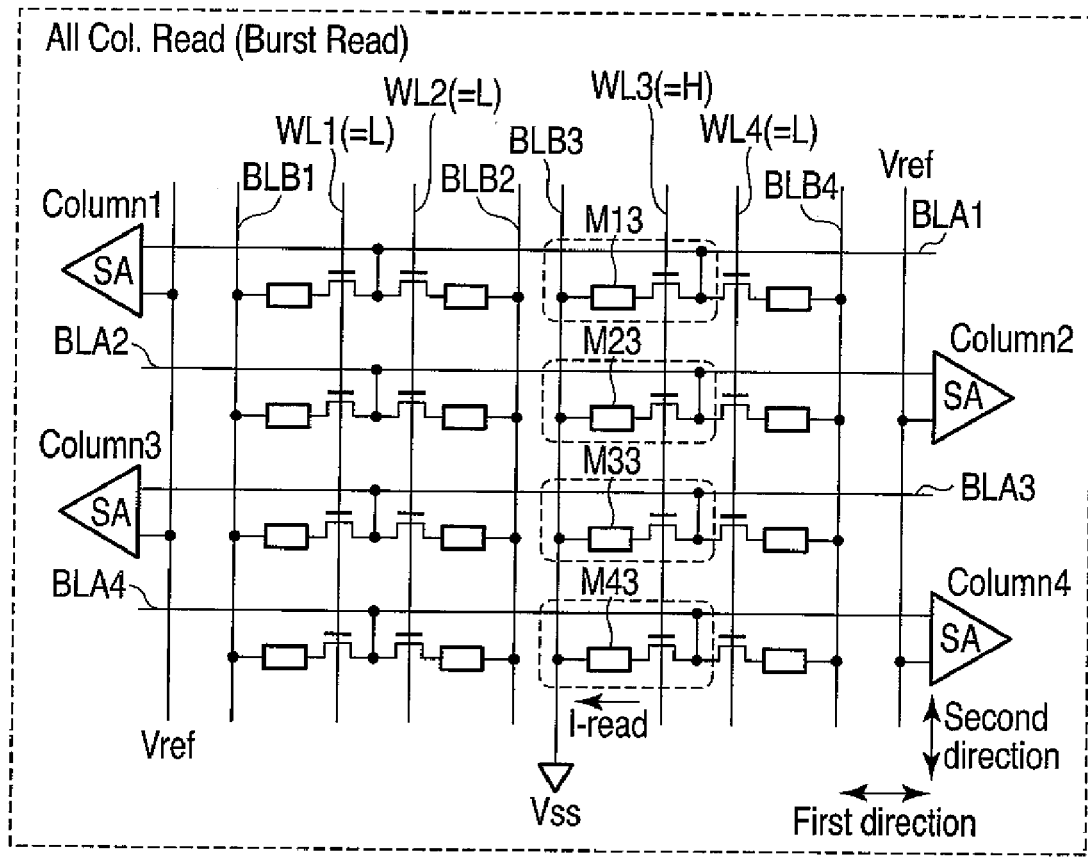
F I G. 8 4

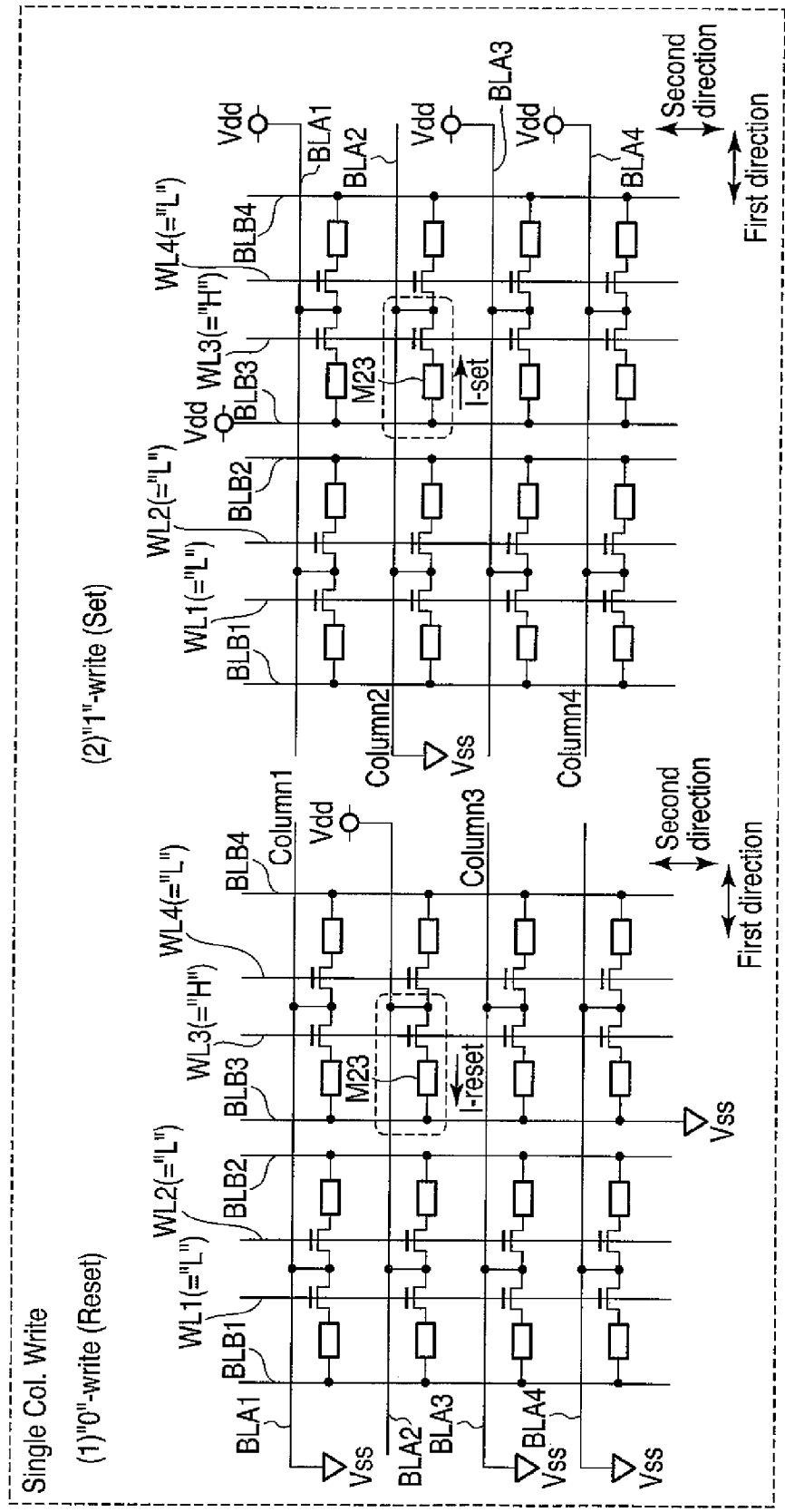
F I G. 85

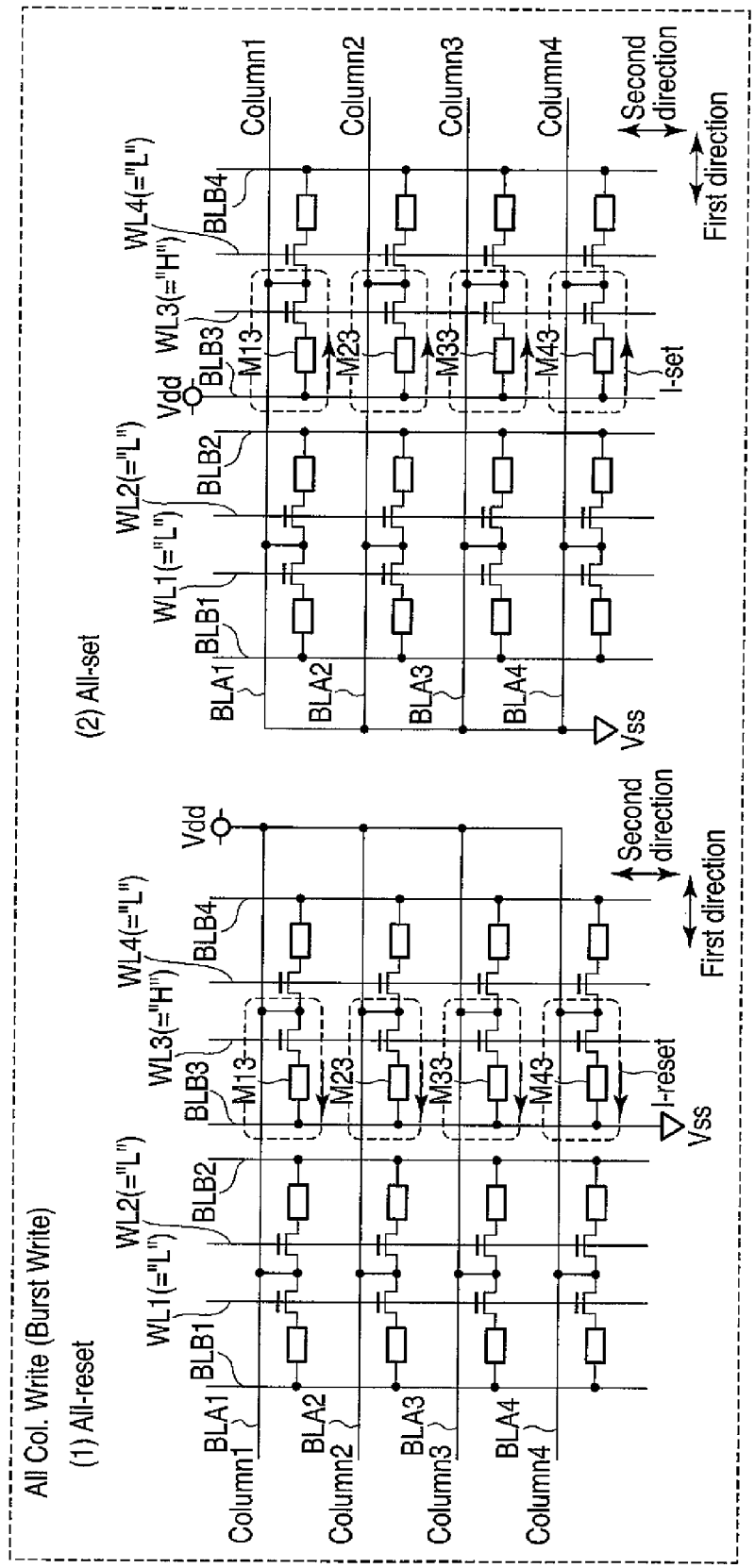
F I G. 87

RESISTANCE-CHANGE SEMICONDUCTOR MEMORY

CROSS-REFERENCE TO RELATED APPLICATIONS

This application is based upon and claims the benefit of priority from Japanese Patent Application No. 2010-153205, filed Jul. 5, 2010; the entire contents of which are incorporated herein by reference.

FIELD

Embodiments described herein relate generally to a resistance-change semiconductor memory.

BACKGROUND

A resistance-change semiconductor memory is a semiconductor memory which uses a resistive memory element as a recording medium. The resistive memory element is an element formed of a material whose resistance varies in response to voltage, current, heat and other factors. Magnetoresistive random access memory (MRAM), phase-change random access memory (PCRAM) and resistive random access memory (ReRAM) are all varieties of resistance-change semiconductor memory which are expected to be deployed as high-capacity, high-speed next-generation semiconductor memories.

As a memory cell of the resistance-change semiconductor memory, a cross point type, a one-transistor/one-memory-element type or a two-transistor/one-memory-element type have been investigated in terms of reduction in cell area, improvement in operating characteristics and other factors.

The cross point type is mainly adopted in the ReRAM and the PCRAM and has a single structure where each memory cell is arranged at the intersection of two conductive lines, which is effective for reducing the cell area. However, there is a reduction in selectivity (operating characteristics) of the memory cells because of sneak current.

The one-transistor/one-memory-element type and the two-transistor/one-memory-element type are mainly adopted in the MRAM, and they are effective for improving the selectivity of memory cells. However, a transistor must be provided in each memory cell, and hence an increase in cell area is inconvenient as compared with the cross point type.

In a so-called a spin torque transfer MRAM that executes magnetization reversal by using a polarized spin current in particular, both a write operation and a read operation are executed by passing a current through each memory cell. Therefore, to reduce a probability of destruction of stored information due to a so-called disturbance, it is important to provide a transistor in each memory cell to enhance the selectivity of the cells. However, as described above, there is a problem that the cell area increases in comparison with the cross point type.

BRIEF DESCRIPTION OF THE DRAWINGS

FIG. 1 is a circuit diagram showing a first embodiment;
FIG. 3 is a sectional view along line III-III in FIG. 2;
FIG. 4 is a sectional view along line IV-IV in FIG. 2;
FIG. 7 is a plan view from an active area to a zeroth conductive layer;
FIG. 14 is a circuit diagram showing a second modification of the first embodiment;
FIG. 20 is a plan view from an active area to a zeroth conductive layer;
FIGS. 23 to 26 are cross-sectional views of a third modification of the first embodiment;
FIG. 27 is a circuit diagram showing a second embodiment;
FIG. 31 is a sectional view along line XXXI-XXXI in FIG. 28;
FIG. 32 is a sectional view along line XXXII-XXXII in FIG. 28;
FIG. 33 is a sectional view along line XXXIII-XXXIII in FIG. 28;
FIG. 34 is a plan view of an active area;
FIG. 35 is a plan view from the active area to a zeroth conductive layer;
FIG. 36 is a plan view from the zeroth conductive layer to a first conductive layer;
FIG. 37 is a plan view from the first conductive layer to a second conductive layer;
FIG. 38 is a circuit diagram showing a first modification of the second embodiment;
FIG. 41 is a circuit diagram showing a second modification of the second embodiment;
FIG. 42 is a plan view showing the second modification of the second embodiment;
FIG. 45 is a sectional view along line XLV-XLV in FIG. 42;
FIG. 46 is a sectional view along line XLVI-XLVI in FIG. 42.

FIG. 50 is a plan view from the zeroth conductive layer to a first conductive layer;

FIG. 51 is a plan view from the first conductive layer to a second conductive layer;

FIGS. 53 to 56 are cross-sectional views of the third modification of the second embodiment;

FIG. 57 is a circuit diagram showing a third embodiment;

FIG. 59 is a sectional view along line LIX-LIX in FIG. 58;

FIG. 60 is a sectional view along line LX-LX in FIG. 58;

FIG. 61 is a sectional view along line LXI-LXI in FIG. 58;

FIG. 62 is a sectional view along line LXII-LXII in FIG. 58;

FIG. 64 is a plan view from the active area to a zeroth conductive layer;

FIG. 66 is a plan view from the first conductive layer to a second conductive layer;

FIG. 70 is a sectional view taken alone line LXX-LXX in FIG. 68;

FIG. 71 is a sectional view along line LXXI-LXXI in FIG. 68;

FIGS. 77 to 80 are cross-sectional views of a second modification of the third embodiment;

FIG. 84 is a circuit diagram showing a third example of the read operation;

FIG. 85 is a circuit diagram showing a first example of a write operation;

FIG. 87 is a circuit diagram showing a third example of the write operation;

DETAILED DESCRIPTION

Figure 2:
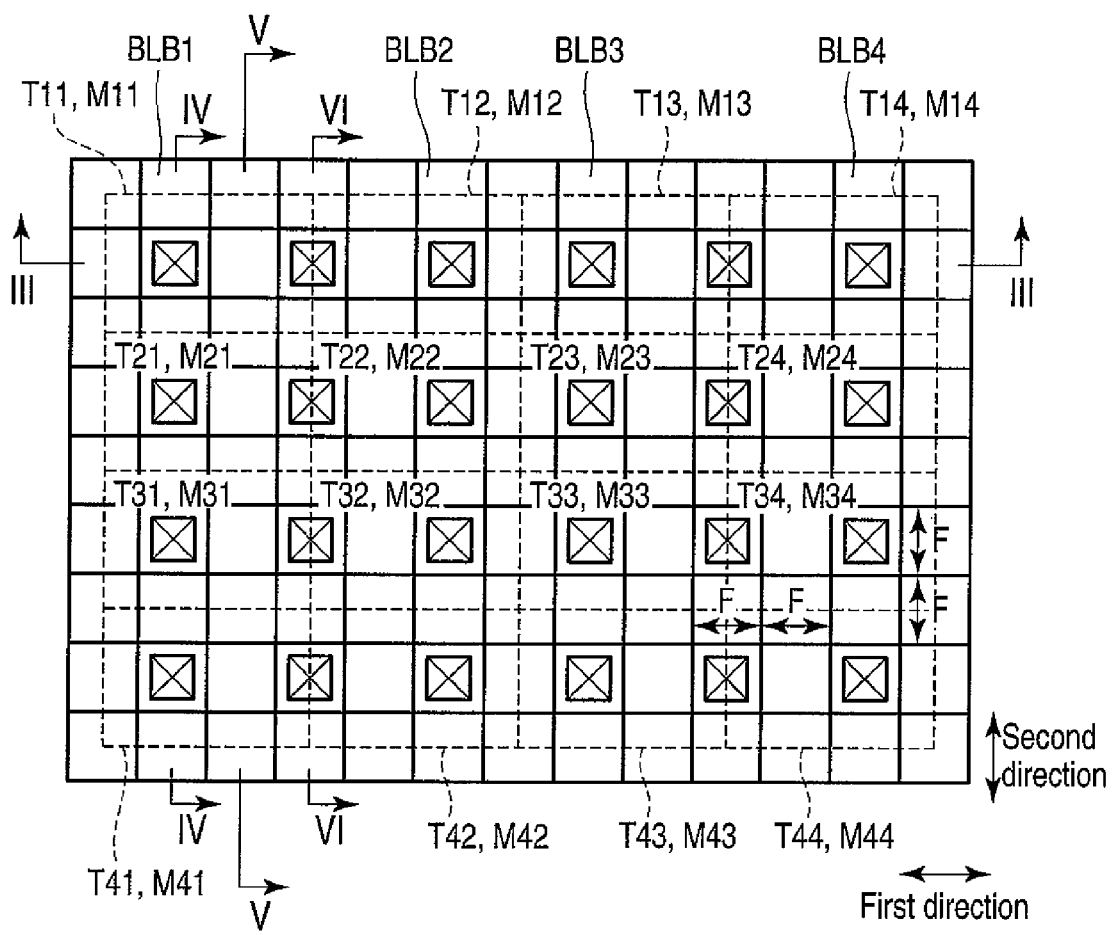
FIG. 2 is a plan view showing the first embodiment.

In general, according to one embodiment, a resistance-change semiconductor memory comprising first to fourth memory cells aligned in a first direction. Each of the first to fourth memory cells comprises a cell transistor having a gate connected to a word line extending in a second direction crossing the first direction and a resistive memory element having one end connected to a first source/drain region of the cell transistor. A second source/drain region of the cell transistor is connected to one of a first bit line extending in the first direction and a second bit line extending in the second direction. The other end of the resistive memory element is connected to one of the first and second bit lines which is not connected to the second source/drain region. The second source/drain regions in the first and second memory cells are shared, and the second source/drain regions in the third and fourth memory cells are shared. And the first and second memory cells are arranged in a first element region, and the third and fourth memory cells are arranged in a second element region different from the first element region.

1. Basic Structure

A memory cell array of a resistance-change semiconductor memory in this disclosure adopts a one-transistor/one-memory-element type or a two-transistor/one-memory-element type as its basis, it has a series connection body in which a resistive memory element as a memory element and a transistor are connected in series. Further, since a cross point type is combined with this structure, a first bit line connected to one end of the series connection body crosses a second bit line connected to the other end of the same.

According to the resistance-change semiconductor memory in this disclosure, it is possible to realize a memory cell which is smaller than a memory cell in a conventional memory cell array (one-transistor/one-memory-element type or two-transistor/one-memory-element type).

For example, the cell size of a one-transistor/one-memory-element memory cell in this disclosure is 6 $F^2$, and the cell size of a two-transistor/one-memory-element memory cell in this disclosure is 8 $F^2$. However, F means a half pitch (future size) of a line-and-space pattern having a minimum size.

According to the memory cell array in the resistance-change semiconductor memory in this disclosure, for example, reading/writing can be executed with respect to memory cells in one row of the memory cell array at the same time, and the memory cells in one row of the memory cell array can be all set to a first state (set/reset state) and then predetermined memory cells in the memory cells can be changed to a second state from the first state.

2. Embodiments (1) First Embodiment

A. Circuit Diagram

FIG. 1 shows a circuit diagram of a first embodiment.

A memory cell array 11 is of the one-transistor/one-memory-element type. First and second control circuits 12 and 13 control reading/writing with respect to a memory cell array 11.

This drawing shows 16 memory cells arranged in a 4×4 matrix. The area which is surrounded by the broken line corresponds to one memory cell.

First bit lines BLA1, BLA2, BLA3 and BLA4 extend in a first direction (e.g., the column direction), and second bit lines BLB1, BLB2, BLB3 and BLB4 extend in a second direction (e.g., the row direction) crossing the first direction.

Further, word lines WL1, WL2, WL3 and WL4 extend in the second direction.

A second source/drain region of each cell transistor (e.g., an N-channel MOSFET) Tij (i=1, 2, 3, 4; j=1, 2, 3, 4) is connected to the first bit line BLAi, and a first source/drain region of the cell transistor Tij is connected to the second bit line BLBj through a resistive memory element Mij.

A gate of the cell transistor Tij is connected to word line WLi.

The resistive memory element Mij includes a magnetoresistive element and a phase-change element. Furthermore, the resistive memory element Mij may be a metal oxide as a ReRAM memory element.

The second source/drain region of cell transistor Ti1 and the second source/drain region of cell transistor Ti2 are shared, and the second source/drain region of cell transistor Ti3 and the second source/drain region of cell transistor Ti4 are shared.

B. Device structure

Figure 5:
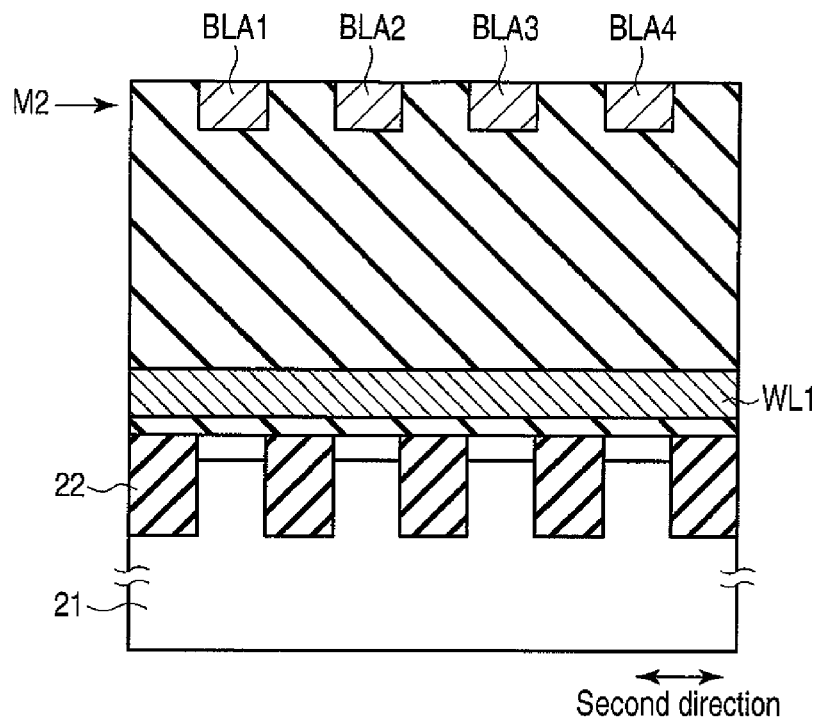
FIG. 5 is a sectional view along line V-V in FIG. 2.
Figure 6:
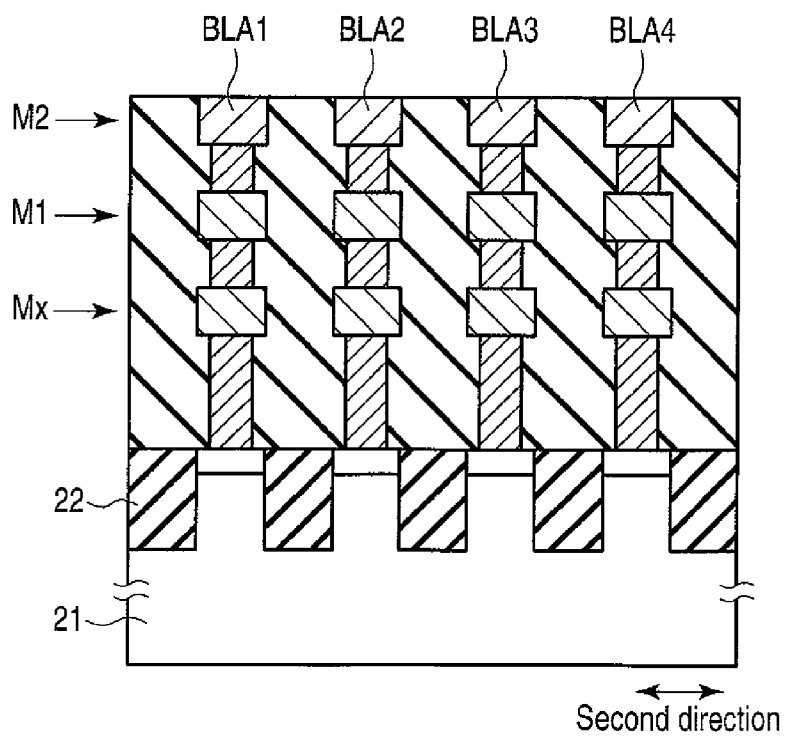
FIG. 6 is a sectional view along line VI-VI in FIG. 2.

FIG. 2 shows a device structure of the first embodiment. FIG. 3 is a sectional view along line III-III in FIG. 2, FIG. 4 is a sectional view along line IV-IV in FIG. 2, FIG. 5 is a sectional view along line V-V in FIG. 2, and FIG. 6 is a sectional view along line VI-VI in FIG. 2.

In these drawings, reference numbers identical to those in FIG. 1 denote elements corresponding to elements shown in FIG. 1. Moreover, in FIG. 2, F represents a half pitch (future size) of a line-and-space pattern having a minimum size.

In a semiconductor substrate 21, an element isolation insulating layer 22 having, e.g., a shallow trench isolation (STI) structure is formed. Two cell transistors Ti1 and Ti2 (i=1, 2, 3, 4) that are adjacent to each other in the first direction are arranged in a first element region (active area) surrounded by the element isolation insulating layer 22. Additionally, two cell transistors Ti3 and Ti4 that are adjacent to each other in the first direction are arranged in a second element region (active area) surrounded by the element isolation insulating layer 22.

The resistive memory element Mij (i=1, 2, 3, 4; j=1, 2, 3, 4) as a memory element is arranged immediately above the first source/drain region of the cell transistor Tij, and the second bit line BLBj is arranged immediately above the resistive memory element Mij.

The resistive memory element Mij is arranged above a zeroth conductive layer Mx on the semiconductor substrate 21. The second bit line BLBj is arranged in a first conductive layer M1 on the zeroth conductive layer Mx. The first bit line BLAi is arranged in a second conductive layer M2 on the first conductive layer M1.

C. Layout of Each Layer

FIG. 7 shows a layout from the active area AA to the zeroth conductive layer Mx.

Two cell transistors Ti1 and Ti2 (i=1, 2, 3, 4) are adjacent to each other in the first direction and arranged in the active area AA surrounded by the element isolation insulating layer 22. Further, two cell transistors Ti3 and Ti4 (i=1, 2, 3, 4) are adjacent to each other in the first direction and arranged in the active area AA surrounded by the element isolation insulating layer 22.

Word line WL1 extends in the second direction to be shared by cell transistors T11, T21, T31 and T41. Likewise, word line WL2 is shared by cell transistors T12, T22, T32 and T42, word line WL3 is shared by cell transistors T13, T23, T33 and T43, and word line WL4 is shared by cell transistors T14, T24, T34 and T44.

Figure 8:
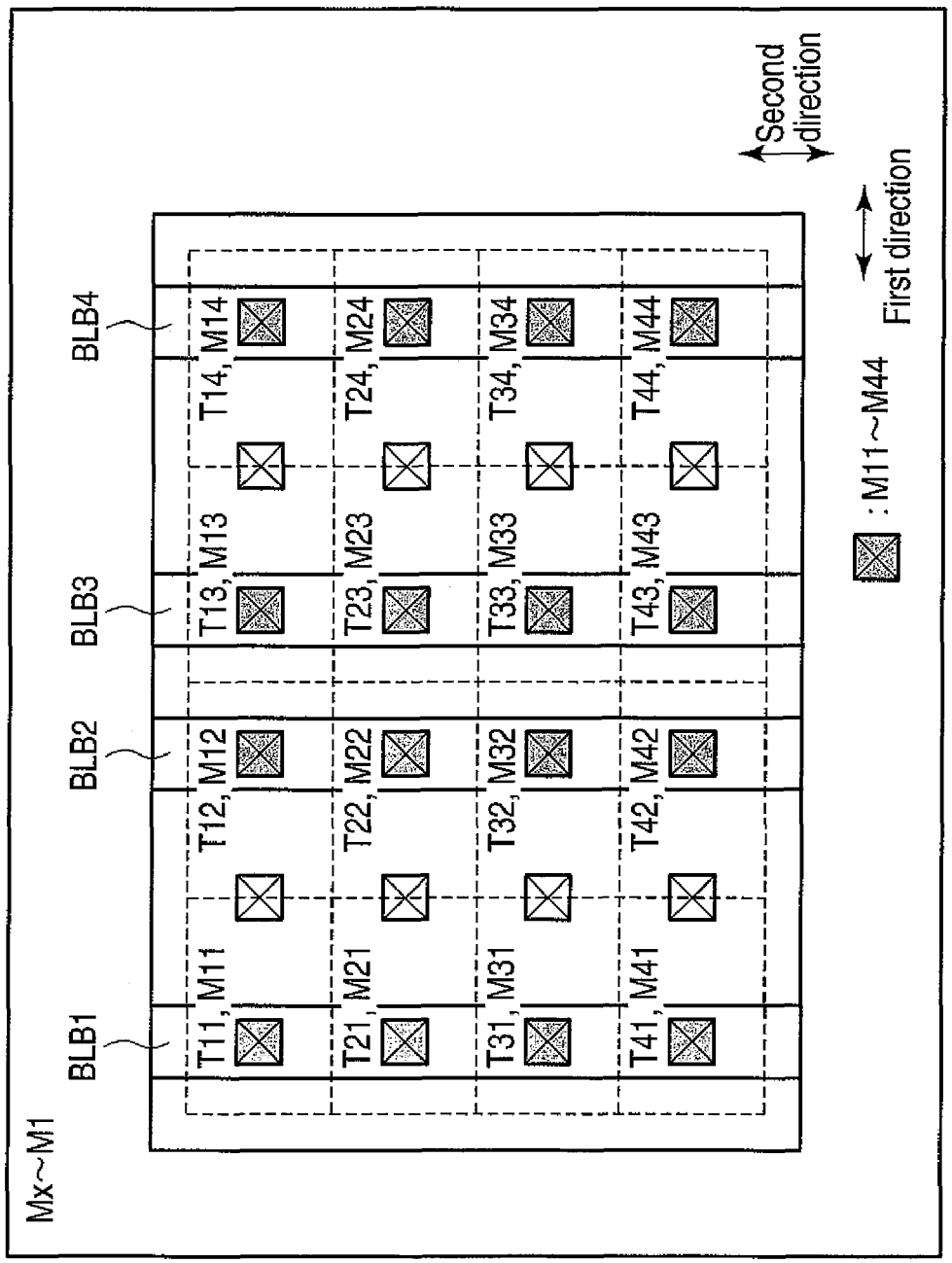
FIG. 8 is a plan view from the zeroth conductive layer to a first conductive layer.

FIG. 8 shows a layout from the zeroth conductive layer Mx to the first conductive layer M1.

The resistive memory element Mij (i=1, 2, 3, 4; j=1, 2, 3, 4) as a memory element is arranged immediately above the first source/drain region of the cell transistor Tij, and the second bit line BLBj is arranged immediately above the resistive memory element Mij.

Second bit line BLB1 extends in the second direction to be connected to resistive memory elements M11, M21, M31 and M41 in common. Likewise, second bit line BLB2 is connected to resistive memory elements M12, M22, M32 and M42 in common, second bit line BLB3 is connected to resistive memory elements M13, M23, M33 and M43 in common, and second bit line BLB4 is connected to resistive memory elements M14, M24, M34 and M44 in common.

Figure 9:
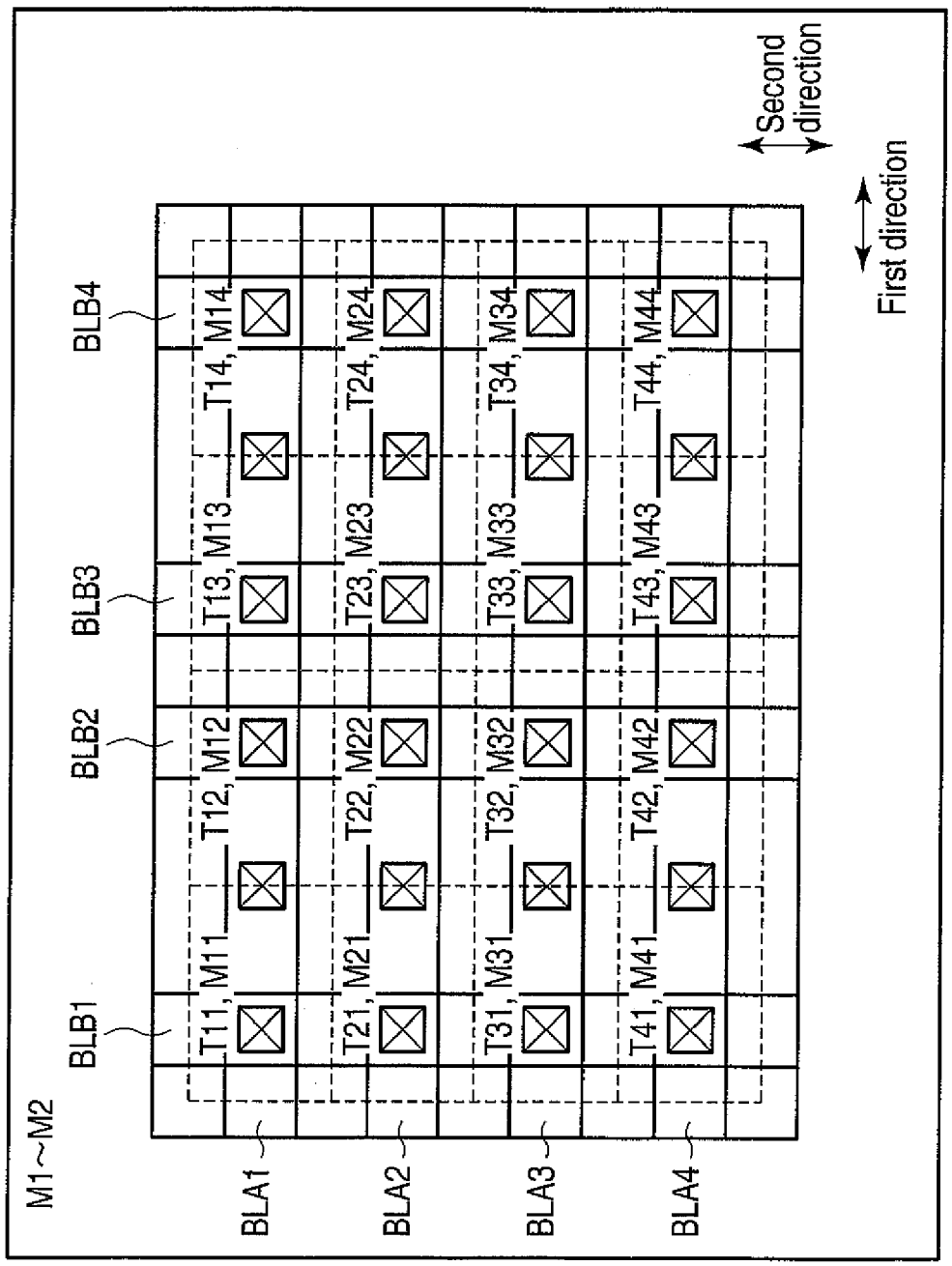
FIG. 9 is a plan view from the first conductive layer to a second conductive layer.

FIG. 9 shows a layout from the first conductive layer M1 to the second conductive layer M2. First bit lines BLA1, BLA2, BLA3 and BLA4 extend in the first direction to be arranged above second bit lines BLB1, BLB2, BLB3 and BLB4.

First bit line BLA1 is connected to cell transistors T11, T12, T13 and T14 in common. Likewise, first bit line BLA2 is connected to cell transistors T21, T22, T23 and T24 in common, first bit line BLA3 is connected to cell transistors T31, T32, T33 and T34 in common, and first bit line BLA4 is connected to cell transistors T41, T42, T43 and T44 in common.

D. Modifications

Figure 10:
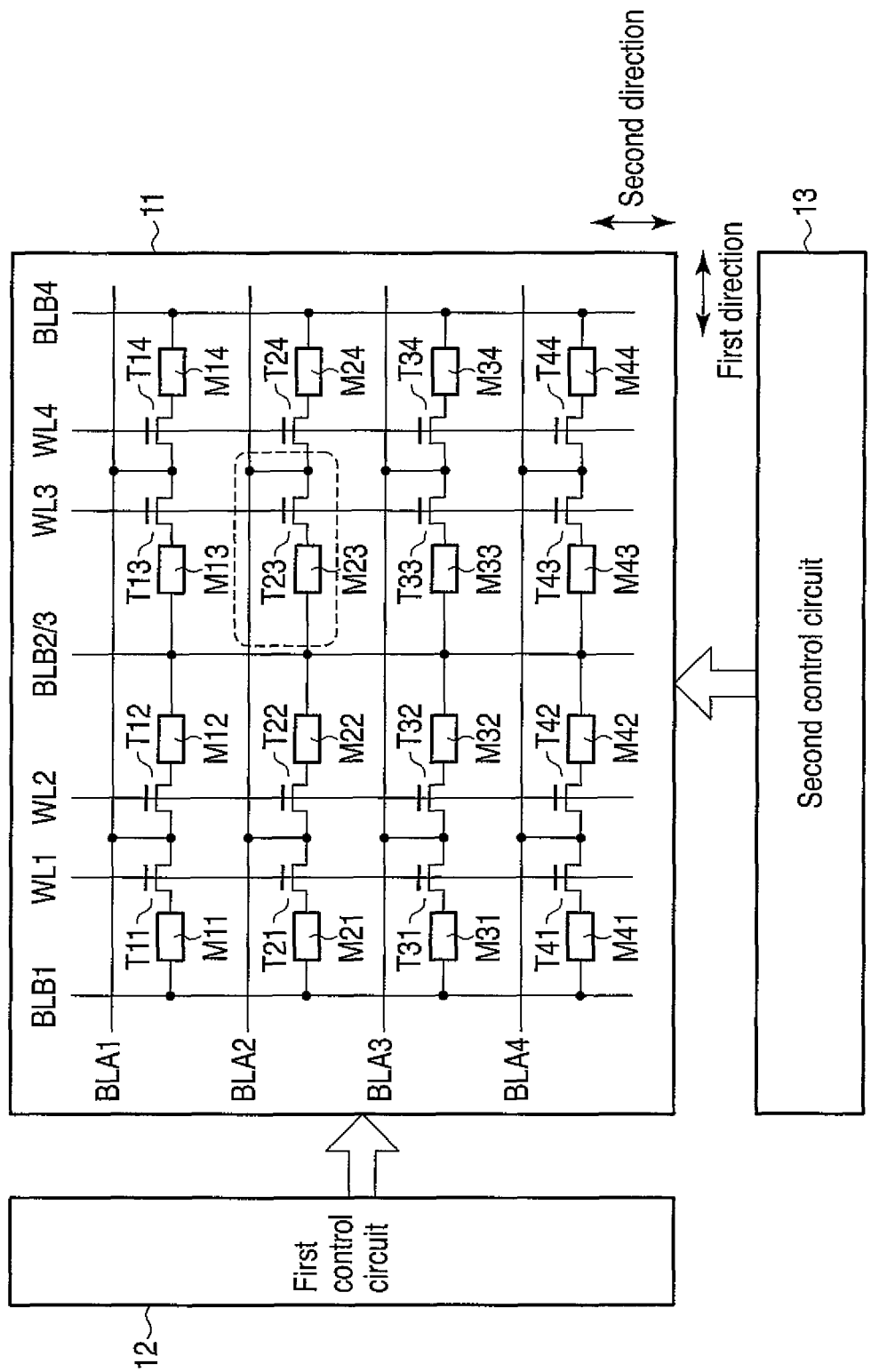
FIG. 10 is a circuit diagram showing a first modification of the first embodiment.
Figure 11:
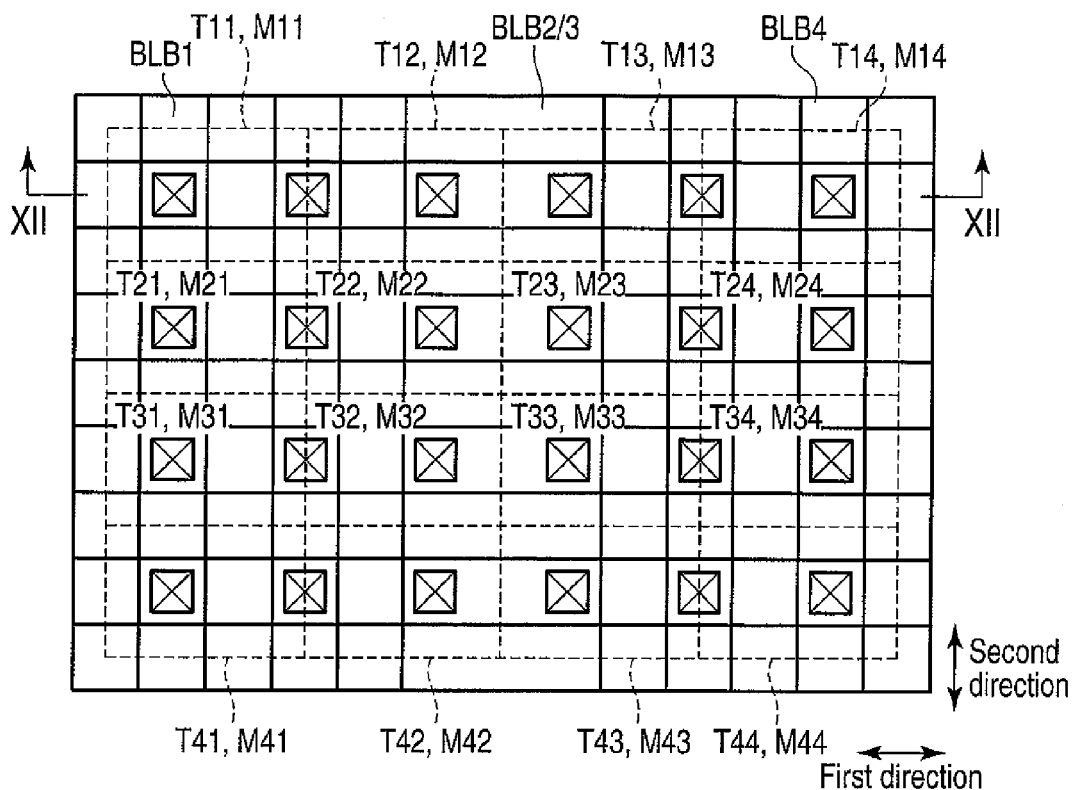
FIG. 11 is a plan view showing the first modification of the first embodiment.
Figure 12:
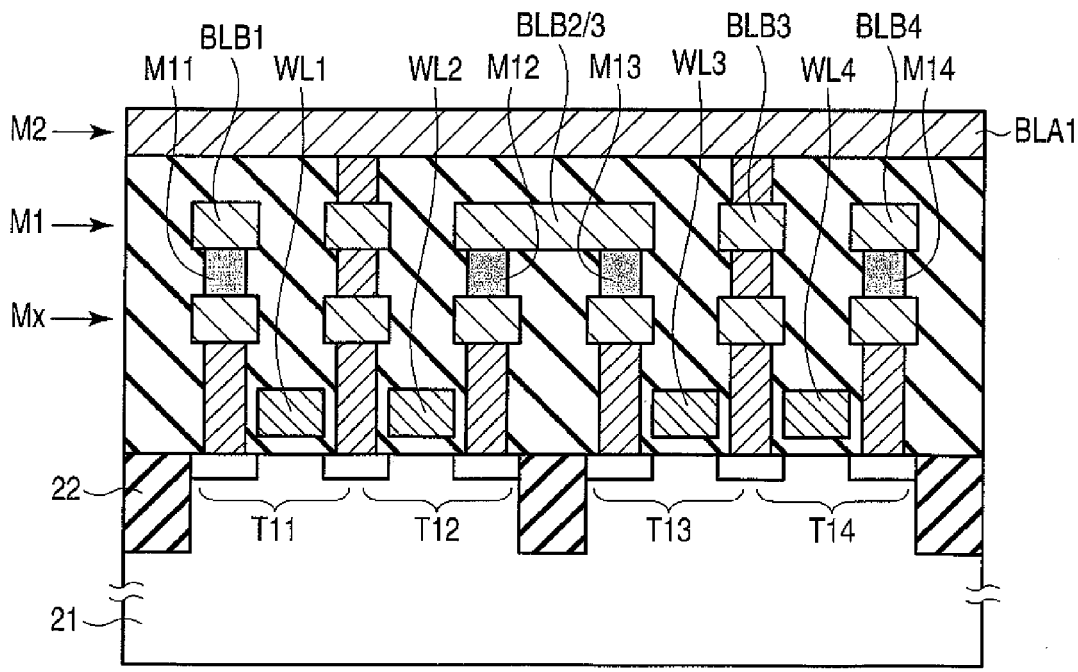
FIG. 12 is a sectional view along line XII-XII in FIG. 11.

FIGS. 10 to 12 show a first modification of the first embodiment.

FIG. 10 is a circuit diagram associated with FIG. 1. Furthermore, FIG. 11 is a plan view of a device structure associated with FIG. 2. FIG. 12 is a sectional view along line XII-XII in FIG. 11. In these drawings, reference numbers identical to those in FIG. 1 denote elements corresponding to the elements shown in FIG. 1.

This modification is different from the first embodiment in that the two second bit lines BLB2 and BLB3 that are adjacent to each other in the first direction and extend in the second direction are shared to provide a single second bit line BLB2/3. Other structures are the same as those in the first embodiment.

Therefore, second bit line BLB2/3 is connected to resistive memory elements M12, M22, M32, M42, M13, M23, M33 and M43 in common.

Moreover, the width of second bit line BLB2/3 in the first direction is approximately triple the width of each of second bit lines BLB2 and BLB3 in the first direction in FIG. 2.

Figure 13:
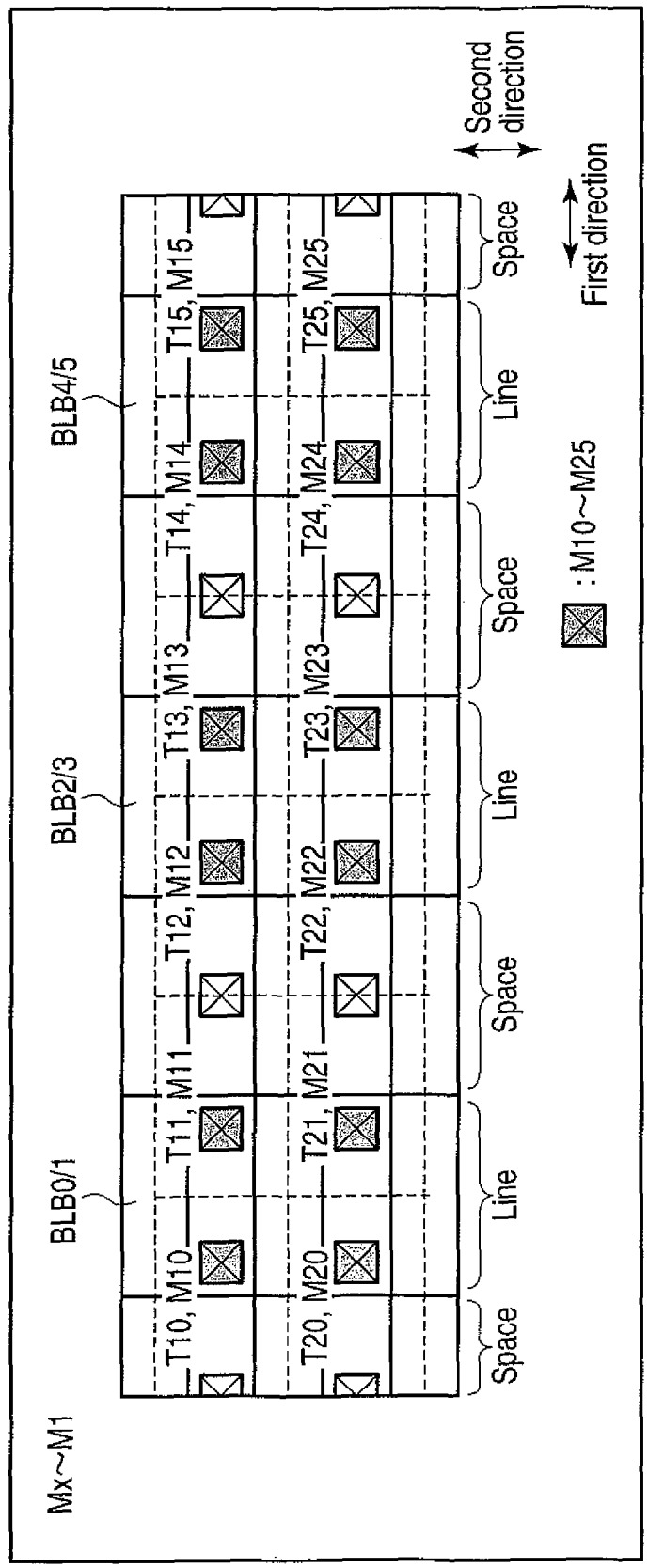
FIG. 13 is a plan view showing an effect of the first modification of the first embodiment.

Therefore, for example, as shown in FIG. 13, when two second bit lines BLB-even and BLB-odd (BLB-even is BLB0, BLB2, BLB4, . . . ; and BLB-odd is BLB1, BLB3, BLB5, . . . ) in the memory cell array are shared, the half pitch of the line-and-space pattern of second bit lines BLB0/1, BLB2/3, BLB4/5 becomes 3 F.

That is, according to this modification, a processing accuracy for second bit lines BLB0/1, BLB2/3 and BLB4/5 can be improved.

Figure 15:
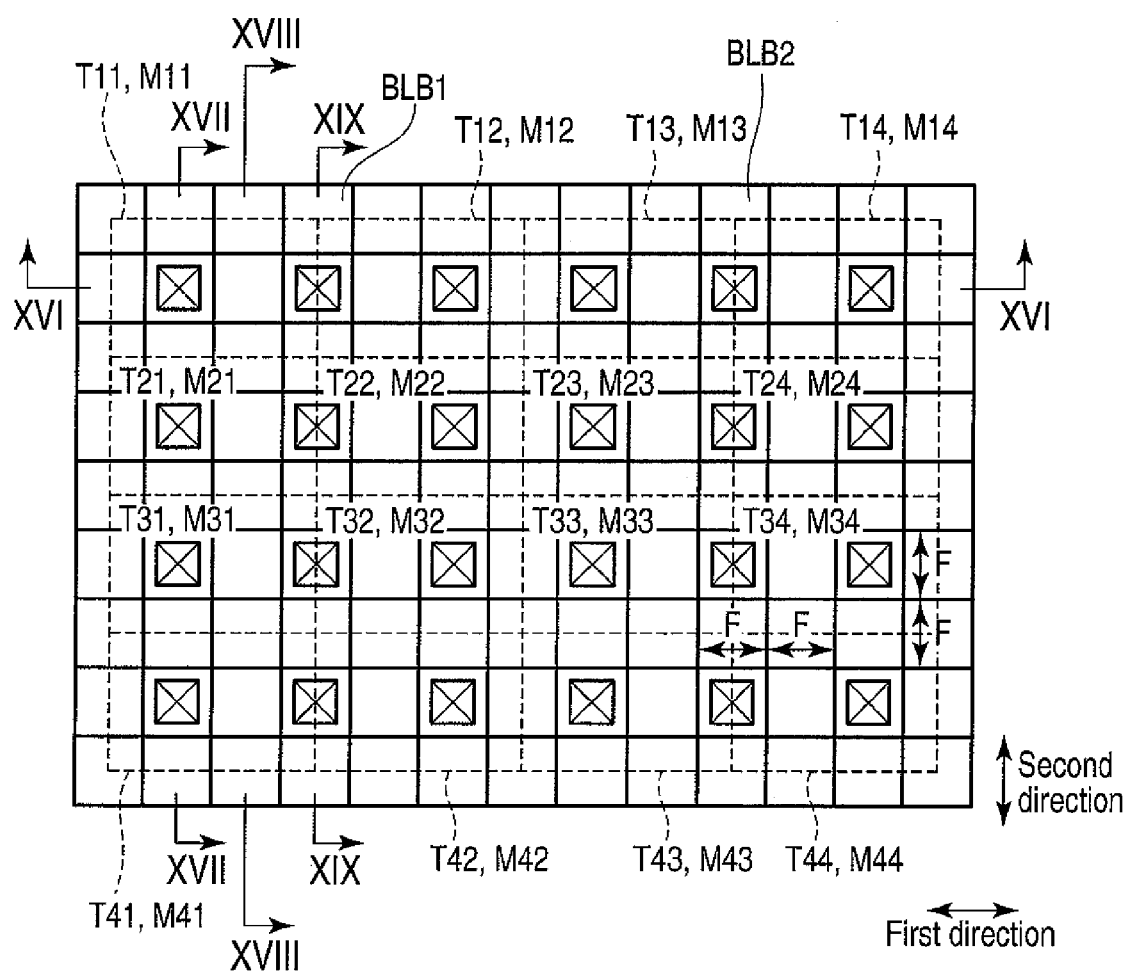
FIG. 15 is a plan view showing the second modification of the first embodiment.
Figure 16:
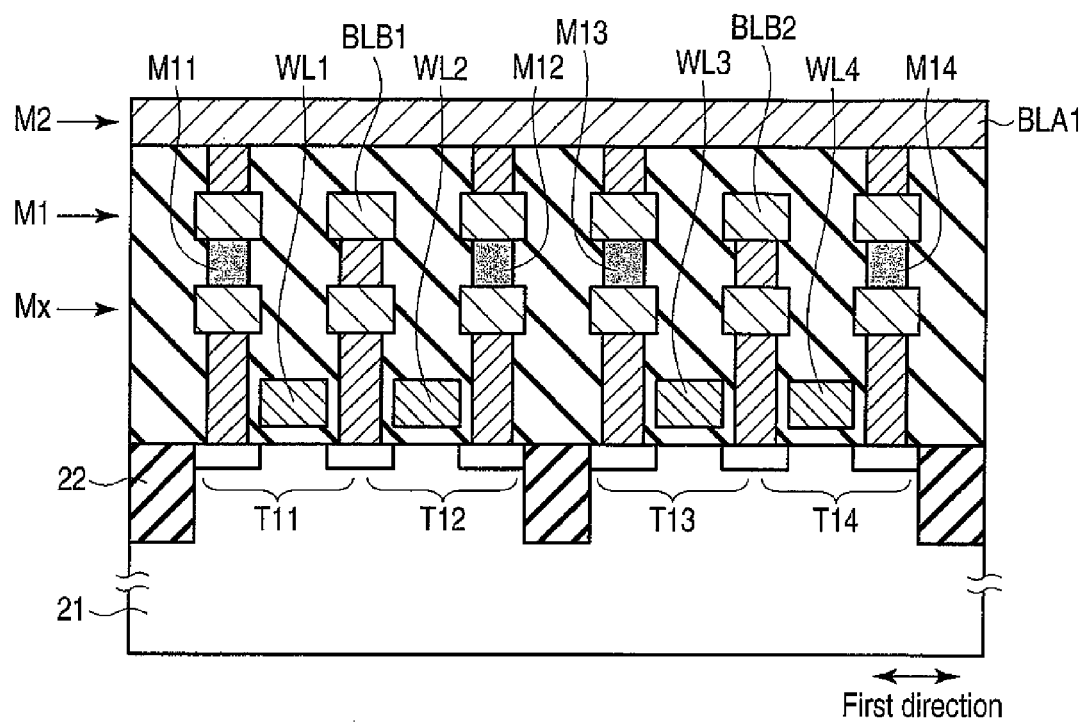
FIG. 16 is a sectional view along line XVI-XVI in FIG. 15.
Figure 17:
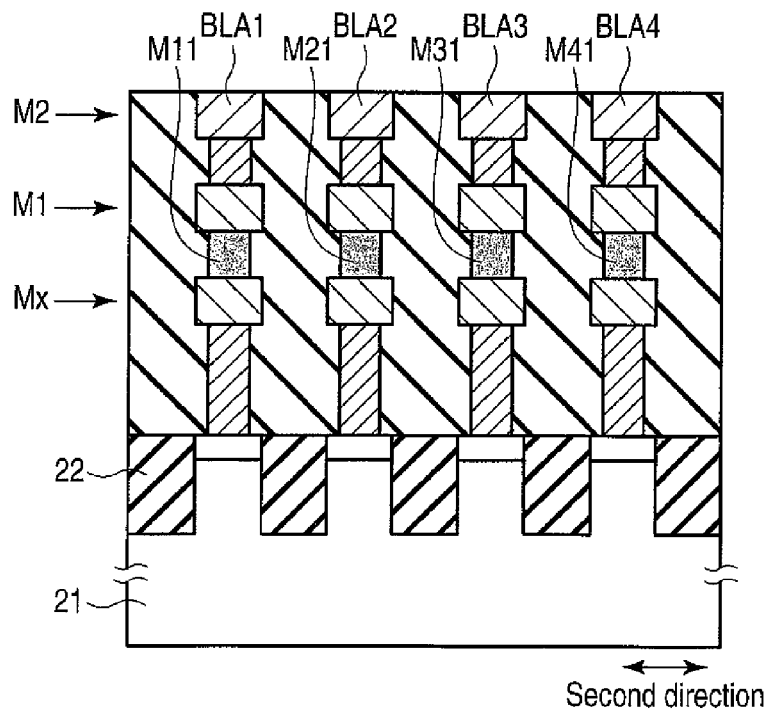
FIG. 17 is a sectional view along line XVII-XVII in FIG. 15.
Figure 18:
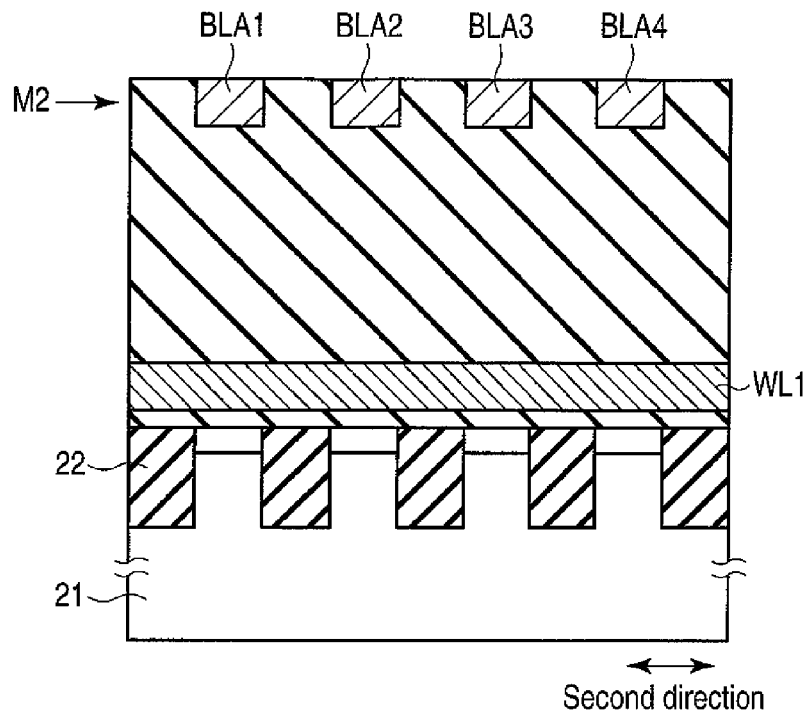
FIG. 18 is a sectional view along line XVIII-XVIII in FIG. 15.
Figure 19:
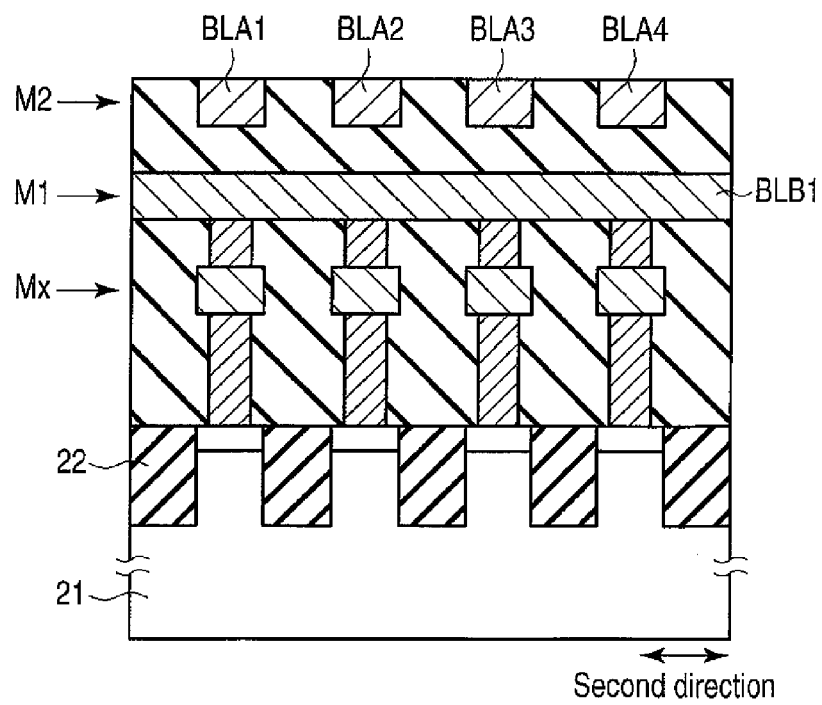
FIG. 19 is a sectional view along line XIX-XIX in FIG. 15.

FIG. 14 is a circuit diagram of a second modification of the first embodiment. FIG. 15 shows a device structure of the second modification of the first embodiment. FIG. 16 is a sectional view along line XVI-XVI in FIG. 15, FIG. 17 is a sectional view along line XVII-XVII in FIG. 15, FIG. 18 is a sectional view along line XVIII-XVIII in FIG. 15, and FIG. 19 is a sectional view along line XIX-XIX in FIG. 15.

In these drawings, reference numbers identical to those in FIGS. 1 to 6 denote elements corresponding to those in FIGS. 1 to 6, thereby omitting a detailed description thereof.

The second modification is different from the first embodiment in a connection relationship between the memory cells and first bit lines BLA1, BLA2, BLA3 and BLA4 and a connection relationship between the memory cells and second bit lines BLB1, BLB2, BLB3 and BLB4.

Specifically, the first source/drain region of the cell transistor Tij is connected to the first bit line BLAi through the resistive memory element Mij. Further, the second source/drain region of each of cell transistors Ti1 and Ti2 is connected to second bit line BLB1, and the second source/drain region of each of cell transistors Ti3 and Ti4 is connected to second bit line BLB2.

Figure 21:
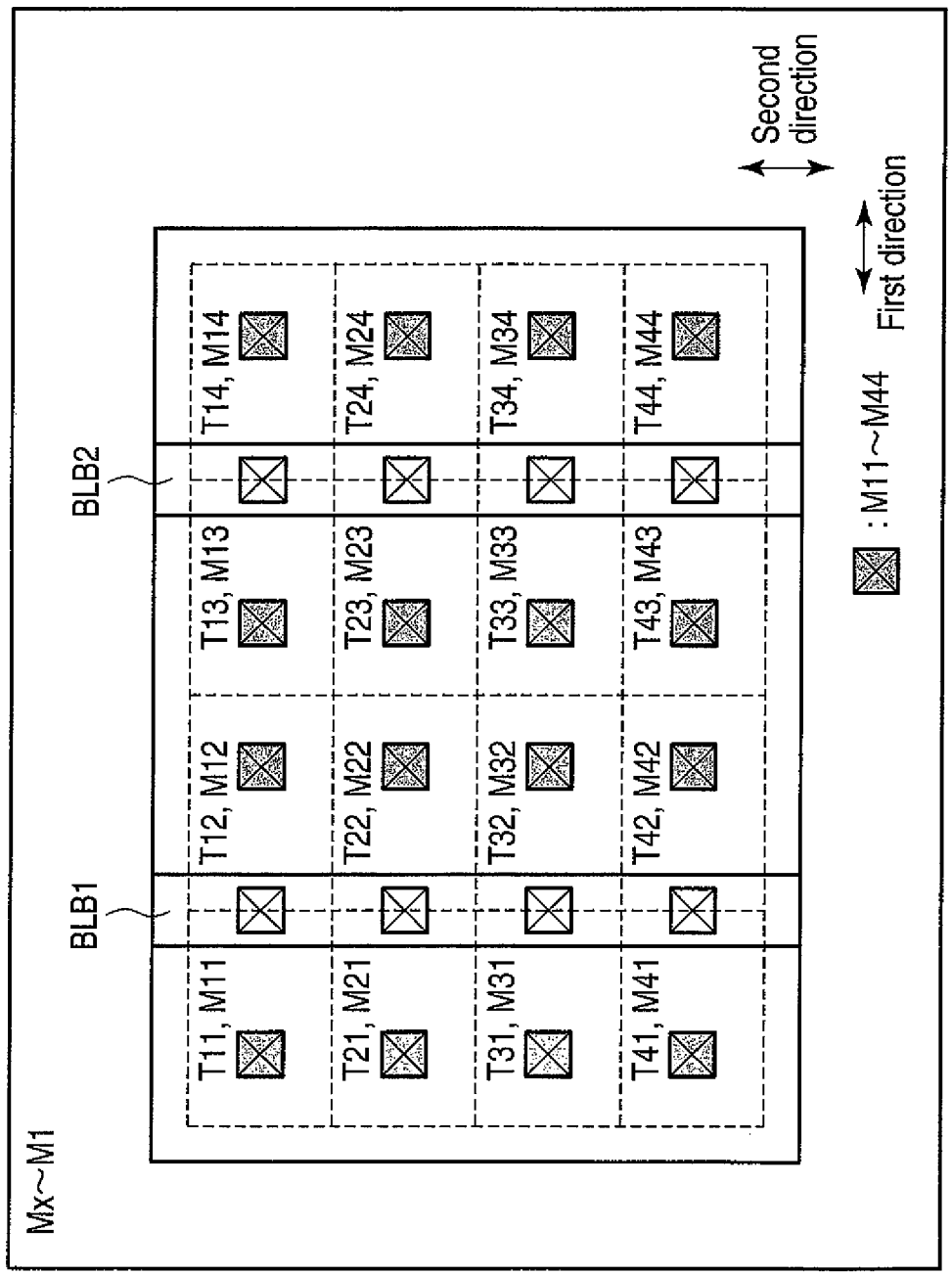
FIG. 21 is a plan view from the zeroth conductive layer to a first conductive layer.
Figure 22:
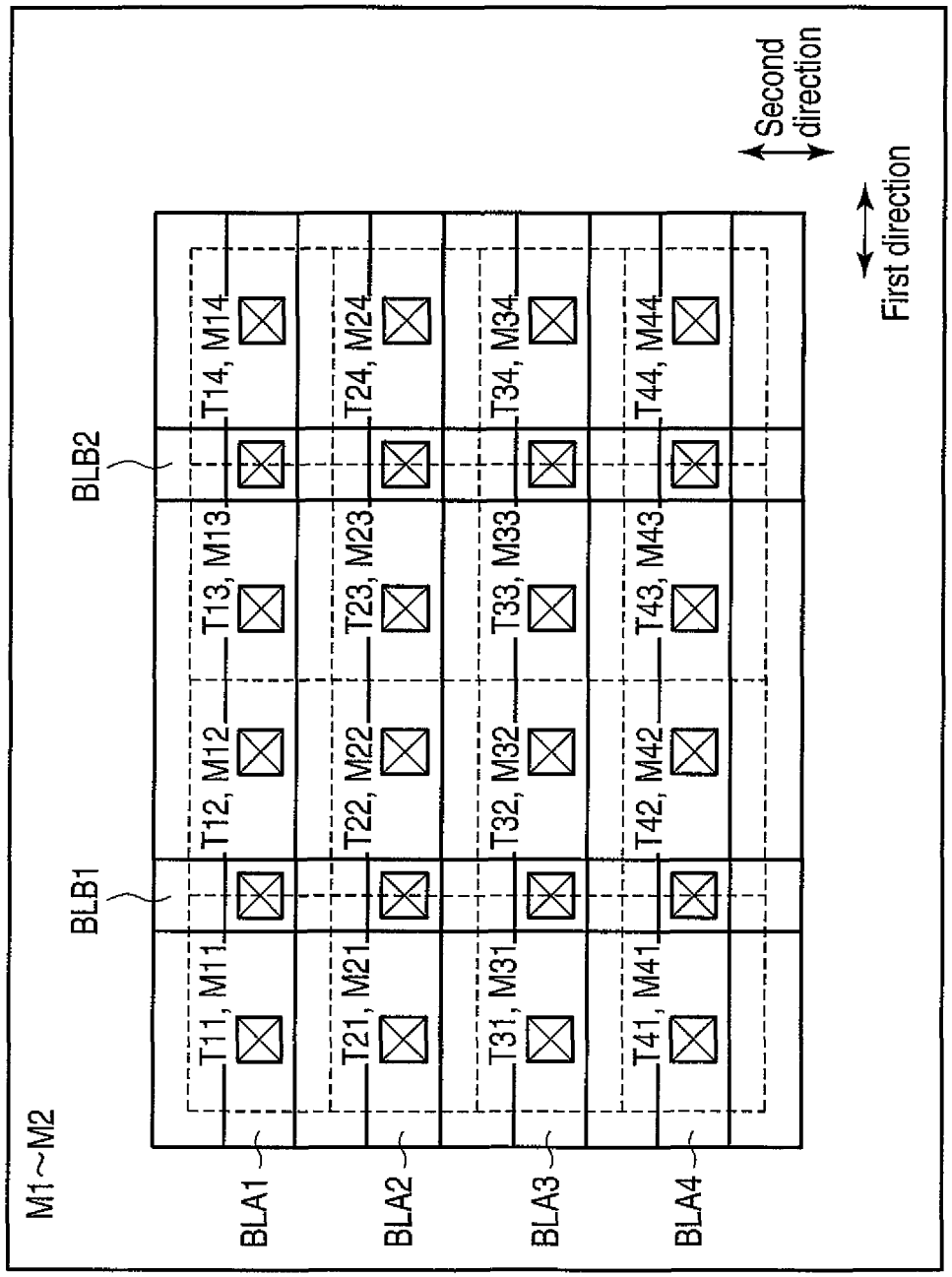
FIG. 22 is a plan view from the first conductive layer to a second conductive layer.

FIG. 20 shows a layout from the active area AA to the zeroth conductive layer Mx in the second modification, FIG. 21 shows a layout from the zeroth conductive layer Mx to the first conductive layer M1 in the second modification, and FIG. 22 shows a layout from the first conductive layer M1 to the second conductive layer M2 in the second modification.

FIGS. 23 to 26 are cross-sectional views of a third modification of the first embodiment.

Figure 23:
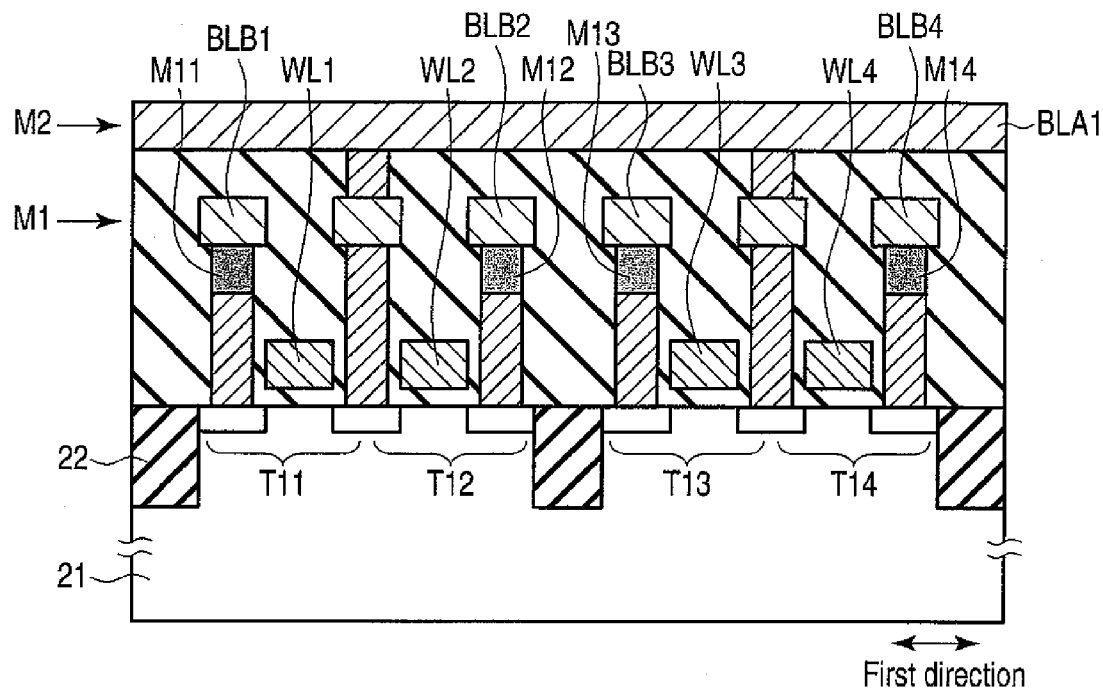
Figure 24:
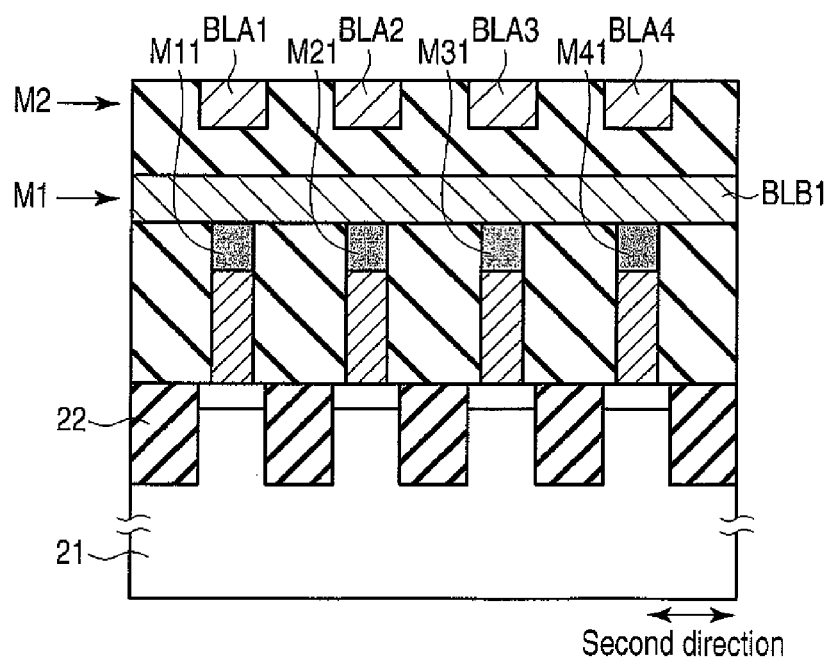

FIG. 23 corresponds to a sectional view along line III-III in FIG. 2 (modification of FIG. 3), FIG. 24 corresponds to a sectional view along line IV-IV in FIG. 2 (modification of FIG. 4), FIG. 25 corresponds to a sectional view along line V-V in FIG. 2 (modification of FIG. 5), and FIG. 26 corresponds to a sectional view along line VI-VI in FIG. 2 (modification of FIG. 6).

The third modification is different from the first embodiment in that the zeroth conductive layer Mx in FIGS. 3 to 6 is not present. That is, in the third modification, the resistive memory element Mij is arranged immediately above a contact plug to be in contact therewith.

E. Conclusion

According to the first embodiment and the modifications thereof, the new memory cell array layout which is a combination of the one-transistor/one-memory-element type and the cross point type can reduce the cell area (cell size 6 $F^2$) and improve operating characteristics.

(2) Second Embodiment

A. Circuit Diagram

FIG. 27 shows a circuit diagram of a second embodiment.

As compared with the first embodiment, the second embodiment is characterized in that an active area in a memory cell array has a line-and-space pattern. As a result, a processing accuracy for the active area is improved, whereby unevenness in size of cell transistors can be reduced as compared with an island-shaped active area in the first embodiment.

A memory cell array 11 is of the one-transistor/one-memory-element type. First and second control circuits 12 and 13 control reading/writing with respect to the memory cell array 11.

This drawing shows 16 memory cells arranged in a 4×4 matrix. The area which is surrounded by the broken line corresponds to one memory cell.

First bit lines BLA1, BLA2, BLA3 and BLA4 extend in a first direction (e.g., the column direction), and second bit lines BLB1, BLB2, BLB3 and BLB4 extend in a second direction (e.g., the row direction) crossing the first direction. Furthermore, word lines WL1, WL2, WL3 and WL4 extend in the second direction.

A second source/drain region of a cell transistor (e.g., an N-channel MOSFET) Tij (i=1, 2, 3, 4; j=1, 2, 3, 4) is connected to the first bit line BLAi, and a first source/drain region of the cell transistor Tij is connected to the second bit line BLBj through a resistive memory element Mij.

A gate of the cell transistor Tij is connected to word line WLi.

The resistive memory element Mij includes a magnetoresistive element and a phase-change element. Furthermore, the resistive memory element Mij may be a metal oxide as a ReRAM memory element.

The second source/drain region of cell transistor Ti1 and the second source/drain region of cell transistor Ti2 are shared, and the second source/drain region of cell transistor Ti3 and the second source/drain region of cell transistor Ti4 are shared.

A cell isolation transistor Iso is connected to a portion between the first source/drain region of cell transistor Ti2 and the first source/drain region of cell transistor Ti3. The cell isolation transistor Iso has a function of electrically separating an even-numbered cell transistor (e.g., Ti2) from an odd-numbered cell transistor (e.g., Ti3) in one active area.

A gate of the cell isolation transistor Iso is connected to an isolation control line Lϕ. The isolation control line Lϕ extends in the second direction like word lines WL1, WL2, WL3 and WL4.

The cell isolation transistor Iso is off at the time of reading/writing. The potential that turns off the cell isolation transistor Iso is applied to the isolation control line Lϕ at the time reading/writing, and it is less than or equal to the potential that turns off the cell transistor Tij, for example.

B. Device Structure

Figure 28:
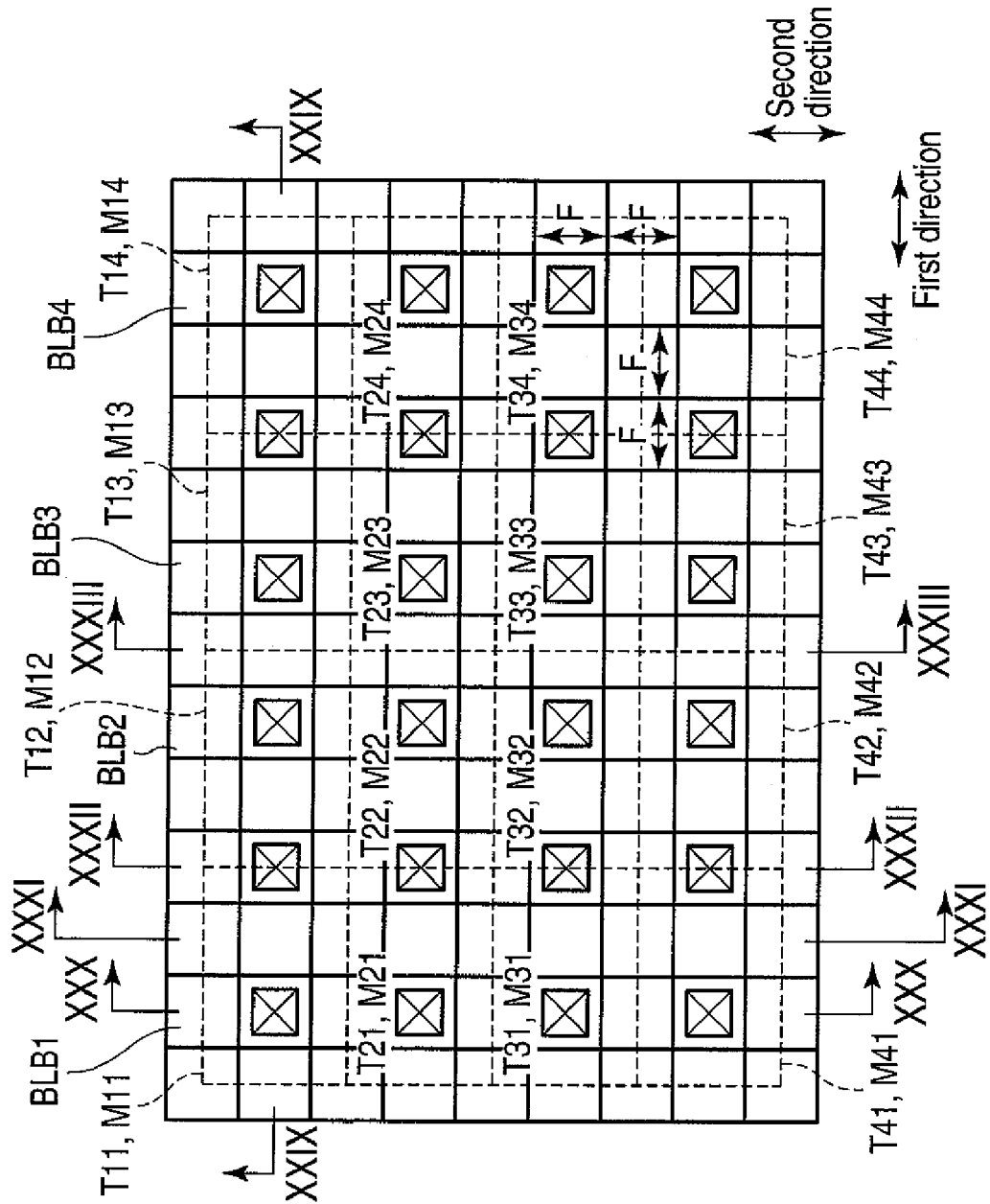
FIG. 28 is a plan view showing the second embodiment.
Figure 29:
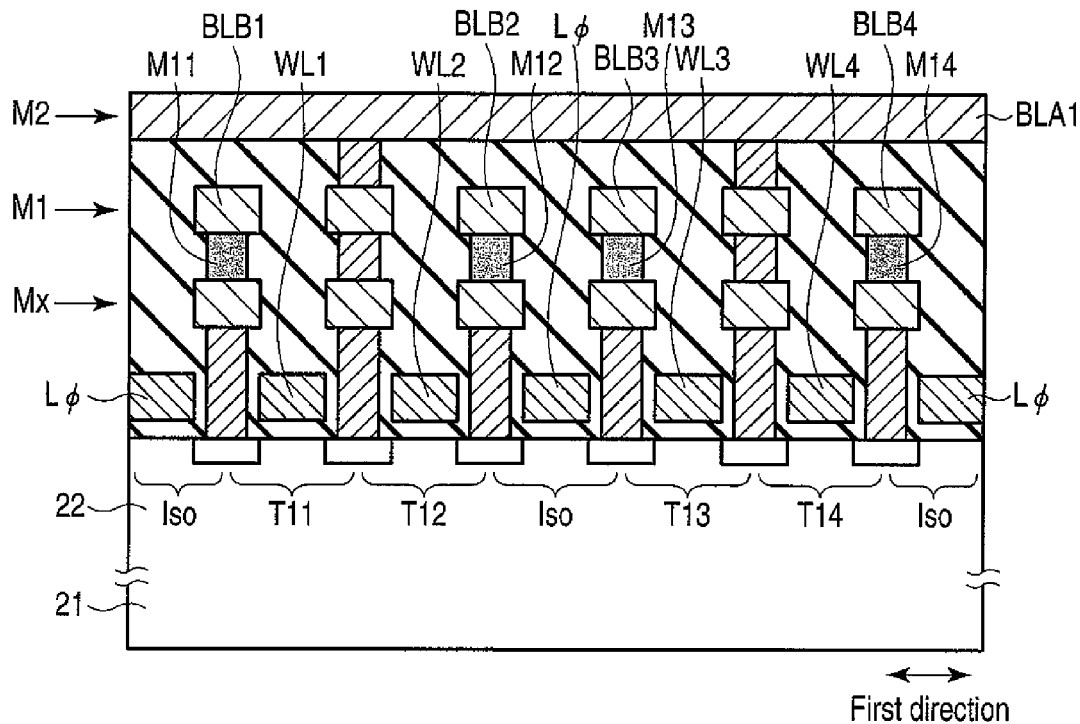
FIG. 29 is a sectional view along line XXIX-XXIX in FIG. 28.
Figure 30:
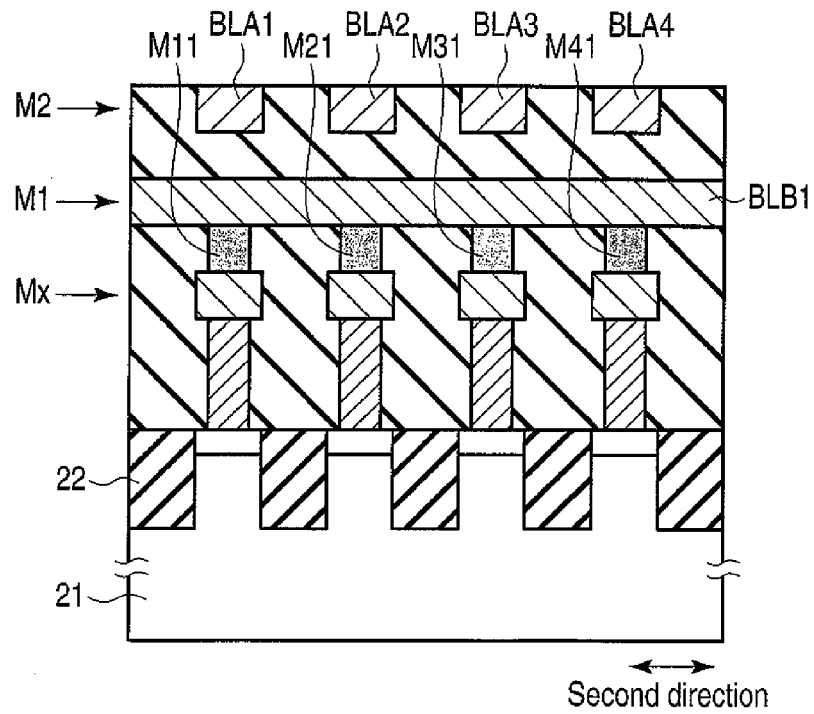
FIG. 30 is a sectional view along line XXX-XXX in FIG. 28.

FIG. 28 shows a device structure of the second embodiment. FIG. 29 is a sectional view along line XXIX-XXIX in FIG. 28, FIG. 30 is a sectional view along line XXX-XXX in FIG. 28, FIG. 31 is a sectional view along line XXXI-XXXI in FIG. 28, FIG. 32 is a sectional view along line XXXII-XXXII in FIG. 28, and FIG. 33 is a sectional view along line XXIII-XXIII in FIG. 28.

In these drawings, reference numbers identical to those in FIG. 27 denote elements corresponding to those shown in FIG. 27. Moreover, in FIG. 28, F represents a half pitch (future size) of a line-and-space pattern (corresponding to an active area) having a minimum size.

In a semiconductor substrate 21, for example, an element isolation insulating layer 22 having an STI structure is formed. Cell transistors Ti1, Ti2, Ti3 and Ti4 (i=1, 2, 3, 4) aligned in the first direction are arranged in an element region (active area) common to these transistors. Additionally, the cell isolation transistor Iso electrically separates an even-numbered cell transistor (e.g., Ti2) from an odd-numbered cell transistor (e.g., Ti3) in one active area.

The resistive memory element Mij (i=1, 2, 3, 4; j=1, 2, 3, 4) as a memory element is arranged immediately above the first source/drain region of the cell transistor Tij, and the second bit line BLBj is arranged immediately above the resistive memory element Mij.

The resistive memory element Mij is arranged on a zeroth conductive layer Mx above the semiconductor substrate 21. The second bit line BLBj is arranged in a first conductive layer M1 above the zeroth conductive layer Mx. The first bit line BLAi is arranged in a second conductive layer M2 above the first conductive layer M1.

C. Layout of Each Layer

FIG. 34 shows a layout of an active area AA. The active area AA has a line-and-space pattern in which lines and spaces extend in the first direction and are aligned in the second direction. A half pitch of this line-and-space pattern is F.

FIG. 35 shows a layout from the active area AA to the zeroth conductive layer Mx.

Cell transistors Ti1, Ti2, Ti3 and Ti4 (i=1, 2, 3, 4) aligned in the first direction are arranged in the active area AA common to these transistors. Further, the cell isolation transistor Iso electrically separates an even-numbered cell transistor (e.g., Ti2) from an odd-numbered cell transistor (e.g., Ti3) in one active area AA.

Word line WL1 extends in the second direction to be shared by cell transistors T11, T21, T31 and T41. Likewise, word line WL2 is shared by cell transistors T12, T22, T32 and T42, word line WL3 is shared by cell transistors T13, T23, T33 and T43, and word line WL4 is shared by cell transistors T14, T24, T34 and T44.

The isolation control line Lϕ extends in the second direction to be shared by the cell isolation transistors Iso aligned in the second direction.

FIG. 36 shows a layout from the zeroth conductive layer Mx to the first conductive layer M1.

The resistive memory element Mij (i=1, 2, 3, 4; j=1, 2, 3, 4) as a memory element is arranged immediately above the first source/drain region of the cell transistor Tij, and the second bit line BLBj is arranged immediately above the resistive memory element Mij.

Second bit line BLB1 extends in the second direction to be connected to resistive memory elements M11, M21, M31 and M41 in common. Likewise, second bit line BLB2 is connected to resistive memory elements M12, M22, M32 and M42 in common, second bit line BLB3 is connected to resistive memory elements M13, M23, M33 and M43 in common, and second bit line BLB4 is connected to resistive memory elements M14, M24, M34 and M44 in common.

FIG. 37 shows a layout from the first conductive layer M1 to the second conductive layer M2.

First bit lines BLA1, BLA2, BLA3 and BLA4 extend in the first direction and arranged above second bit lines BLB1, BLB2, BLB3 and BLB4.

First bit line BLA1 is connected to cell transistors T11, T12, T13 and T14 in common. Likewise, first bit line BLA2 is connected to cell transistors T21, T22, T23 and T24 in common, first bit line BLA3 is connected to cell transistors T31, T32, T33 and T34 in common, and first bit line BLA4 is connected to cell transistors T41, T42, T43 and T44 in common.

D. Modification

Figure 39:
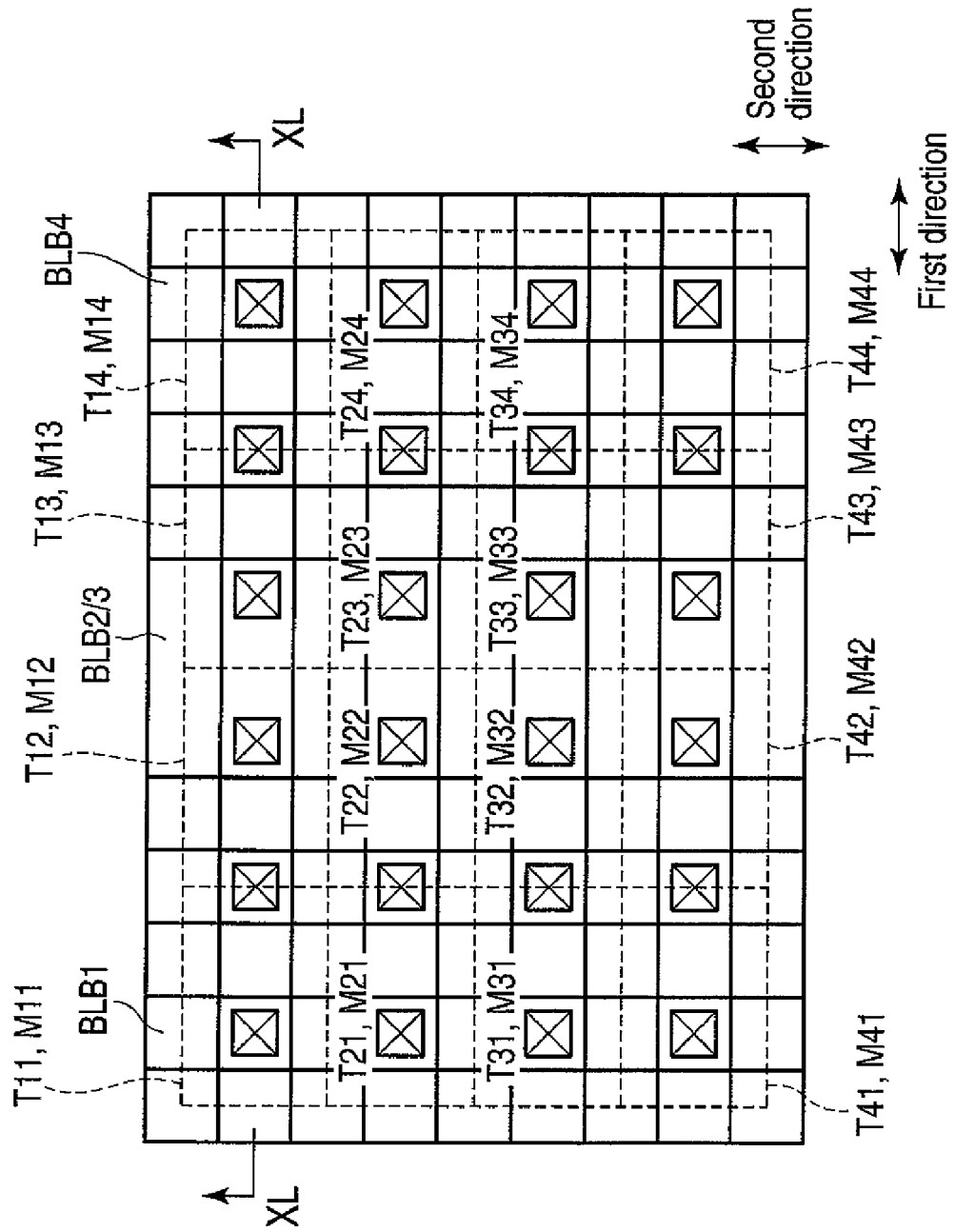
FIG. 39 is a plan view showing the first modification of the second embodiment.
Figure 40:
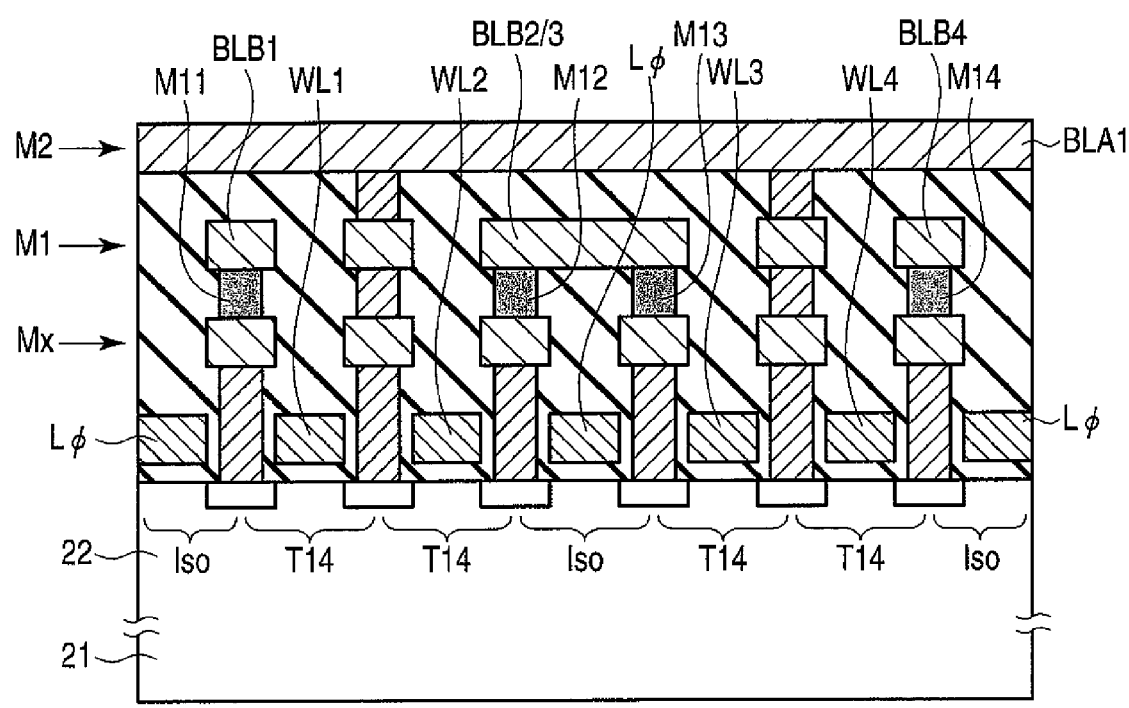
FIG. 40 is a sectional view along line XL-XL in FIG. 39.

FIGS. 38 to 40 show a first modification of the second embodiment.

FIG. 38 is a circuit diagram associated with FIG. 27. Furthermore, FIG. 39 is a plan view of a device structure associated with FIG. 28, and FIG. 40 is a sectional view along line XL-XL in FIG. 39. In these drawings, reference numbers identical to those in FIG. 27 denote elements corresponding to those shown in FIG. 27.

This first modification is different from the second embodiment in that the two second bit lines BLB2 and BLB3 that are adjacent to each other in the first direction and extend in the second direction are shared to provide a single second bit line BLB2/3. Other structures are identical to those in the second embodiment.

Therefore, second bit line BLB2/3 is connected to resistive memory elements M12, M22, M32, M42, M13, M23, M33 and M43 in common.

Furthermore, the width of second bit line BLB2/3 in the first direction is approximately triple the width of each of second bit lines BLB2 and BLB3 in the first direction shown in FIG. 28.

Therefore, for example, as shown in FIG. 13, when the two second bit lines BLB-even and BLB-odd (BLB-even is BLB0, BLB2, BLB4, . . . ; BLB-odd is BLB1, BLB3, BLB5, . . . ) in the memory cell array are shared, the half pitch of the line-and-space pattern of second bit lines BLB0/1, BLB2/3, BLB4/5 becomes 3 F.

Figure 43:
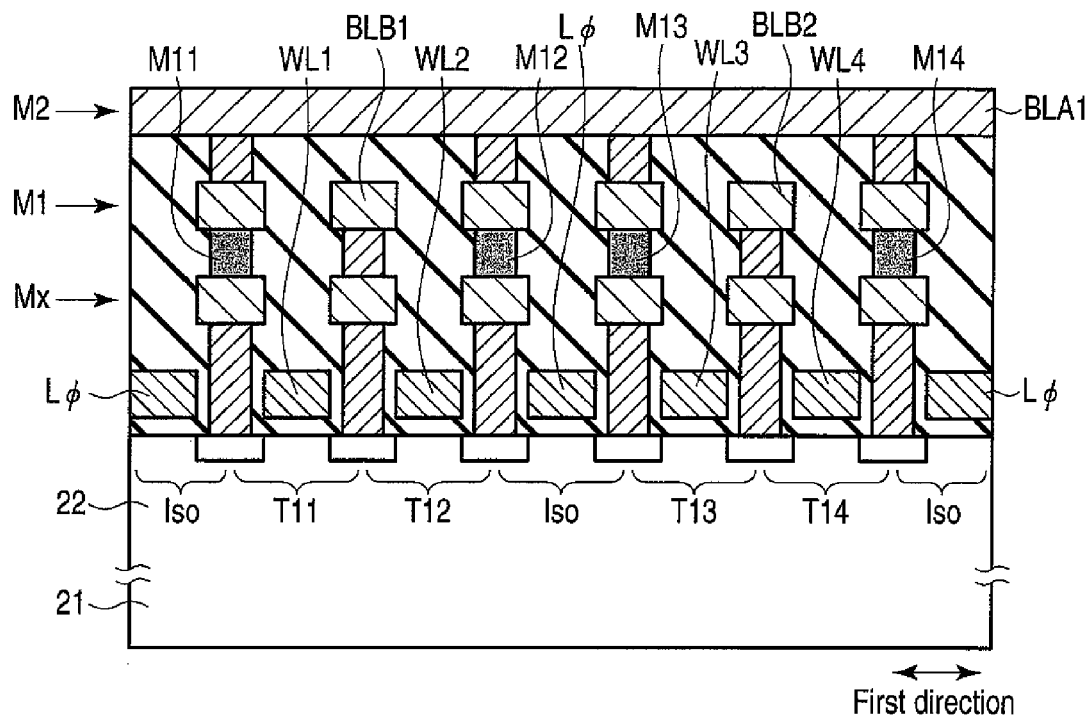
FIG. 43 is a sectional view along line XLIII-XLIII in FIG. 42.
Figure 44:
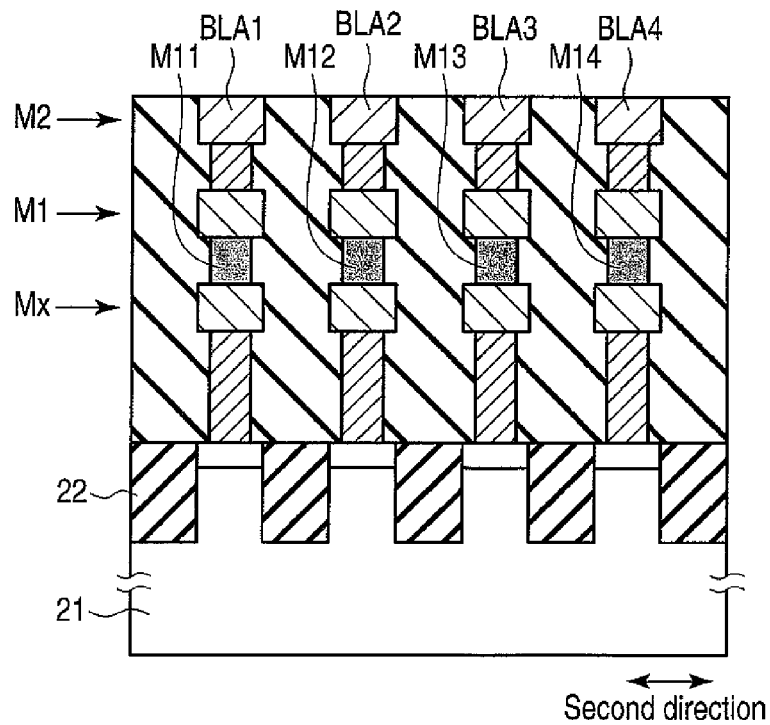
FIG. 44 is a sectional view along line XLIV-XLIV in FIG. 42.
Figure 47:
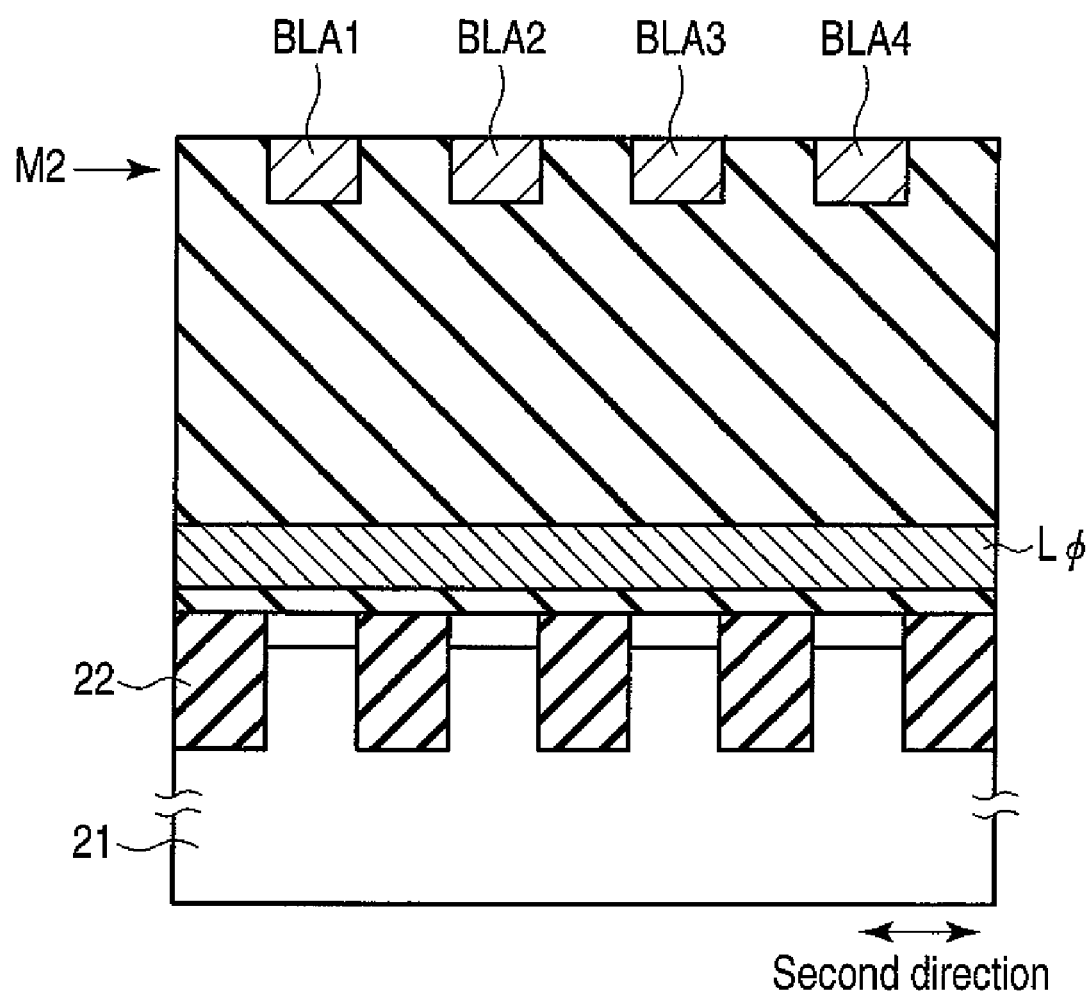
FIG. 47 is a sectional view along line XLVII-XLVII in FIG. 42.

That is, according to this first modification, a processing accuracy for second bit lines BLB0/1, BLB2/3 and BLB4/5 can be improved. FIG. 41 shows a circuit diagram of a second modification of the second embodiment. FIG. 42 shows a device structure of the second modification of the second embodiment. FIG. 43 is a sectional view along line XLIII-XLIII in FIG. 42, FIG. 44 is a sectional view along line XLIV-XLIV in FIG. 42, FIG. 45 is a sectional view along line XLV-XLV in FIG. 42, FIG. 46 is a sectional view along line XLVI-XLVI in FIG. 42, and FIG. 47 is a sectional view along line XLVII-XLVII in FIG. 42.

In these drawings, reference numbers identical to those in FIGS. 27 to 33 denote elements corresponding to those shown in FIGS. 27 to 33, thereby omitting a detailed description thereof.

This second modification is different from the second embodiment in a connection relationship between the memory cells and first bit lines BLA1, BLA2, BLA3 and BLA4 and a connection relationship between the memory cells and second bit lines BLB1, BLB2, BLB3 and BLB4.

Specifically, the first source/drain region of the cell transistor Tij is connected to the first bit line BLAi through the resistive memory element Mij. Further, the second source/drain region of each of cell transistors Ti1 and Ti2 is connected to second bit line BLB1, and the second source/drain region of each of cell transistors Ti3 and Ti4 is connected to second bit line BLB2.

Figure 48:
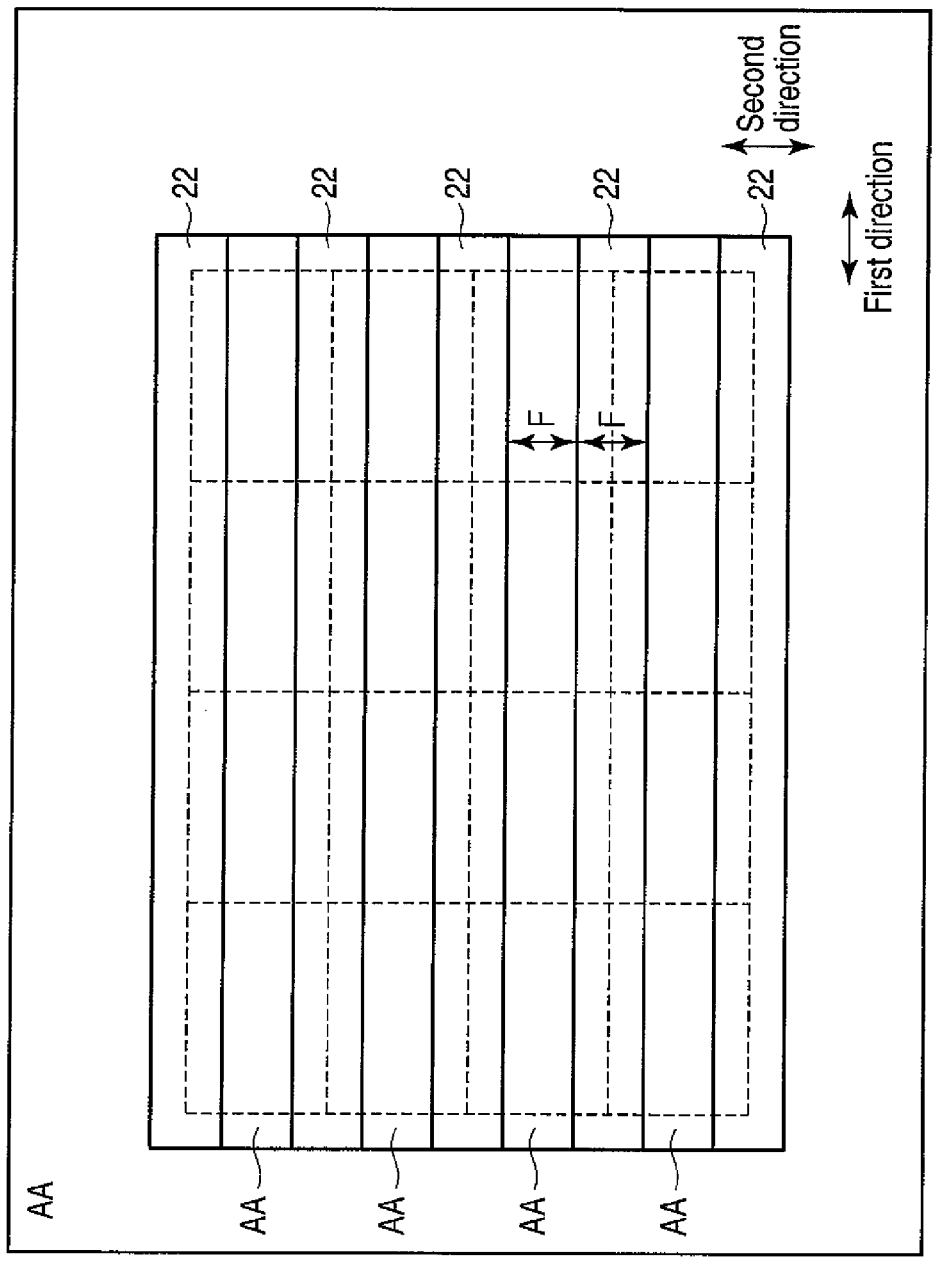
FIG. 48 is a plan view of an active area.
Figure 49:
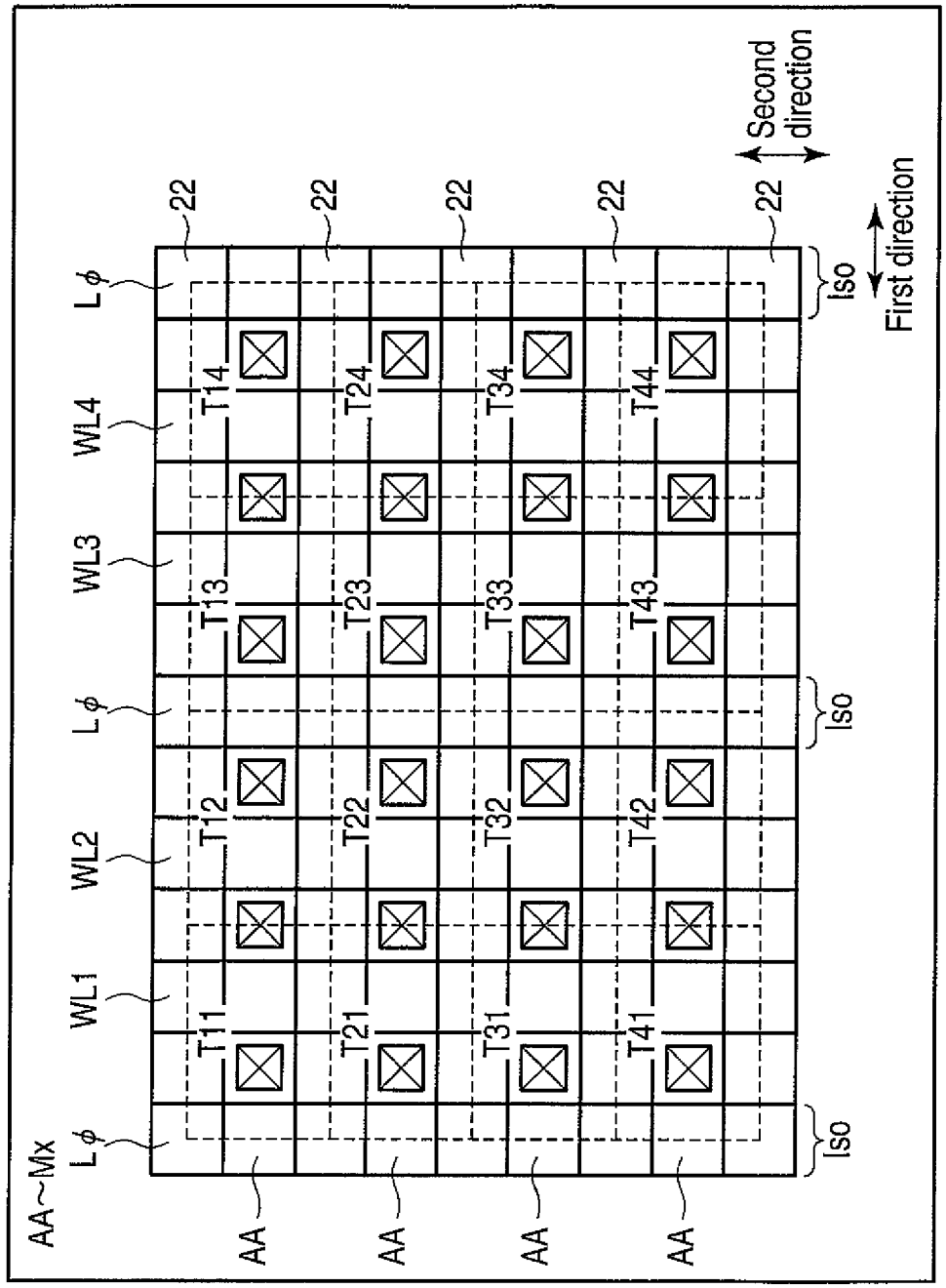
FIG. 49 is a plan view from the active area to a zeroth conductive layer.

FIG. 48 shows a layout of the active area AA in the second modification, FIG. 49 shows a layout from the active area AA to the zeroth conductive layer Mx in the second modification, FIG. 50 shows a layout from the zeroth conductive layer Mx to the first conductive layer M1 in the second modification, and FIG. 51 shows a layout from the first conductive layer M1 to the second conductive layer M2 in the second modification.

FIGS. 52 to 56 are cross-sectional views of a third modification of the second embodiment.

Figure 52:
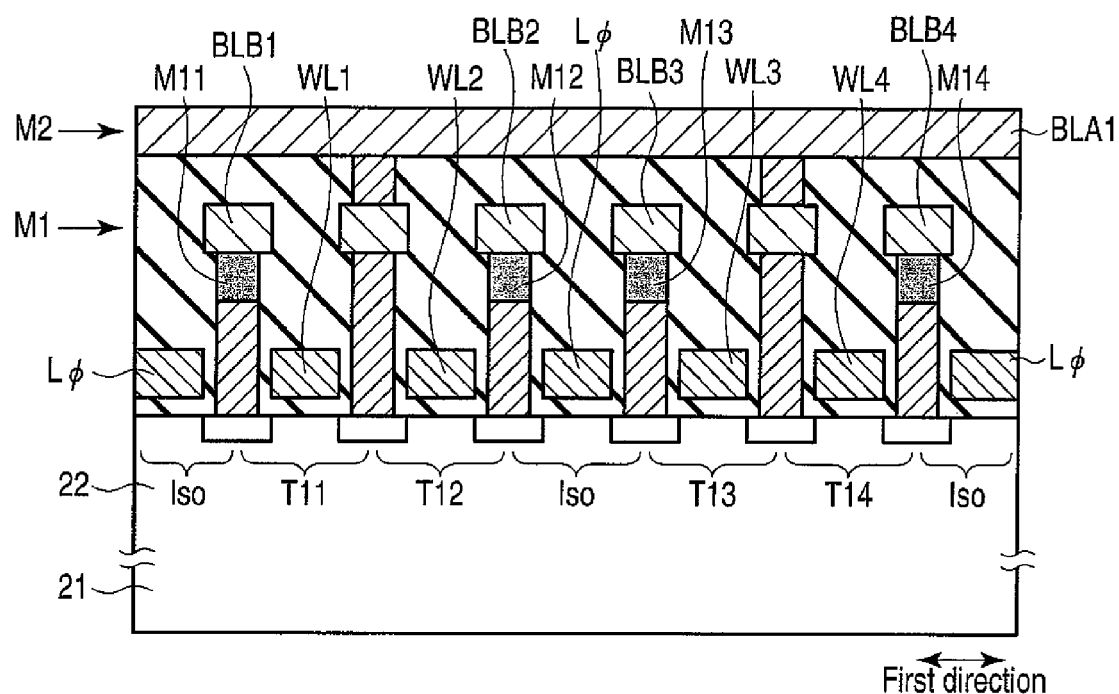
FIG. 52 is a cross-sectional view of a third modification of the second embodiment.
Figure 53:
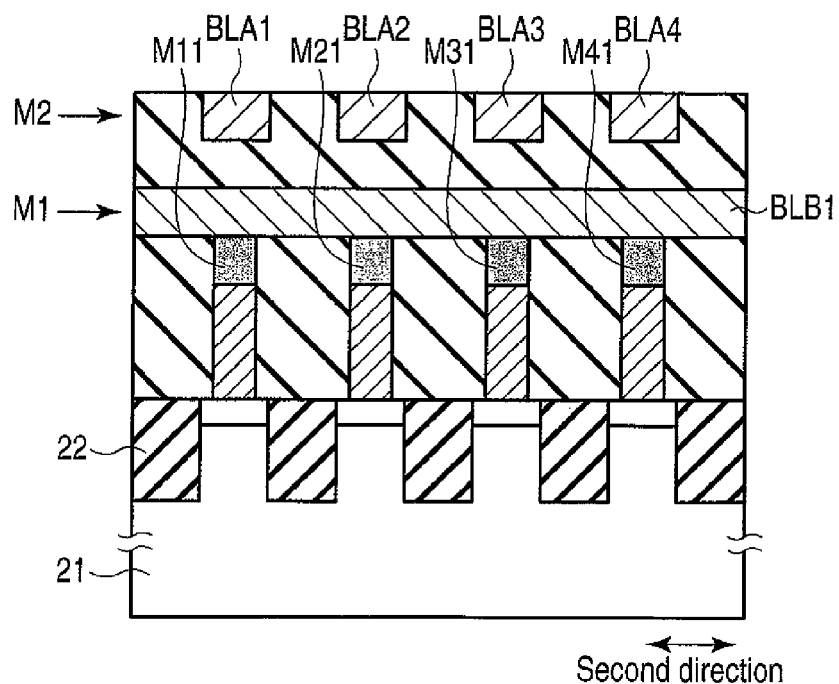
Figure 56:
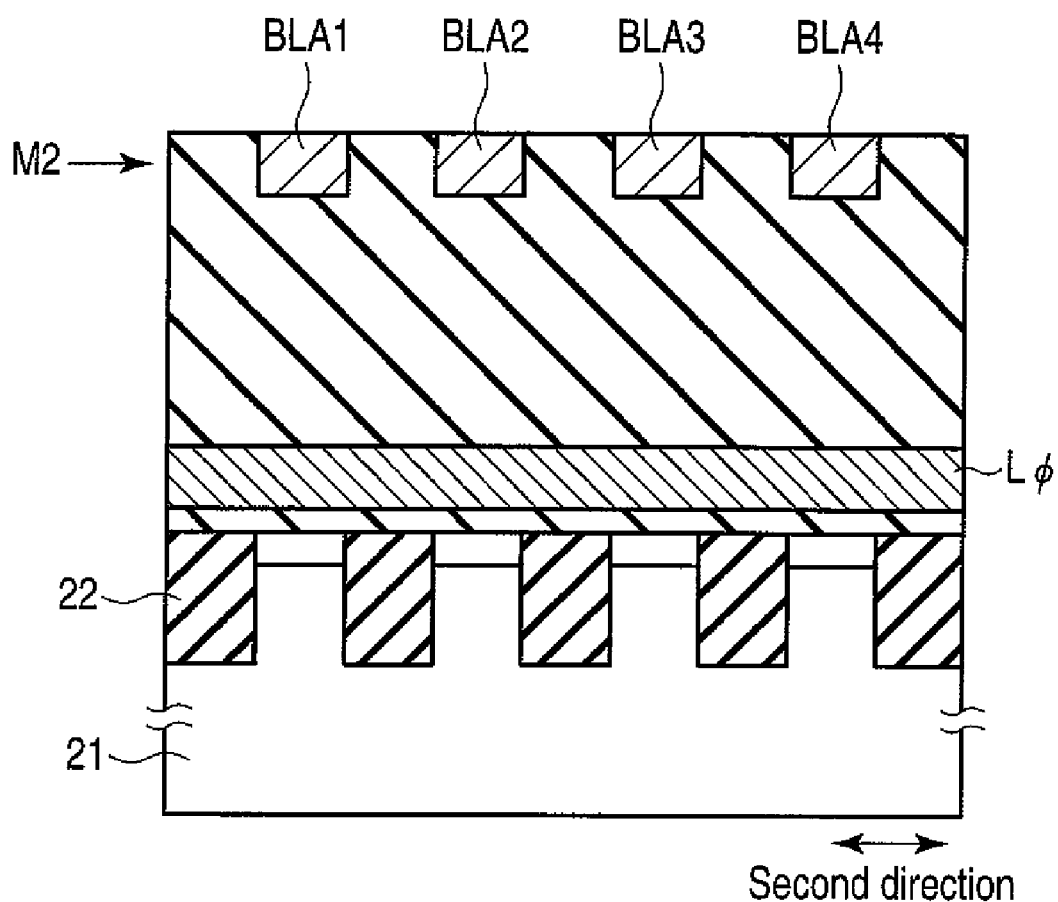

FIG. 52 corresponds to a sectional view along line XXIX-XXIX in FIG. 28 (modification of FIG. 29), FIG. 53 corresponds to a sectional view along line XXX-XXX in FIG. 28 (modification of FIG. 30), FIG. 54 corresponds to a sectional view along line XXXI-XXXI in FIG. 28 (modification of FIG. 30), FIG. 55 corresponds to a sectional view along line XXXII-XXXII in FIG. 28 (modification of FIG. 32), and FIG. 56 corresponds to a sectional view along line XXXIII-XXXIII in FIG. 2 (modification of FIG. 33).

The third modification is different from the second embodiment in that the zeroth conductive layer Mx in FIGS. 29 to 33 is not present. That is, in the third modification, the resistive memory element Mij is arranged immediately above a contact plug to be in contact therewith.

E. Conclusion

According to the second embodiment and the modifications thereof, the new memory cell array layout which is a combination of the one-transistor/one-memory-element type and the cross point type can reduce the cell area (cell size 6 $F^2$) and improve operating characteristics.

(3) Third Embodiment

A. Circuit Diagram

FIG. 57 shows a circuit diagram of a third embodiment.

As compared with the first embodiment, the third embodiment is characterized in that a memory cell array is of the two-transistor/one-memory-element type. When two transistors are added to one memory element, a current required for writing (or set/reset) can be supplied to a resistive memory element as a memory element, thereby further improving operating characteristics.

A memory cell array 11 has the two-transistor/one-memory-element type. First and second control circuits 12 and 13 control reading/writing with respect to the memory cell array 11.

This drawing shows 16 memory cells arranged in a 4×4 matrix. The area which is surrounded by the broken line corresponds to one memory cell.

First bit lines BLA1, BLA2, BLA3 and BLA4 extend in a first direction (e.g., the column direction), and second bit lines BLB1, BLB2, BLB3 and BLB4 extend in a second direction (e.g., the row direction) crossing the first direction. Furthermore, word lines WL1*a*, WL1*b*, WL2*a* WL2*b*, WL3*a*, WL3*b*, WL4*a* and WL4*b* extend in the second direction.

A second source/drain region of each of cell transistors (e.g., N-channel MOSFETs) Tija and Tijb (i=1, 2, 3, 4; j=1, 2, 3, 4) is connected to the first bit line BLAi, and a first source/drain region of each of cell transistors Tija and Tijb is connected to the second bit line BLBj through a resistive memory element Mij.

A gate of cell transistor Tija is connected to word line WLia, and a gate of cell transistor Tijb is connected to word line WLib.

The resistive memory element Mij includes a magnetoresistive element and a phase-change element. Furthermore, the resistive memory element Mij may be a metal oxide as a ReRAM memory element.

The first source/drain region of cell transistor Ti1*a* and that of cell transistor Ti1*b* are shared, and the second source/drain region of cell transistor Ti1*b* and that of cell transistor Ti2*a* are shared.

Likewise, the first source/drain region of cell transistor Ti2*a* and that of cell transistor Ti2*b* are shared, and the second source/drain region of cell transistor Ti2*b* and that of cell transistor Ti3*a* are shared. Furthermore, the first source/drain region of cell transistor Ti3*a* and that of cell transistor Ti3*b* are shared, and the second source/drain region of cell transistor Ti3*b* and that of cell transistor Ti4*a* are shared.

The first source/drain region of cell transistor Ti4*a* and that of cell transistor Ti4*b* are likewise shared.

B. Device Structure

Figure 58:
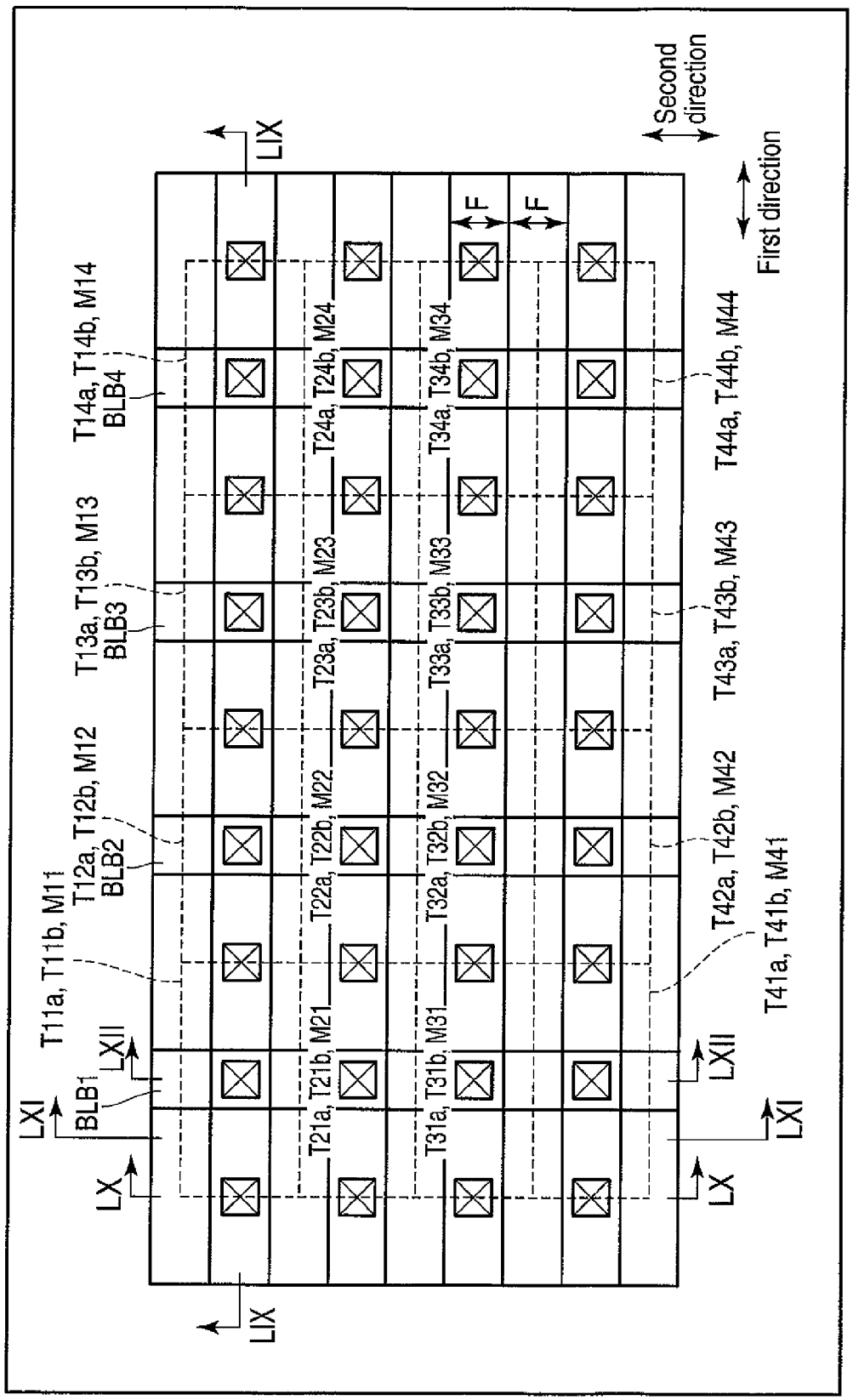
FIG. 58 is a plan view showing the third embodiment.

FIG. 58 shows a device structure of the third embodiment. FIG. 59 is a sectional view along line LIX-LIX in FIG. 58, FIG. 60 is a sectional view along line LX-LX in FIG. 58, FIG. 61 is a sectional view along line LXI-LXI in FIG. 58, and FIG. 62 is a sectional view along line LXII-LXII in FIG. 58.

In these drawings, reference numbers identical to those in FIG. 57 denote elements corresponding to those shown in FIG. 57. Moreover, in FIG. 58, F represents a half pitch (future size) of a line-and-space pattern (corresponding to an active area) having a minimum size.

In a semiconductor substrate 21, for example, an element isolation insulating layer 22 having an STI structure is formed. Cell transistors Ti1*a*, Ti1*b*, Ti2*a*, Ti2*b*, Ti3*a*, Ti3*b*, Ti4*a* and Ti4*b* (i=1, 2, 3, 4) aligned in the first direction area arranged in an element region (active area) common to these transistors.

The resistive memory element Mij (i=1, 2, 3, 4; j=1, 2, 3, 4) as a memory element is arranged immediately above the first source/drain region of each of cell transistors Tija and Tijb, and the second bit line BLBj is arranged immediately above the resistive memory element Mij.

The resistive memory element Mij is arranged on a zeroth conductive layer Mx above the semiconductor substrate 21. The second bit line BLBj is arranged in a first conductive layer M1 above the zeroth conductive layer Mx. The first bit line BLAi is arranged in a second conductive layer M2 above the first conductive layer M1.

C. Layout of Each Layer

Figure 63:
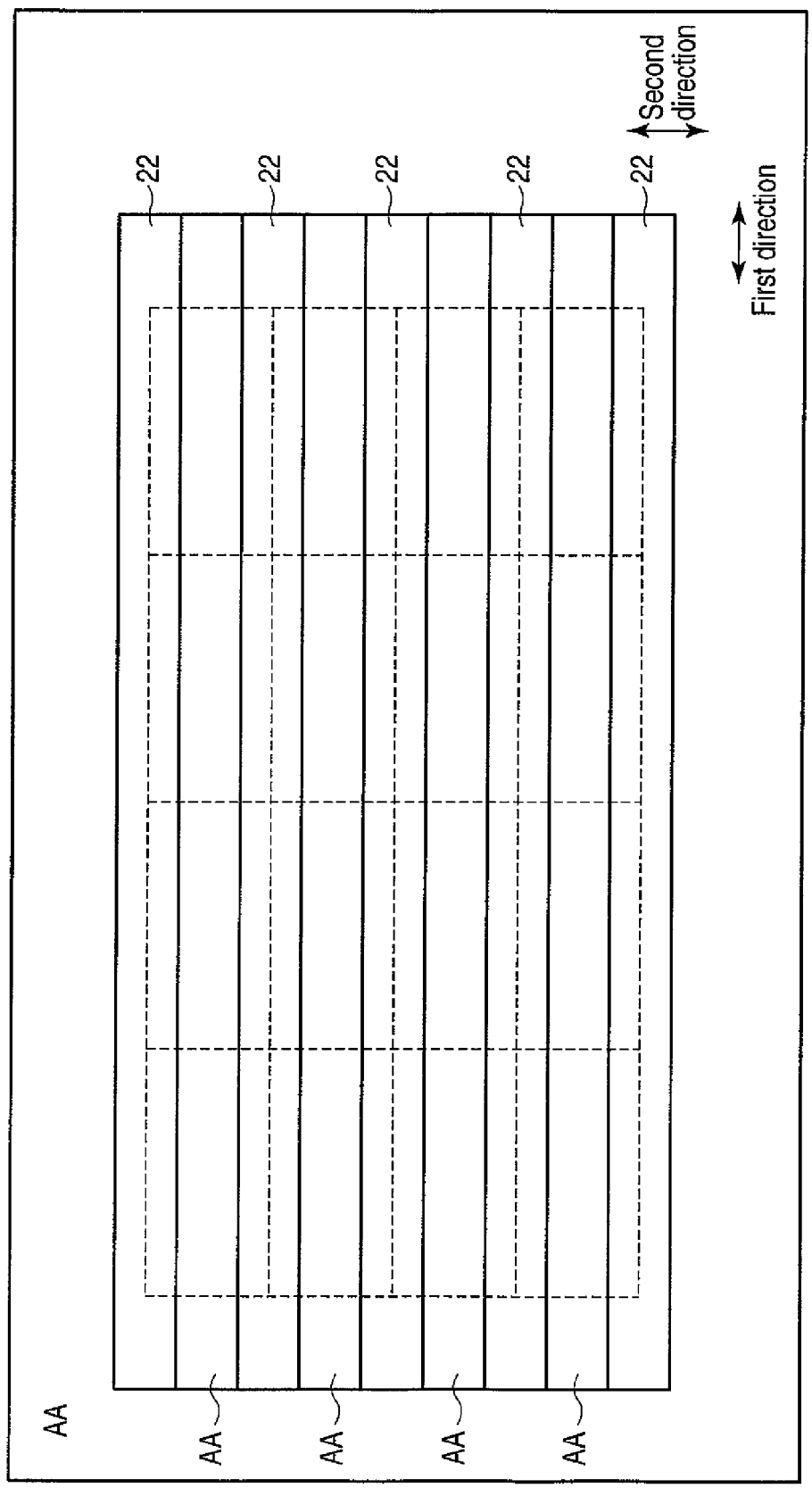
FIG. 63 is a plan view of an active area.

FIG. 63 shows a layout of an active area AA.

The active area AA has a line-and-space pattern in which lines and spaces extend in the first direction and are aligned in the second direction. A half pitch of this line-and-space pattern is F.

FIG. 64 shows a layout from the active area AA to the zeroth conductive layer Mx.

Cell transistors Ti1*a*, Ti1*b*, Ti2*a*, Ti2*b*, Ti3*a*, Ti3*b*, Ti4*a* and Ti4*b* (i=1, 2, 3, 4) aligned in the first direction are arranged in the active area AA common to these transistors.

Word line WL1*a* extends in the second direction to be shared by cell transistors T1*la*, T21*a*, T31*a* and T41*a*, and word line WL1*b* extends in the second direction to be shared by cell transistors T11*b*, T21*b*, T31*b* and T41*b*.

Likewise, word line WL2*a* extends in the second direction to be shared by cell transistors T12*a*, T22*a*, T32*a* and T42*a*, and word line WL2*b* extends in the second direction to be shared by cell transistors T12*b*, T22*b*, T32*b* and T42*b*.

Furthermore, word line WL3*a* extends in the second direction to be shared by cell transistors T13*a*, T23*a*, T33*a* and T43*a*, and word line WL3*b* extends in the second direction to be shared by cell transistors T13*b*, T23*b*, T33*b* and T43*b*.

Moreover, word line WL4*a* extends in the second direction to be shared by cell transistors T14*a*, T24*a*, T34*a* and T44*a*, and word line WL4*b* extends in the second direction to be shared by cell transistors T14*b*, T24*b*, T34*b* and T44*b*.

Figure 65:
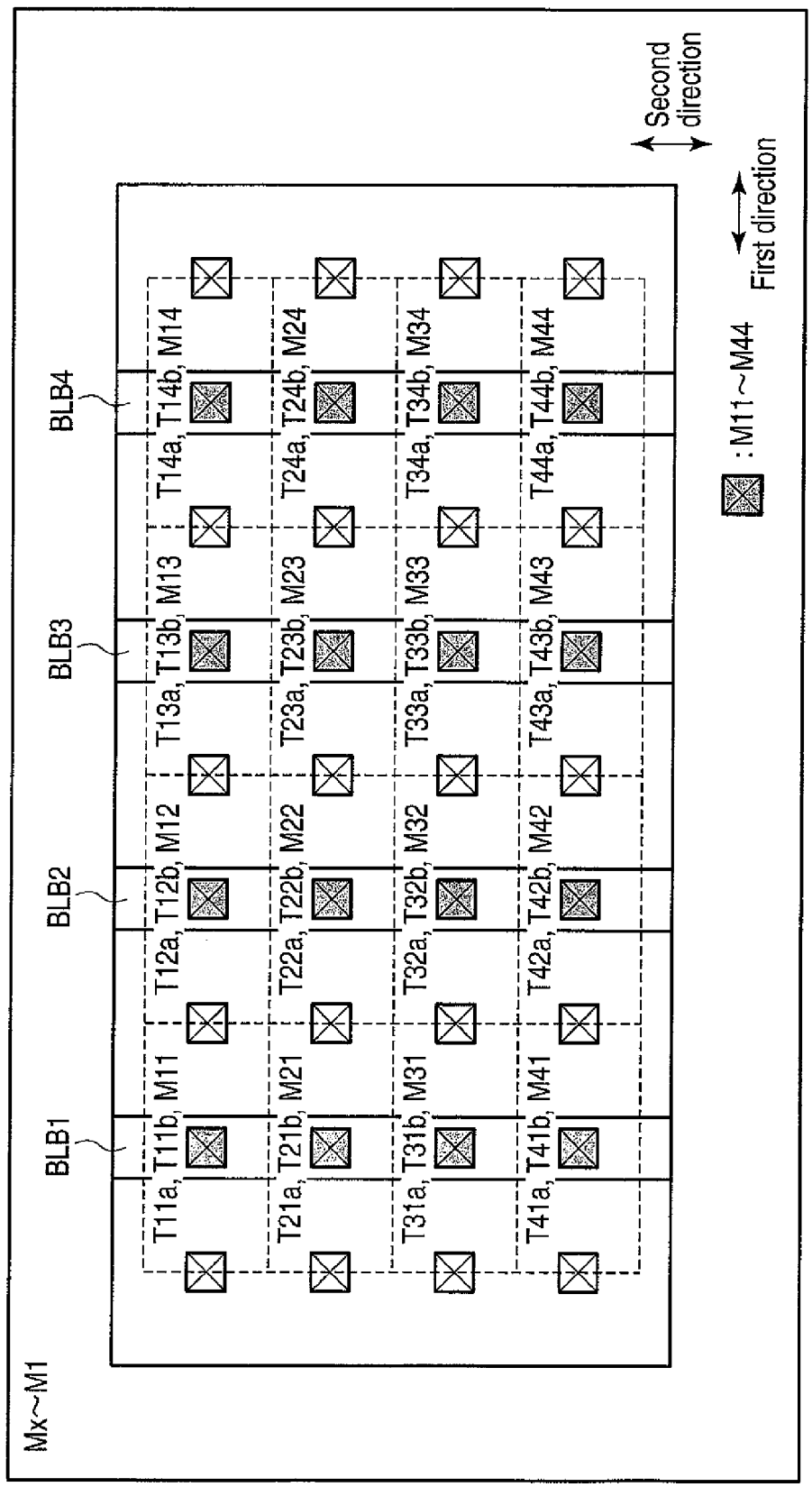
FIG. 65 is a plan view from the zeroth conductive layer to a first conductive layer.

FIG. 65 shows a layout from the zeroth conductive layer Mx to the first conductive layer M1.

The resistive memory element Mij as a memory element is arranged immediately above the first source/drain region of each of cell transistors Tija and Tijb (i=1, 2, 3, 4; j=1, 2, 3, 4), and the second bit line BLBj is arranged immediately above the resistive memory element Mij.

Second bit line BLB1 extends in the second direction to be connected to resistive memory elements M11, M21, M31 and M41 in common. Likewise, second bit line BLB2 is connected to resistive memory elements M12, M22, M32 and M42 in common, second bit line BLB3 is connected to resistive memory elements M13, M23, M33 and M43 in common, and second bit line BLB4 is connected to resistive memory elements M14, M24, M34 and M44 in common.

FIG. 66 shows a layout from the first conductive layer M1 to the second conductive layer M2.

First bit lines BLA1, BLA2, BLA3 and BLA4 extend in the first direction and arranged above second bit lines BLB1, BLB2, BLB3 and BLB4.

First bit line BLA1 is connected to cell transistors T11$a$, T11$b$, T12$a$, T12$b$, T13$a$, T13$b$, T14$a$ and T14$b$ in common.

Likewise, first bit line BLA2 is connected to cell transistors T21$a$, T21$b$, T22$a$, T22$b$, T23$a$, T23$b$, T24$a$ and T24$b$ in common, first bit line BLA3 is connected to cell transistors T31$a$, T31$b$, T32$a$, T32$b$, T33$a$, T33$b$, T34$a$ and T34$b$ in common, and first bit line BLA4 is connected to cell transistors T41$a$, T41$b$, T42$a$, T42$b$, T43$a$, T43$b$, T44$a$ and T44$b$ in common.

D. Modification

Figure 67:
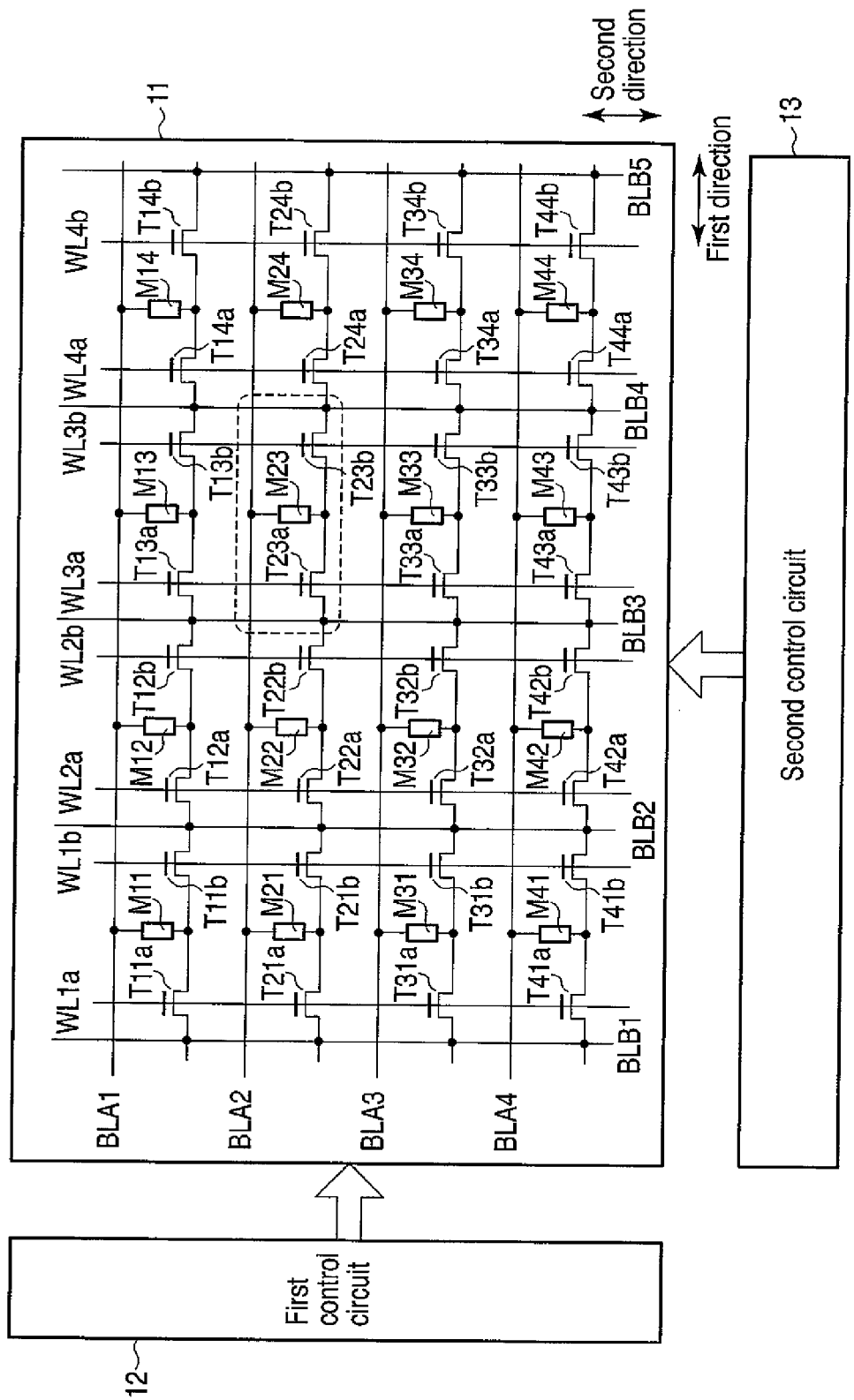
FIG. 67 is a circuit diagram showing a first modification of the third embodiment.
Figure 68:
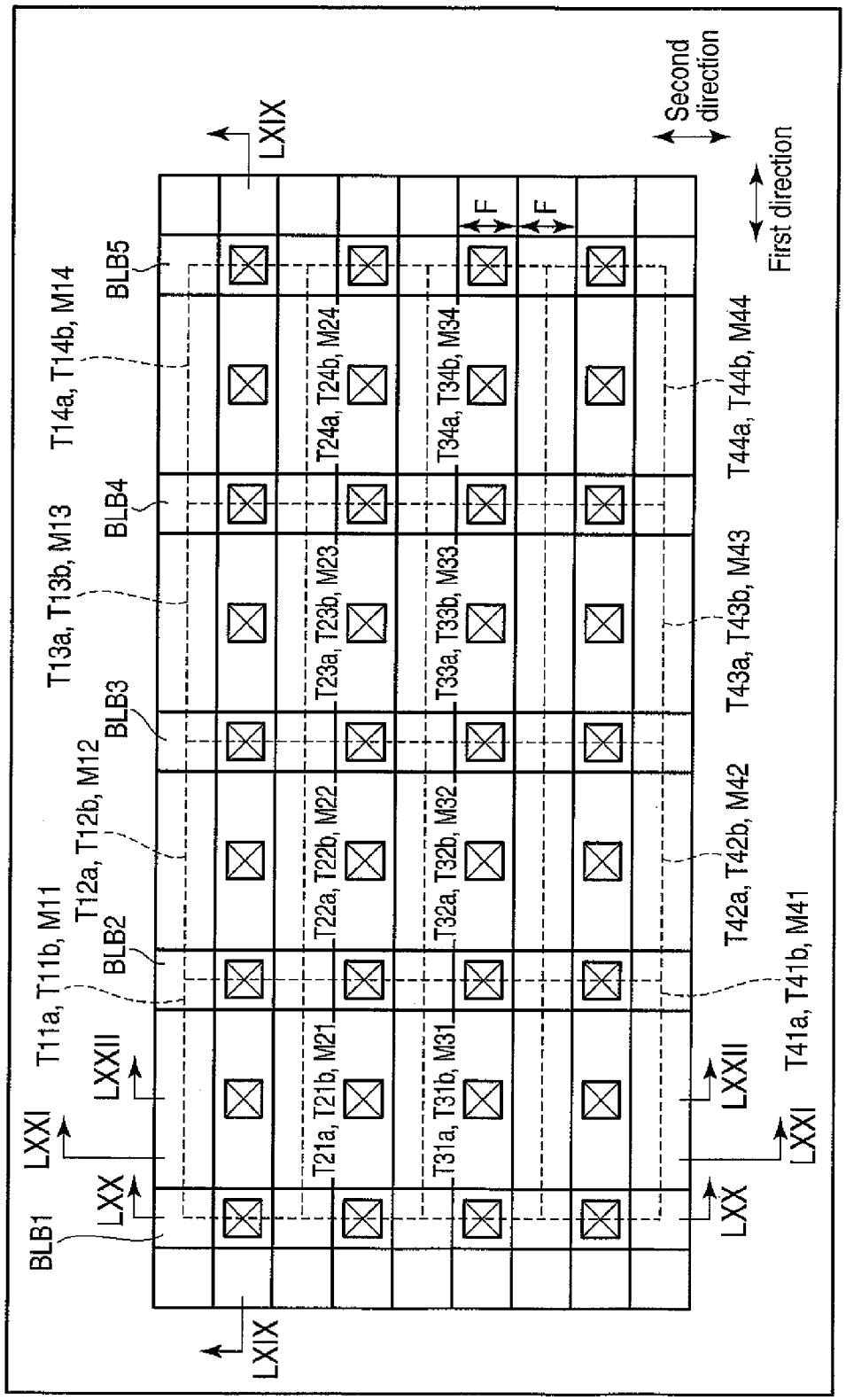
FIG. 68 is a plan view showing the first modification of the third embodiment.
Figure 69:
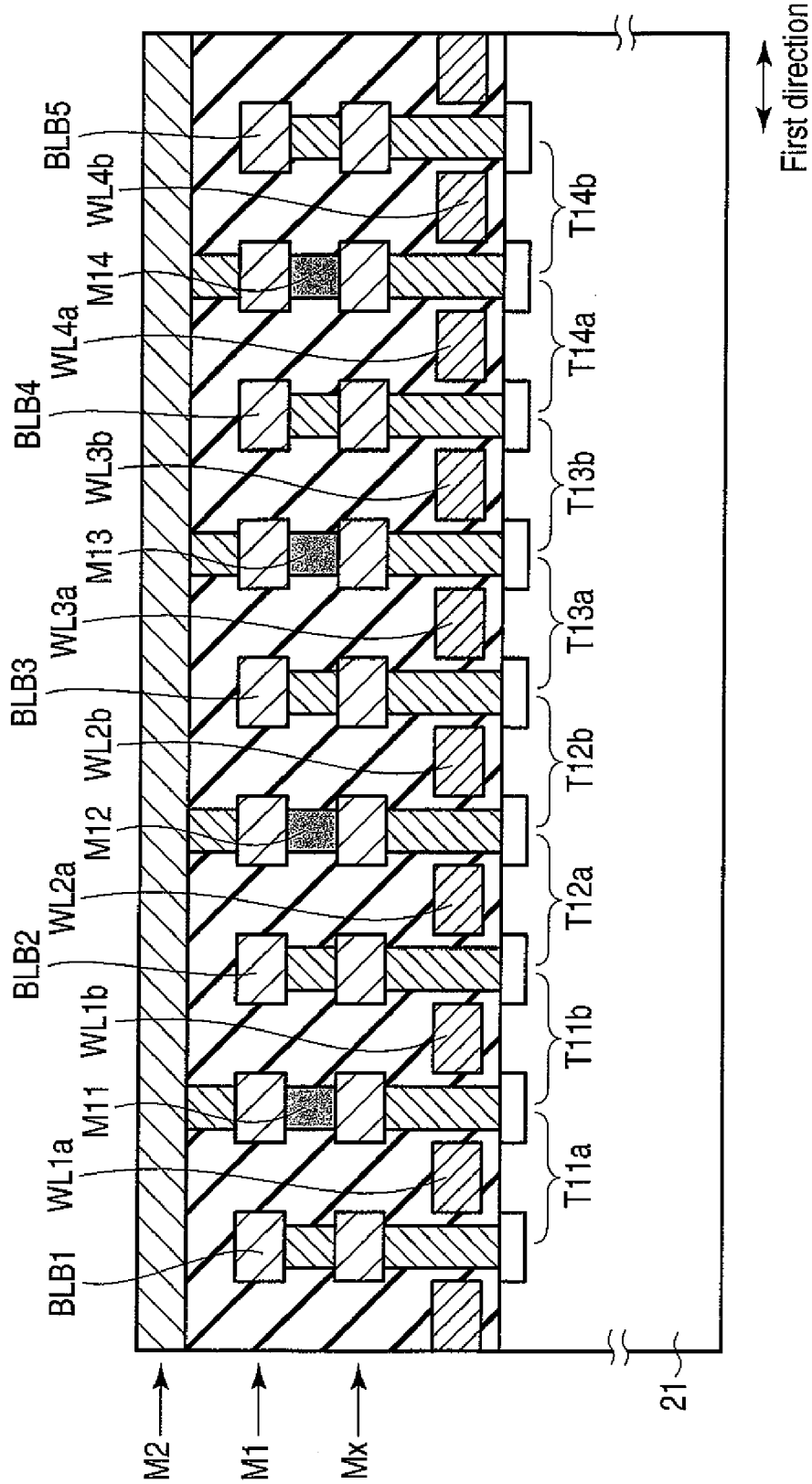
FIG. 69 is a sectional view along line LXIX-LXIX in FIG. 68.
Figure 72:
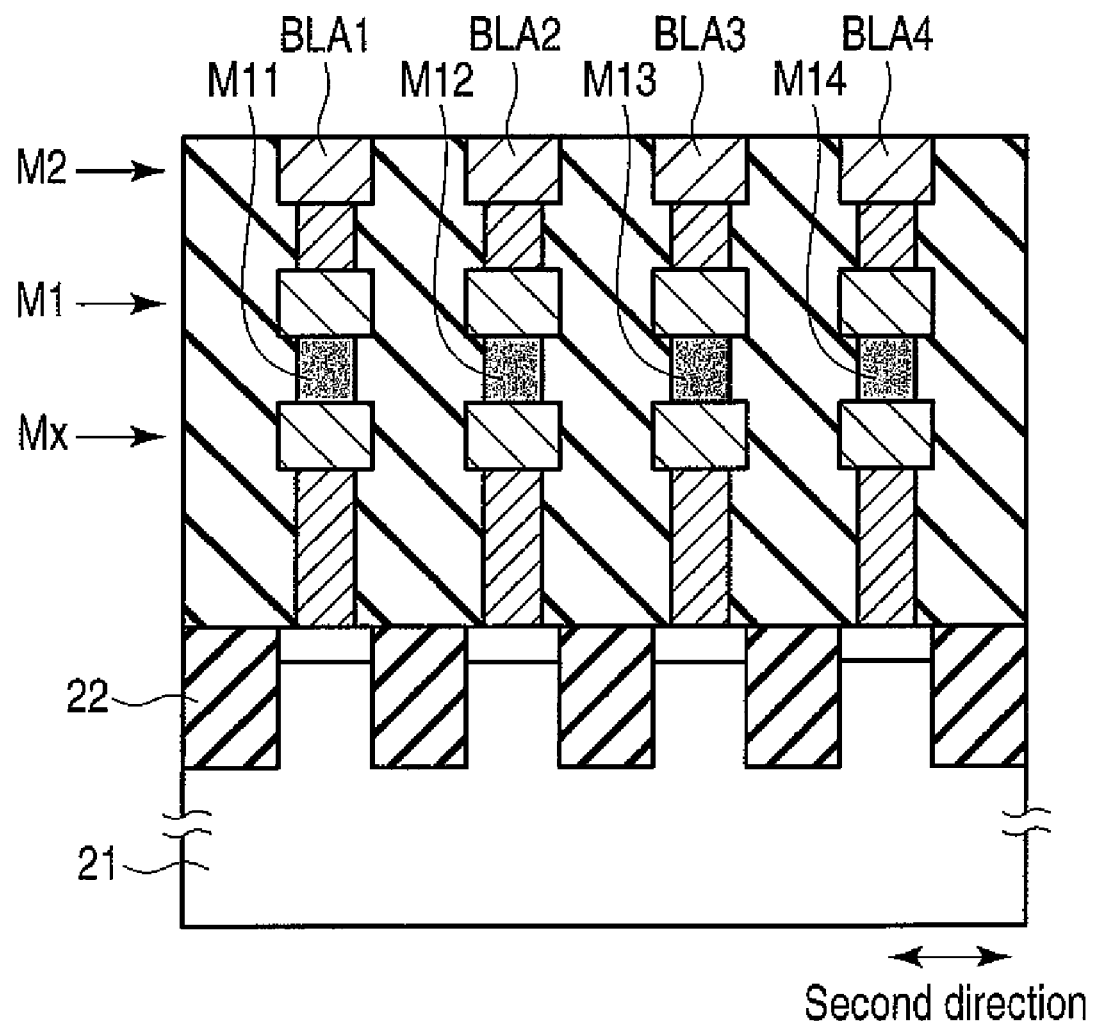
FIG. 72 is a sectional view along line LXXII-LXXII in FIG. 68.

FIG. 67 shows a circuit diagram of a first modification of the third embodiment. FIG. 68 shows a device structure of the first modification of the third embodiment. FIG. 69 is a sectional view along line LXIX-LXIX in FIG. 68, FIG. 70 is a sectional view along line LXX-LXX in FIG. 68, FIG. 71 is a sectional view along line LXXI-LXXI in FIG. 68, and FIG. 72 is a sectional view along line LXXII-LXXII in FIG. 68.

In these drawings, reference numbers identical to those in FIGS. 57 to 62 denote elements corresponding to those shown in FIGS. 57 to 62, thereby omitting a detailed description thereof.

This first modification is different from the third embodiment in a connection relationship between the memory cells and first bit lines BLA1, BLA2, BLA3 and BLA4 and a connection relationship between the memory cells and second bit lines BLB1, BLB2, BLB3 and BLB4.

Specifically, the first source/drain region of each of cell transistors Ti$j$$a$ and Ti$j$$b$ is connected to the first bit line BLA$i$ through the resistive memory element M$ij$.

Additionally, the second source/drain region of cell transistor Ti1$a$ is connected to second bit line BLB1, the second source/drain region of each of cell transistors Ti1$b$ and Ti2$a$ is connected to second bit line BLB2, the second source/drain region of each of cell transistors Ti2$b$ and Ti3$a$ is connected to second bit line BLB3, the second source/drain region of each of cell transistors Ti3$b$ and Ti4$a$ is connected to second bit line BLB4, and the second source/drain region of cell transistor Ti4$b$ is connected to second bit line BLB5.

Figure 73:
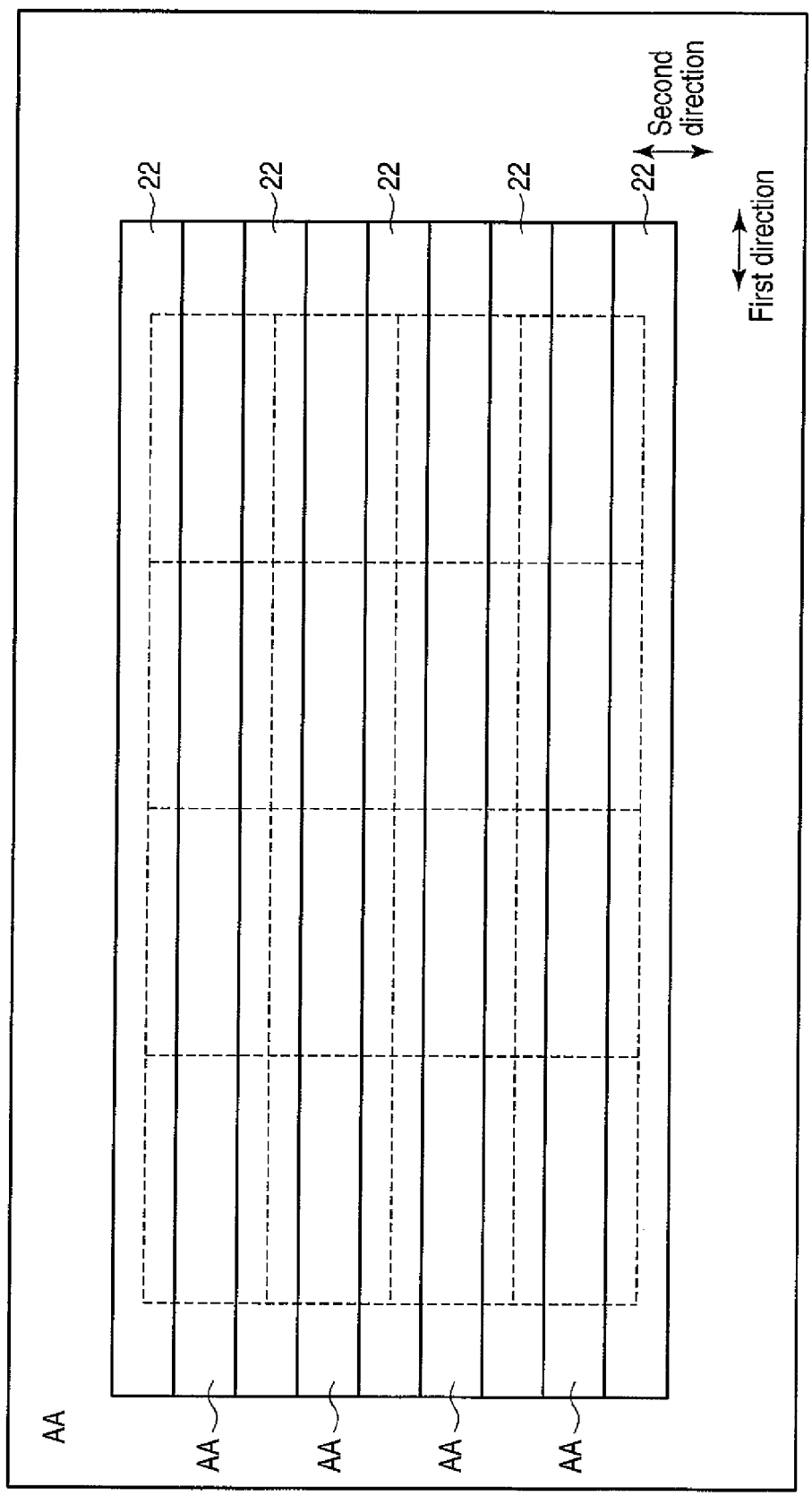
FIG. 73 is a plan view of an active area.
Figure 74:
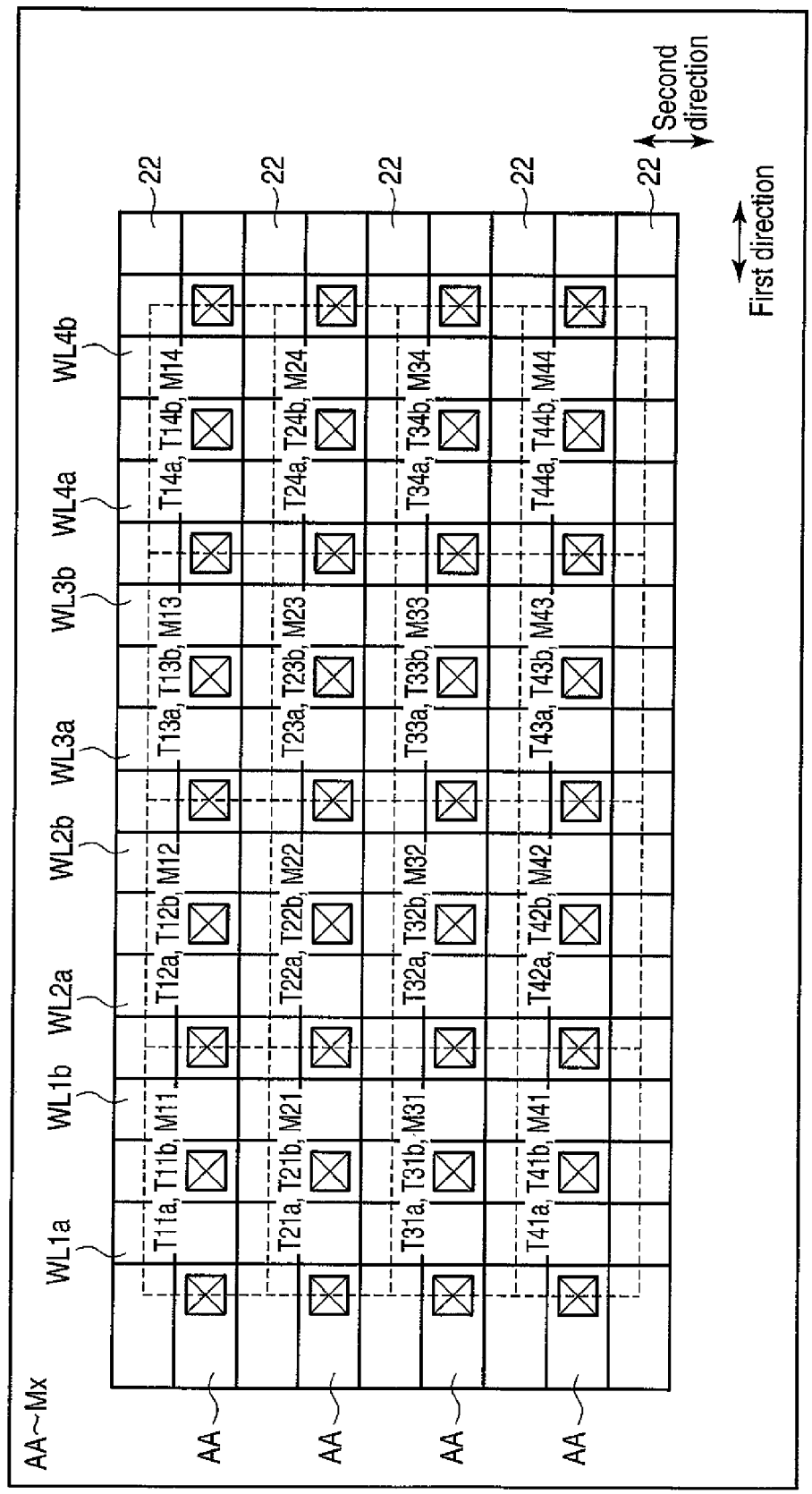
FIG. 74 is a plan view from the active area to a zeroth conductive layer.
Figure 75:
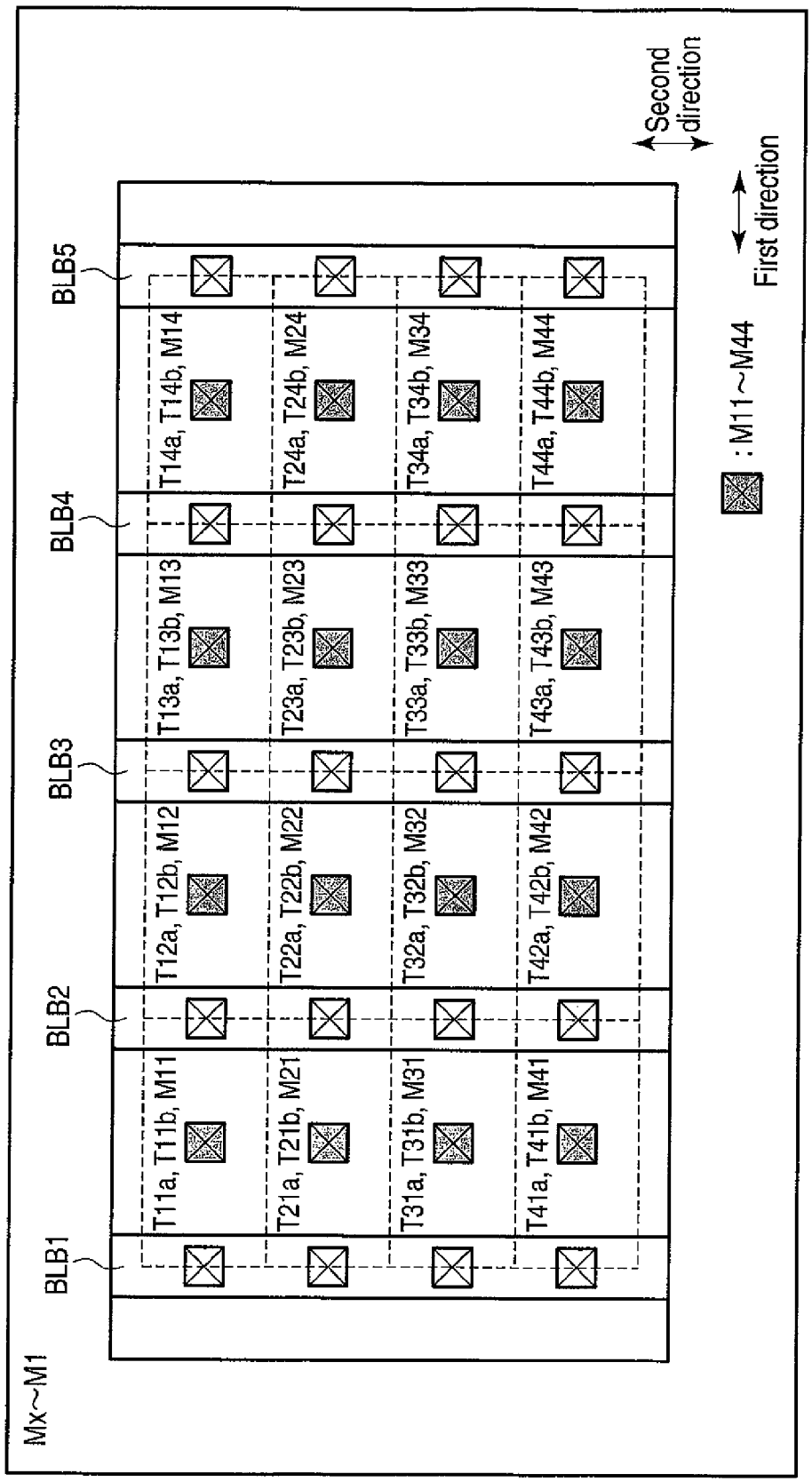
FIG. 75 is a plan view from the zeroth conductive layer to a first conductive layer.
Figure 76:
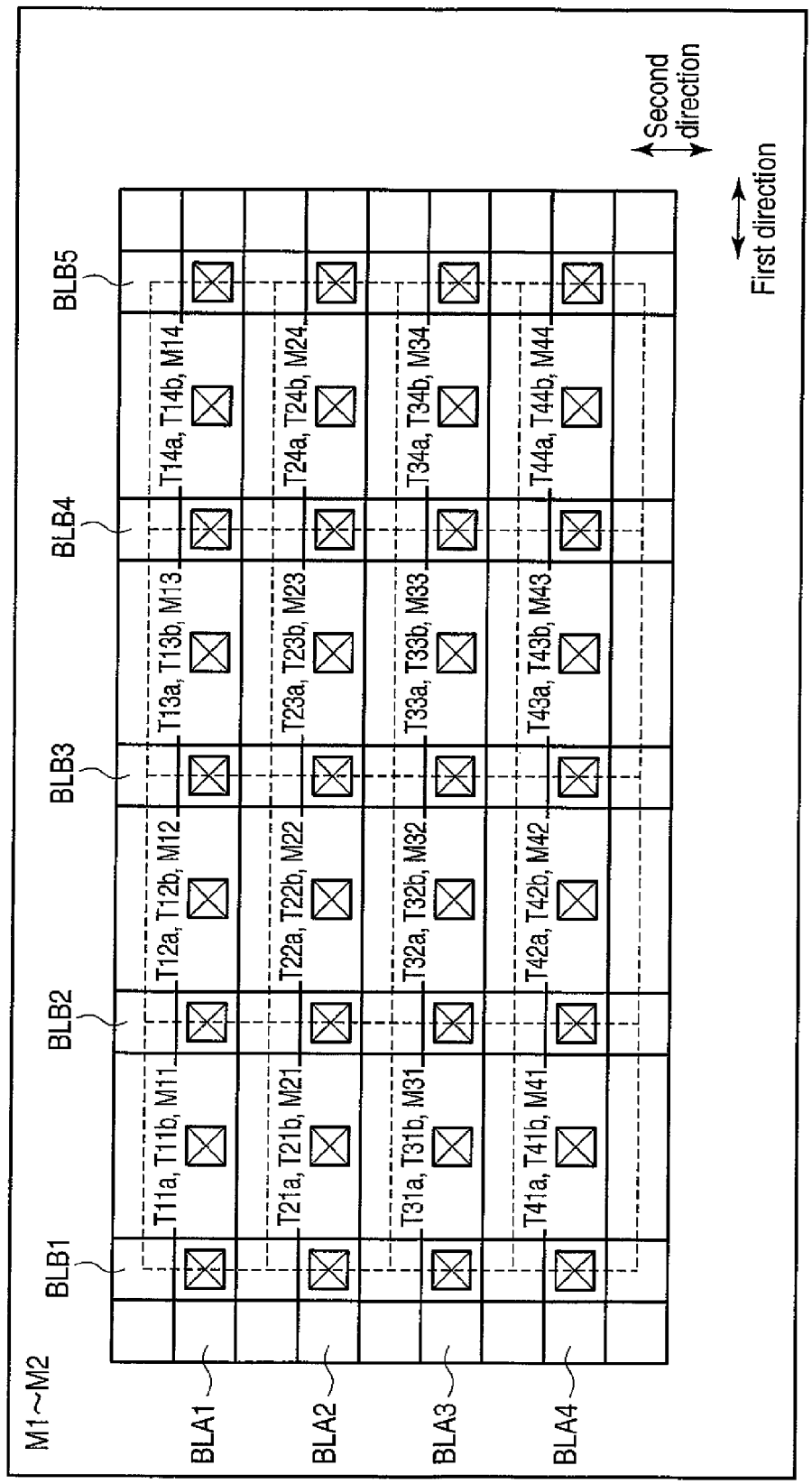
FIG. 76 is a plan view from the first conductive layer to a second conductive layer.

FIG. 73 shows a layout of the active area AA in the first modification, FIG. 74 shows a layout from the active area AA to the zeroth conductive layer Mx in the first modification, FIG. 75 shows a layout from the zeroth conductive layer Mx to the first conductive layer M1 in the first modification, and FIG. 76 shows a layout from the first conductive layer M1 to the second conductive layer M2 in the first modification.

FIGS. 77 to 80 are cross-sectional views of a second modification of the third embodiment.

Figure 77:
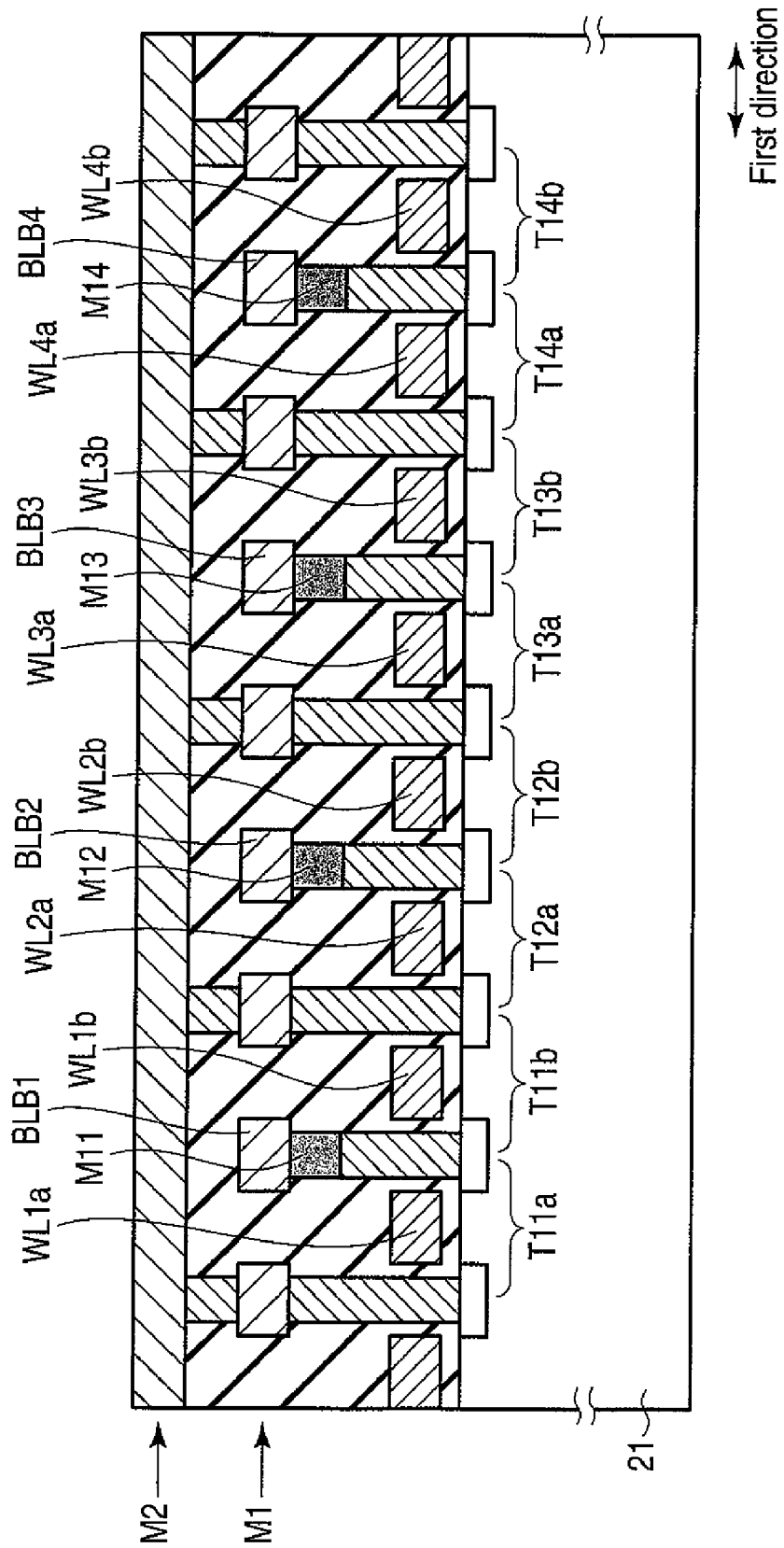

FIG. 77 corresponds to a sectional view along line LIX-LIX in FIG. 58 (modification of FIG. 59), FIG. 78 corresponds to a sectional view along line LX-LX in FIG. 58 (modification of FIG. 60), FIG. 79 corresponds to a sectional view along line LXI-LXI in FIG. 58 (modification of FIG. 61), and FIG. 80 corresponds to a sectional view along line LXII-LXII in FIG. 58 (modification of FIG. 62).

The second modification is different from the third embodiment in that the zeroth conductive layer Mx in FIGS. 59 to 62 is not present. That is, in the second modification, the resistive memory element M$ij$ is arranged immediately above a contact plug to be in contact therewith.

E. Conclusion

According to the third embodiment and the modifications thereof, the new memory cell array layout which is a combination of the two-transistor/one-memory-element type and the cross point type can reduce the cell area (cell size 8 $F^2$) and improve operating characteristics.

(4) Fourth Embodiment

A fourth embodiment is concerned with read/write control of a resistance-change semiconductor memory according to each of the first to third embodiments. Here, writing means to change the resistance (multi-level value having 2 levels, 3 levels or more) of the resistive memory element, and set/reset used in, e.g., a ReRAM is included.

A. System

Figure 81:
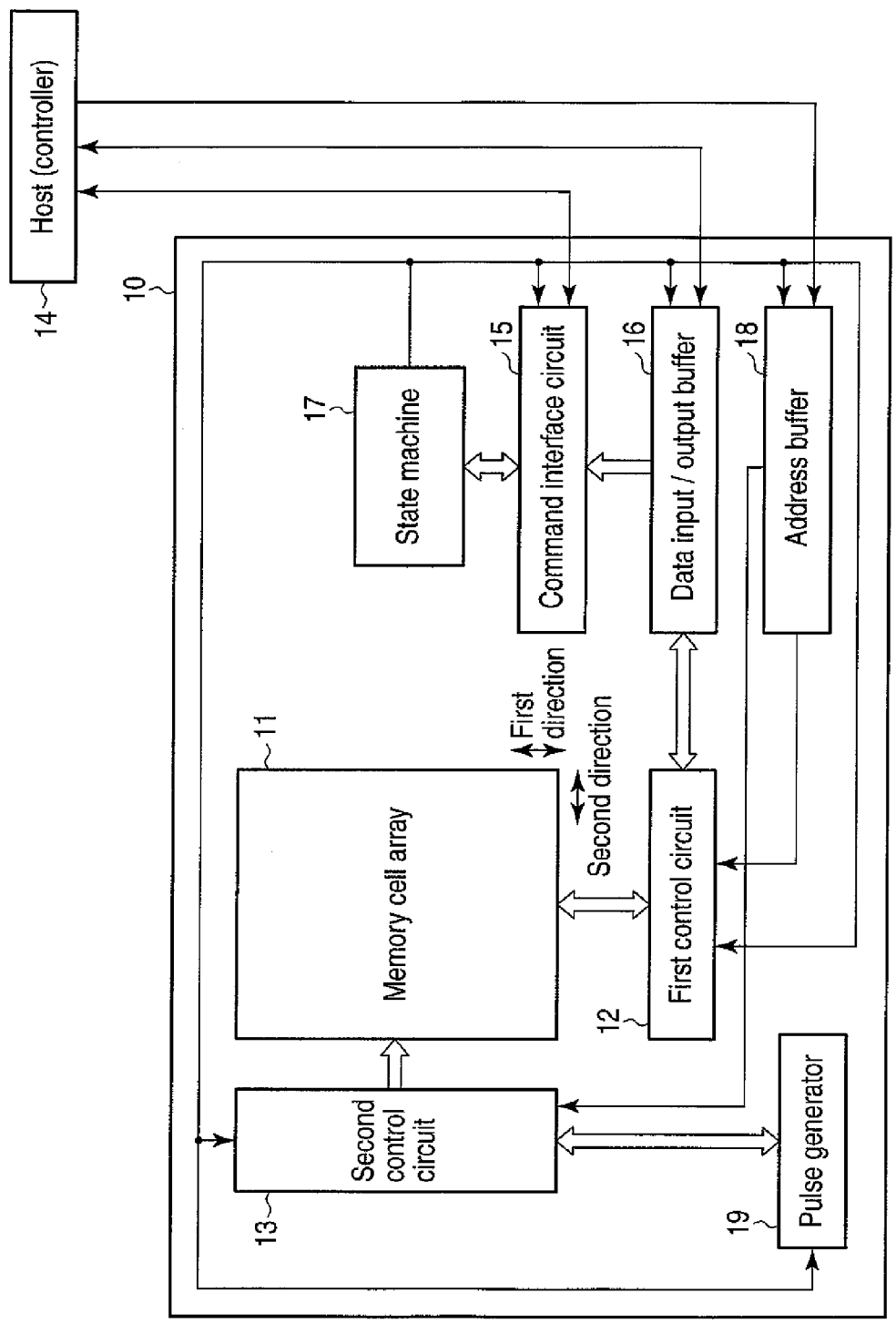
FIG. 81 is a block diagram showing a memory system.

FIG. 81 shows an example of a memory system.

A memory cell array 11 according to each of the first to third embodiments is arranged in a resistance-change semiconductor memory (memory chip) 10. A first control circuit 12 is arranged at one end of the memory cell array 11 in a first direction, and a second control circuit 13 is arranged at one end of the same in a second direction crossing the first direction.

The first and second control circuits 12 and 13 control a read/write operation.

The second control circuit 13 selects a row in the memory cell array 11 based on a row address signal. For example, the second control circuit 13 selects one of word lines and one of second bit lines. Further, the first control circuit 12 selects a column in the memory cell array 11 based on a column address signal. For example, the second control circuit 13 selects one of first bit lines.

A host (controller) 14 supplies a control signal and data to the resistance-change semiconductor memory 10. The control signal is input to a command interface circuit 15, and the data is input to a data input/output buffer 16. Moreover, the host 14 may be arranged in the resistance-change semiconductor memory 10 or may be arranged in a chip different from the resistance-change semiconductor memory 10.

The command interface circuit 15 judges whether the data from the host 14 is command data based on the control signal, and it transfers this data from the data input/output buffer 16 to a state machine 17 if this data is command data.

The state machine 17 controls an operation of the resistance-change semiconductor memory 10 based on the command data. For example, the state machine 17 controls a read/write operation based on the command data from the host 14.

The host 14 can receive status information from the state machine 17 and determine an operating state of the resistance-change semiconductor memory 10.

In the read/write operation, the host 14 supplies an address signal to the resistance-change semiconductor memory 10. The address signal includes, e.g., a row address signal and a column address signal. The address signal is input to the first and second control circuits 12 and 13 through an address buffer 18.

A pulse generator 19 outputs a voltage pulse or a current pulse required for, e.g., the read/write operation based on a command from the state machine 17 at a predetermined timing.

B. Read Operation

The read operation will be explained hereinafter with the memory cell array according to the first embodiment being taken as an example, but this operation can be of course applied to the memory cell arrays according to the second and third embodiments.

B-1. First Example

Figure 82:
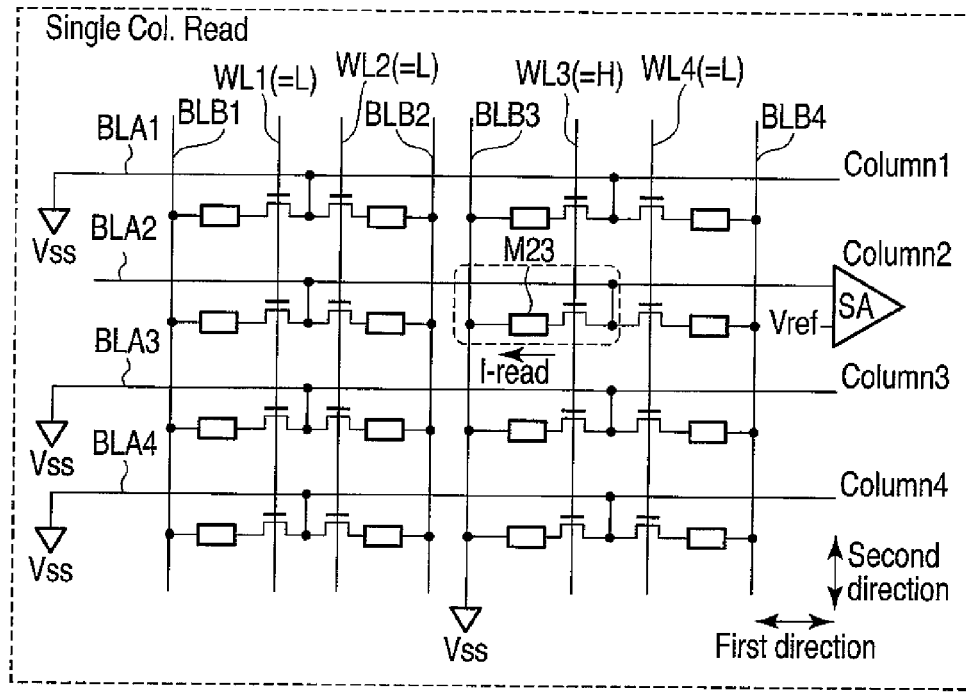
FIG. 82 is a circuit diagram showing a first example of a read operation.

FIG. 82 shows a first example of the read operation.

This read operation is concerned with single-column reading (single col. read), i.e., reading with respect to one memory cell.

For example, when reading resistive memory element M23, a fixed potential (e.g., ground potential Vss) is applied to the non-selected first bit lines BLA1, BLA3 and BLA4, and the selected first bit line BLA2 is connected to a sense amplifier SA.

Additionally, the non-selected second bit lines BLB1, BLB2 and BLB4 are set to a floating state, and a fixed potential (e.g., ground potential Vss) is applied to the selected second bit line BLB3.

Further, the potential of each of the non-selected word lines WL1, WL2 and WL4 is made low, and the potential of the selected word line WL3 is made high. Here, "low" means the potential that turns off each cell transistor, and "high" means the potential that turns on each cell transistor. This can be likewise applied to the following description.

At this time, since a read current I-read flows through resistive memory element M23, when the sense amplifier SA is utilized to compare first bit line BLA2 with a reference potential Vref, in the contents of resistive memory element M23 can be determined.

B-2. Second Example

Figure 83:
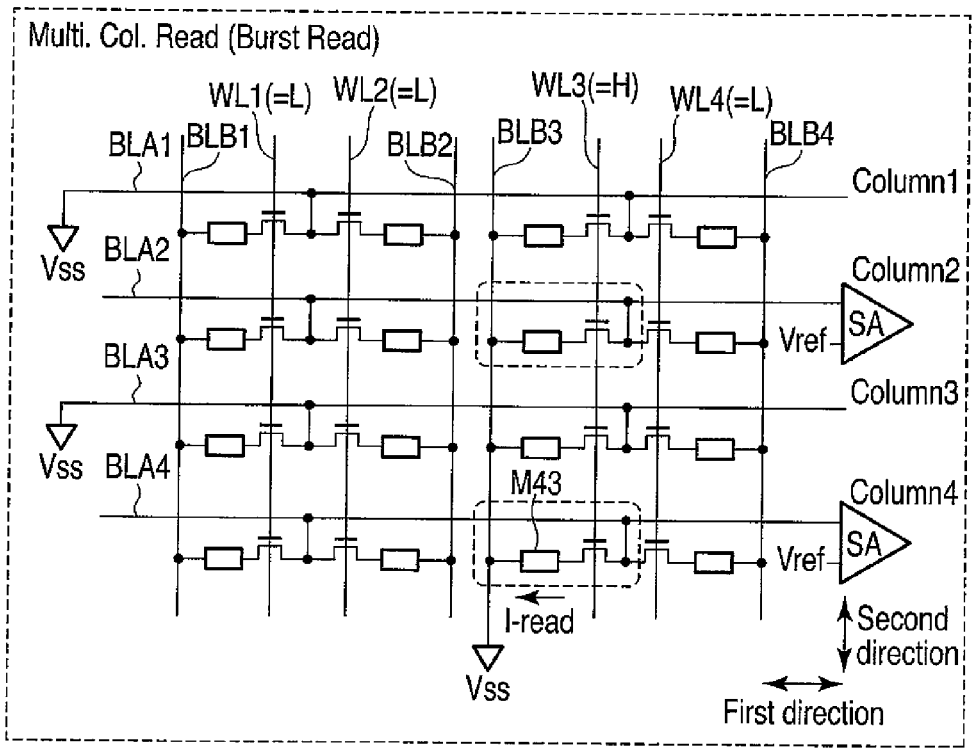
FIG. 83 is a circuit diagram showing a second example of the read operation.

FIG. 83 shows a second example of the read operation.

This read operation is concerned with multi-column reading, i.e., simultaneously reading with respect to memory cells in one row.

For example, when reading the two resistive memory elements M23 and M43 in one row, a fixed potential (e.g., ground potential Vss) is applied to the non-selected first bit lines BLA1 and BLA3, and the selected first bit lines BLA2 and BLA4 are connected to the sense amplifiers SA.

Moreover, the non-selected second bit lines BLB1, BLB2 and BLB4 are set to the floating state, and a fixed potential (e.g., ground potential Vss) is applied to the selected second bit lines BLB3.

Additionally, the potential of each of the non-selected word lines WL1, WL2 and WL4 is made low, and the potential of the selected word line WL3 is made high.

At this time, since the read current I-read flows through resistive memory elements M23 and M43 at the same time, when the sense amplifiers SA are utilized to compare first bit lines BLA2 and BLA4 to the reference potential Vref, in the contents of resistive memory elements M23 and M43 can be determined.

B-3. Third Example

FIG. 84 shows a third example of the read operation.

This read operation is concerned with all-column reading (all col. read), i.e., simultaneously reading with respect to all memory cells in one row.

Here, in the first example and the second example, the number of sense amplifiers is a half or below of the number of columns. Therefore, in the first example and the second example, the sense amplifiers SA can be arranged at one end alone of the memory cell array.

However, in general, a sense amplifier size is larger than a column size. Therefore, in a third example, the sense amplifiers SA are arranged at both ends of the memory cell array.

For example, when reading resistive memory elements M13, M23, M33 and M43 in one row, all first bit lines BLA1, BLA2, BLA3 and BLA4 are connected to the sense amplifiers SA.

Further, the non-selected second bit lines BLB1, BLB2 and BLB4 are set to the floating state, and a fixed potential (e.g., ground potential Vss) is applied to the selected second bit line BLB3.

Furthermore, the potential of each of the non-selected word lines WL1, WL2 and WL4 is made low, and the potential of the selected word line WL3 is made high.

At this time, since the read current I-read flows through resistive memory elements M13, M23, M33 and M43 at the same time, when the sense amplifiers SA are utilized to compare first bit lines BLA1, BLA2, BLA3 and BLA4 with the reference potential Vref, in the contents of resistive memory elements M13, M23, M33 and M43 can be determined.

B-4. Others

In the first example to the third example, the read current I-read is determined to have a small magnitude with which writing (erroneous writing) does not occur with respect to each resistive memory element.

Moreover, although each sense amplifier SA is connected to the side where first bit lines BLA1, BLA2, BLA3 and BLA4 are provided, it may be connected to the side where second bit lines BLB1, BLB2, BLB3 and BLB4 are provided instead.

Additionally, in the first example and the second example, the sense amplifiers may be provided on both sides of the memory cell array.

Further, in the first example and the second example, the non-selected first bit lines may be set to the floating state.

C. Write Operation

The write operation will now be described hereinafter with the memory cell array according to the first embodiment being taken as an example, but this operation can be of course applied to the memory cell arrays according to the second and third embodiments.

Although a bipolar operation of controlling writing binary 0/1 by using a bidirectional current will be explained here, but a unipolar operation of controlling writing binary 0/1 by changing the magnitude of a current in the same direction can be also executed.

C-1. First Example

FIG. 85 shows a first example of the write operation.

This write operation is concerned with single-column writing (single col. write) with respect to one memory cell.

C-1-1. Writing Binary 0 (Reset)

As shown in Illustration 1 of the drawing, for example, when writing to resistive memory element M23, a low-potential-side fixed potential (e.g., ground potential Vss) is applied to the non-selected first bit lines BLA1, BLA3 and BLA4, and a high-potential-side fixed potential (e.g., power supply potential Vdd) is applied to the selected first bit line BLA2.

Further, the non-selected second bit lines BLB1, BLB2 and BLB4 are set to the floating state, and a low-potential-side fixed potential (e.g., ground potential Vss) is applied to the selected second bit line BLB3.

Furthermore, the potential of each of the non-selected word lines WL1, WL2 and WL4 is made low, and the potential of the selected word line WL3 is made high.

At this time, since a write current (reset current) I-reset directed toward second bit line BLB3 from first bit line BLA2 flows through resistive memory element M23, the resistance of the resistive memory element M23 changes to a first value (e.g., a high-resistance state).

C-1-2. Writing Binary 1 (Set)

As shown in Illustration 2 of the drawing, for example, when writing to resistive memory element M23, a high-potential-side fixed potential (e.g., power supply potential Vdd) is applied to the non-selected first bit lines BLA1, BLA3 and BLA4, and a low-potential-side fixed potential (e.g., ground potential Vss) is applied to the selected first bit line BLA2.

Further, the non-selected second bit lines BLB1, BLB2 and BLB4 are set to the floating state, and a high-potential-side fixed potential (e.g., power supply potential Vdd) is applied to the selected second bit line BLB3.

Furthermore, the potential of each of the non-selected word lines WL1, WL2 and WL4 is made low, and the potential of the selected word line WL3 is made high.

At this time, since a write current (set current) I-set directed toward first bit line BLA2 from second bit line BLB3 flows through resistive memory element M23, the resistance of the resistive memory element M23 changes to a second value (e.g., a low-resistance state).

C-2. Second Example

Figure 86:
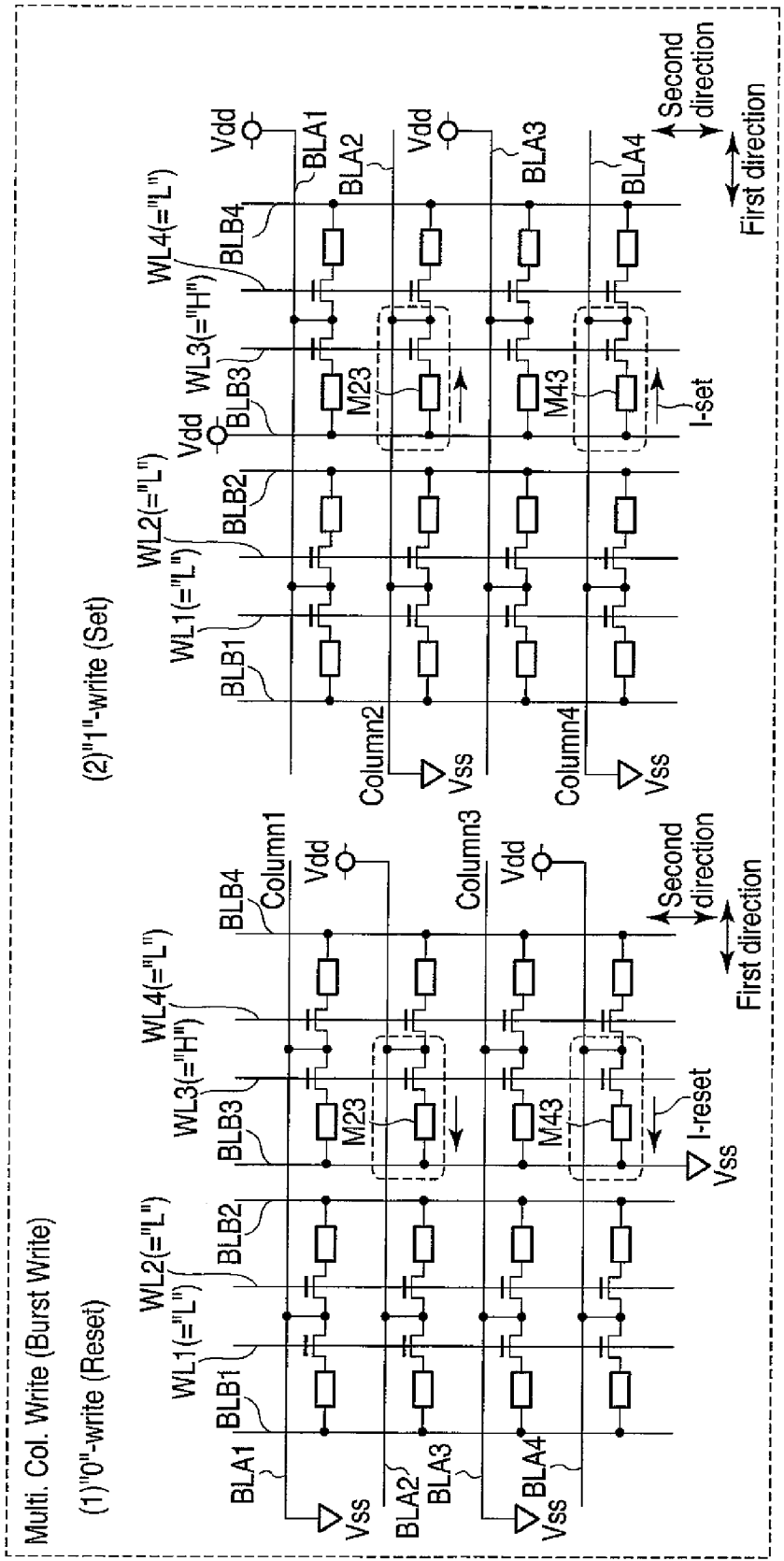
FIG. 86 is a circuit diagram showing a second example of the write operation.

FIG. 86 shows a second example of the write operation. This write operation is concerned with multi-column writing (multi. col. write), i.e., simultaneously writing with respect to memory cells in one row.

C-2-1. Writing Binary 0 (Reset)

As shown in Illustration 1 of the drawing, when writing to the two resistive memory elements M23 and M43 in one row, a low-potential-side fixed potential (e.g., ground potential Vss) is applied to the non-selected first bit lines BLA1 and BLA3, and a high-potential-side fixed potential (e.g., power supply potential Vdd) is applied to the selected first bit lines BLA2 and BLA4.

Moreover, the non-selected second bit lines BLB1, BLB2 and BLB4 are set to the floating state, and a low-potential-side fixed potential (e.g., ground potential Vss) is applied to the selected second bit line BLB3.

Additionally, the potential of each of the non-selected word lines WL1, WL2 and WL4 is made low, and the potential of the selected word line WL3 is made high.

At this time, since the write current (reset current) I-reset directed toward second bit line BLB3 from first bit lines BLA2 and BLA4 flows through resistive memory elements M23 and M43, the resistance of each of the resistive memory elements M23 and M43 changes to a first value (e.g., a high-resistance state).

C-2-2. Writing Binary 1 (Set)

As shown in Illustration 2 of the drawing, when writing to the two resistive memory elements M23 and M43 in one row, a high-potential-side fixed potential (e.g., power supply potential Vdd) is applied to the non-selected first bit lines BLA1 and BLA3, and a low-potential-side fixed potential (e.g., ground potential Vss) is applied to the selected first bit lines BLA2 and BLA4.

Further, the non-selected second bit lines BLB1, BLB2 and BLB4 are set to the floating state, and a high-potential-side fixed potential (e.g., power supply potential Vdd) is applied to the selected second bit line BLB3.

Furthermore, the potential of each of the non-selected word lines WL1, WL2 and WL4 is made low, and the potential of the selected word line WL3 is made high.

At this time, since the write current (set current) I-set set directed toward first bit lines BLA2 and BLA4 from second bit line BLB3 flows through resistive memory elements M23 and M43, the resistance of each of the resistive memory elements M23 and M43 changes to a second value (e.g., a low-resistance state).

C-3. Third Example

FIG. 87 shows a third example of the write operation. This write operation is concerned with all-column writing (all col. write), i.e., simultaneously writing with respect to all memory cells in one row.

C-3-1. Writing Binary 0 (Reset)

As shown in Illustration 1 of the drawing, when writing to all resistive memory elements M13, M23, M33 and M43 in one row, a high-potential-side fixed potential (e.g., power supply potential Vdd) is applied to all first bit lines BLA1, BLA2, BLA3 and BLA4.

Furthermore, the non-selected second bit lines BLB1, BLB2 and BLB4 are set to the floating state, and a low-potential-side fixed potential (e.g., ground potential Vss) is applied to the selected second bit line BLB3.

Moreover, the potential of each of the non-selected word lines WL1, WL2 and WL4 is made low, and the potential of the selected word line WL3 is made high.

At this time, since the write current (reset current) I-reset directed toward second bit line BLB3 from first bit lines BLA1, BLA2, BLA3 and BLA4 simultaneously flows through resistive memory elements M13, M23, M33 and M43, the resistance of each of the resistive memory elements M13, M23, M33 and M43 changes to the first value (e.g., the high-resistance state).

C-3-2. Writing Binary 1 (Set)

As shown in Illustration 2 of the drawing, when writing to all resistive memory elements M13, M23, M33 and M43 in one row, a low-potential-side fixed potential (e.g., ground potential Vss) is applied to all first bit lines BLA1, BLA2, BLA3 and BLA4.

Moreover, the non-selected second bit lines BLB1, BLB2 and BLB4 are set to the floating state, and a high-potential-side fixed potential (e.g., ground potential Vdd) is applied to the selected second bit line BLB3.

Additionally, the potential of each of the non-selected word lines WL1, WL2 and WL4 is made low, and the potential of the selected word line WL3 is made high.

At this time, since the write current (set current) I-set directed toward first bit lines BLA1, BLA2, BLA3 and BLA4 from second bit line BLB3 simultaneously flows through resistive memory elements M13, M23, M33 and M43, the resistance of each of the resistive memory elements M13, M23, M33 and M43 changes to the second value (e.g., the low-resistance state).

C-4. Others

In the third example, writing binary 0 (reset) can be executed with respect to all memory cells (resistive memory elements) or memory cells in a block at the same time.

For example, in Illustration 1 of FIG. 87, when a low-potential-side fixed potential (e.g., ground potential Vss) is applied to all second bit lines BLB1, BLB2, BLB3 and BLB4 and the potentials on all word lines WL1, WL2, WL3 and WL4 are made high, all resistive memory elements M11 to M44 or the same in a block can be simultaneously set to the first value.

Likewise, in the third example, writing binary 1 (set) can be executed with respect to all the memory cells (resistive memory elements) or the memory cells in a block at the same time.

For example, in Illustration 2 of FIG. 87, when the high-potential-side fixed potential (e.g., power supply potential Vdd) is applied to all second bit lines BLB1, BLB2, BLB3 and BLB4 and the potentials on all word lines WL1, WL2, WL3 and WL4 are made high, all resistive memory elements M11 to M44 or the same in a block can be simultaneously set to the second value.

Additionally, in the first example and the second example, the non-selected first bit lines may be set to the floating state.

D. Application Example of Write Operation

The following write operation enables improvement of write speed.

Figure 88:
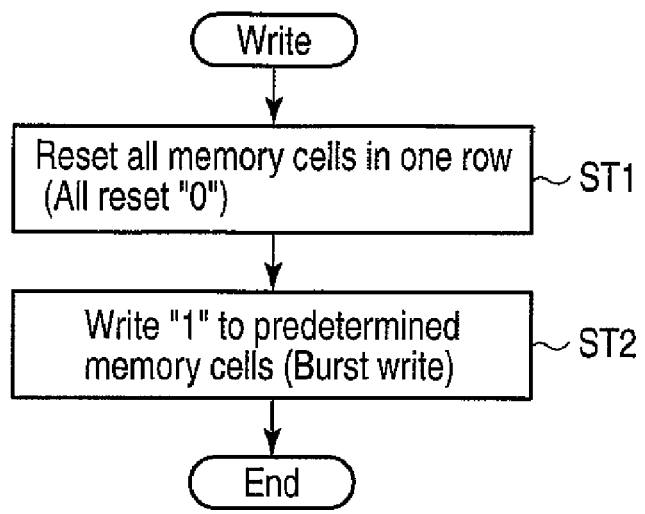
FIG. 88 is a flowchart showing an application example of the write operation.

FIG. 88 shows a first example of the write operation with respect to memory cells in one row.

First, for example, based on the write operation shown in Illustration 1 of FIG. 87, all memory cells in one row in the memory cell array are reset (state 0) (step ST1).

Then, for example, based on the write operation shown in Illustration 2 of FIG. 86, binary 1 is written (set operation) to predetermined memory cells in the memory cells in one row of the memory cell array (step ST2).

With the above-described operation, the writing with respect to the memory cells in the one row is completed.

Figure 89:
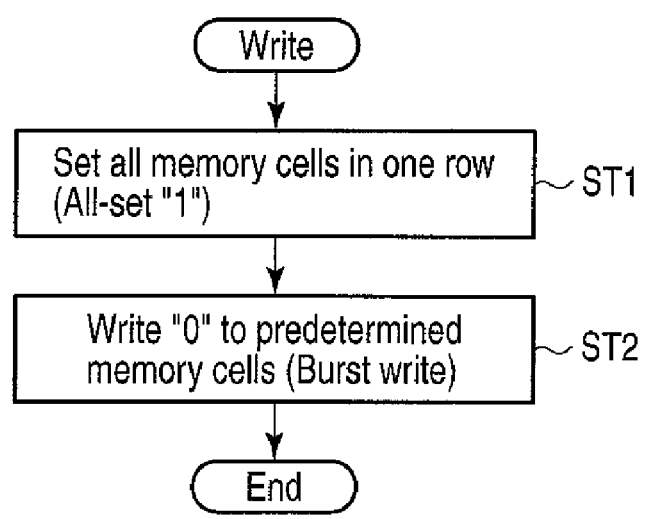
FIG. 89 is a flowchart showing an application example of the write operation.

FIG. 89 shows a second example of the write operation with respect to memory cells in one row.

First, for example, based on the write operation shown in Illustration 2 of FIG. 87, all memory cells in one row of the memory cell array are set (state 1) (step ST1).

Then, for example, based on the write operation shown in Illustration 1 of FIG. 86, binary 0 is written (reset operation) to predetermined memory cells in the memory cells in the one row of the memory cell array (step ST2).

With the above-described operation, the writing with respect to the memory cells in the one row is completed.

(5) Others

In the first to fourth embodiments, a general field-effect transistor (FET) is used as the cell transistor, but the embodiments are not restricted thereto. The cell transistor having a switch function can suffice, and a fin FET, a double-fin FET, a gate-all-around (GAA) transistor, a silicon nanowire transistor and others can be used, for example.

3. Application Example

The resistance-change semiconductor memory in this disclosure can be applied to an MRAM, especially a spin transfer MRAM that utilizes polarized spin to carry out magnetization reversal. Further, it is also very effective to apply the resistance-change semiconductor memory in this disclosure to, e.g., a PCRAM or a ReRAM that uses a resistive memory element as a memory element.

4. Conclusion

According to this disclosure, the new memory cell array layout of the resistance-change semiconductor memory enables reducing the cell area and improving operating characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change semiconductor memory comprising first to fourth memory cells aligned in a first direction,
    wherein each of the first to fourth memory cells comprises a cell transistor having a gate connected to a word line extending in a second direction crossing the first direction and a resistive memory element having one end connected to a first source/drain region of the cell transistor,
    a second source/drain region of the cell transistor is connected to one of a first bit line extending in the first direction and a second bit line extending in the second direction,
    the other end of the resistive memory element is connected to one of the first and second bit lines which is not connected to the second source/drain region;
    the second source/drain regions in the first and second memory cells are shared, and the second source/drain regions in the third and fourth memory cells are shared, and
    the first and second memory cells are arranged in a first element region, and the third and fourth memory cells are arranged in a second element region different from the first element region.

2. The memory of claim 1,
wherein, when the second source/drain region of the cell transistor is connected to the first bit line and the other end of the resistive memory element is connected to the second bit line, the second bit line connected to the resistive memory element in the second memory cell and the second bit line connected to the resistive memory element in the third memory cell are shared.

3. The memory of claim 1,
wherein, in each of the first to fourth memory cells, the resistive memory element is a magnetoresistive element.

4. The memory of claim 1, further comprising:
a memory cell array comprising columns aligned in the second direction and extending in the first direction; and
a control circuit which controls reading/writing with respect to the memory cell array,
wherein each of the columns includes the first to fourth memory cells; and
wherein the control circuit executes the reading/writing with respect to the memory cells in one row of the memory cell array at the same time.

5. The memory of claim 1, further comprising:
a memory cell array comprising columns aligned in the second direction and extending in the first direction; and
a control circuit which controls reading/writing with respect to the memory cell array,
wherein each of the columns includes the first to fourth memory cells; and
wherein the control circuit sets all of the memory cells in one row of the memory cell array to a first state and then changes predetermined memory cells in the memory cells to a second state from the first state.

6. A resistance-change semiconductor memory comprising first to fourth memory cells aligned in a first direction,
wherein each of the first to fourth memory cells comprises a cell transistor having a gate connected to a word line extending in a second direction crossing the first direction and a resistive memory element having one end connected to a first source/drain region of the cell transistor,
a second source/drain region of the cell transistor is connected to one of a first bit line extending in the first direction and a second bit line extending in the second direction,
the other end of the resistive memory element is connected to one of the first and second bit lines which is not connected to the second source/drain region,
the second source/drain regions in the first and second memory cells are shared, and the second source/drain regions in the third and fourth memory cells are shared,
the first to fourth memory cells are arranged in an element region common to them, and
a cell isolation transistor is connected to a portion between the first source/drain region in the second memory cell and the first source/drain region in the third memory cell.

7. The memory of claim 6, wherein, when the second source/drain region of the cell transistor is connected to the first bit line and the other end of the resistive memory element is connected to the second bit line, the second bit line connected to the resistive memory element in the second memory cell and the second bit line connected to the resistive memory element in the third memory cell are shared.

8. The memory of claim 6, wherein the cell isolation transistor is off during at least reading/writing.

9. The memory of claim 8, wherein a gate potential which turns off the cell isolation transistor is less than or equal to a gate potential of the cell transistor in each non-selected cell.

10. The memory of claim 6, wherein, in each of the first to fourth memory cells, the resistive memory element is a magnetoresistive element.

11. The memory of claim 6, further comprising:
a memory cell array comprising columns aligned in the second direction and extending in the first direction; and
a control circuit which controls reading/writing with respect to the memory cell array,
wherein each of the columns includes the first to fourth memory cells; and
wherein the control circuit executes the reading/writing with respect to the memory cells in one row of the memory cell array at the same time.

12. The memory of claim 6, further comprising:
a memory cell array comprising columns aligned in the second direction and extending in the first direction; and
a control circuit which controls reading/writing with respect to the memory cell array,
wherein each of the columns includes the first to fourth memory cells; and
wherein the control circuit sets all of the memory cells in one row of the memory cell array to a first state and then changes predetermined memory cells in the memory cells to a second state from the first state.

13. A resistance-change semiconductor memory comprising first to fourth memory cells aligned in a first direction,
wherein each of the first to fourth memory cells comprises:
a first cell transistor having a gate connected to a first word line extending in a second direction crossing the first direction; a second cell transistor having a gate connected to a second word line extending in the second direction; and a resistive memory element having one end connected to a first source/drain region shared by the first and second cell transistors,
a second source/drain region of the first cell transistor and a third source/drain region of the second cell transistor are connected to a first bit line extending in the first direction,
the other end of the resistive memory element is connected to a second bit line extending in the second direction,
the second source/drain regions in the first and second memory cells are shared, the third source/drain regions in the second and third memory cells are shared and the second source/drain regions in the third and fourth memory cells are shared, and
the first to fourth memory cells are arranged in an element region common to them.

14. The memory of claim 13, wherein, in each of the first to fourth memory cells, the resistive memory element is a magnetoresistive element.

15. The memory of claim 13, further comprising:
a memory cell array comprising columns aligned in the second direction and extending in the first direction; and
a control circuit which controls reading/writing with respect to the memory cell array,
wherein each of the columns includes the first to fourth memory cells; and
wherein the control circuit executes the reading/writing with respect to the memory cells in one row of the memory cell array at the same time.

16. The memory of claim 13, further comprising:
a memory cell array comprising columns aligned in the second direction and extending in the first direction; and
a control circuit which controls reading/writing with respect to the memory cell array,
wherein each of the columns includes the first to fourth memory cells; and wherein the control circuit sets all of the memory cells in one row of the memory cell array to a first state and then changes predetermined memory cells in the memory cells to a second state from the first state.

17. A resistance-change semiconductor memory comprising:
a memory cell array comprising columns extending in a first direction and aligned in a second direction crossing the first direction;
first to fourth memory cells aligned in the first direction and provided in corresponding to each of the columns; and
a control circuit which controls reading/writing with respect to the memory cell array,
wherein each of the first to fourth memory cells comprises: a first cell transistor having a gate connected to a first word line extending in the second direction; a second cell transistor having a gate connected to a second word line extending in the second direction; and a resistive memory element having one end connected to a first source/drain region shared by the first and second cell transistors,
the control circuit executes the reading/writing with respect to the first memory cells in the columns at the same time,
a second source/drain region of the first cell transistor is connected to a first bit line extending in the second direction,
a third source/drain region of the second cell transistor is connected to a second bit line extending in the second direction,
the other end of the resistive memory element is connected to a third bit line extending in the first direction,
the second source/drain regions in the first and second memory cells are shared, the third source/drain regions in the second and third memory cells are shared and the second source/drain regions in the third and fourth memory cells are shared, and
the first to fourth memory cells are arranged in an element region common to them.

18. The memory of claim 17, wherein, in each of the first to fourth memory cells, the resistive memory element is a magnetoresistive element.

19. The memory of claim 17,
wherein the control circuits sets all of the memory cells in one row of the memory cell array to a first state and then changes predetermined memory cells in the memory cells to a second state from the first state.

20. A resistance change type semiconductor memory comprising
active areas and isolation areas arranged as a line & space structure which extend to a first direction and are aligned in a second direction crossing the first direction;
first and second memory cells provided in each of the active areas and aligned in the first direction; and
a cell isolation transistor provided in each of the active areas and provided between the first and second memory cells,
wherein each of the first and second memory cells comprises a resistive memory element.

21. The memory of claim 20,
wherein each of the first and second memory cells comprises a cell transistor connected to the resistive memory element in series.

22. The memory of claim 21, further comprising:
first and second word lines which extend to the second direction;
a first bit line which extends to the first direction; and
a second bit line which extends to the second direction,
wherein the cell transistor in the first memory cell comprises: a gate connected to the first word line; a first source/drain region connected to a first end of the resistive memory element in the first memory cell, and a second source/drain region connected to one of the first and second bit lines,
a second end of the resistive memory element in the first memory cell is connected to one of the first and second bit lines which is not connected to the second source/drain region,
the cell transistor in the second memory cell comprises: a gate connected to the second word line; a third source/drain region connected to a first end of the resistive memory element in the second memory cell, and a fourth source/drain region connected to one of the first and second bit lines,
a second end of the resistive memory element in the second memory cell is connected to one of the first and second bit lines which is not connected to the fourth source/drain region, and
the cell isolation transistor is connected between the first source/drain region in the first memory cell and the third source/drain region in the second memory cell.

23. The memory of claim 20, wherein the cell isolation transistor is configured to be off during at least a reading or writing operation.

24. The memory of claim 23, wherein a gate potential which turns off the cell isolation transistor is less than or equal to a gate potential of a cell transistor in each non-selected cell.

25. The memory of claim 20, wherein the resistive memory elements in the first and second memory cells are magnetoresistive elements.

* * * * *